(12) United States Patent
Breingan et al.

(10) Patent No.: US 11,342,215 B2
(45) Date of Patent: May 24, 2022

(54) SEMICONDUCTOR WAFER PROCESSING CHAMBER

(71) Applicant: VEECO INSTRUMENTS INC., Plainview, NY (US)

(72) Inventors: William Gilbert Breingan, Media, PA (US); Chris Hofmeister, Hampstead, NH (US); Lev Rapoport, Yardley, PA (US); John Taddei, Jim Thorpe, PA (US)

(73) Assignee: VEECO INSTRUMENTS INC., Plainview, NY (US)

( * ) Notice: Subject to any disclaimer, the term of this patent is extended or adjusted under 35 U.S.C. 154(b) by 507 days.

(21) Appl. No.: 15/960,075

(22) Filed: Apr. 23, 2018

(65) Prior Publication Data
US 2018/0308718 A1 Oct. 25, 2018

Related U.S. Application Data

(60) Provisional application No. 62/489,806, filed on Apr. 25, 2017.

(51) Int. Cl.
*H01L 21/687* (2006.01)
*H01L 21/67* (2006.01)
(Continued)

(52) U.S. Cl.
CPC .......... *H01L 21/68764* (2013.01); *B08B 3/02* (2013.01); *H01L 21/67051* (2013.01);
(Continued)

(58) Field of Classification Search
CPC ......... H01L 21/67051; H01L 21/02041; H01L 21/6704; H01L 21/02054; H01L 21/02052;
(Continued)

(56) References Cited

U.S. PATENT DOCUMENTS 4,903,717 A 2/1990 Sumnitsch
5,080,549 A 1/1992 Goodwin et al.
(Continued)

FOREIGN PATENT DOCUMENTS

JP 59-23517 2/1984
JP 63111960 7/1988
(Continued)

OTHER PUBLICATIONS

Kinoshita, Kei et al. "Stripping of High-Dose Ion-Implanted Photoresist Using a Combination of Dry and Wet Single-Wafer Processing" ECS Journal of Solid State Science and Technology, 2 (3) Q34-Q39 (2013) Published Dec. 31, 2012.

*Primary Examiner* — Joseph L. Perrin
*Assistant Examiner* — Kevin G Lee
(74) *Attorney, Agent, or Firm* — Leason Ellis LLP

(57) ABSTRACT

A housing of a wafer processing system includes at least one chamber exhaust outlet and at least one chemical exhaust outlet. The chamber exhaust outlet is formed in the housing for venting gas from the interior of the housing and the chemical exhaust outlet is formed in the housing for venting gas that flows along at least one of: (a) a first flow path defined between the splash shield in a raised position and the collection trays in the lowered position; and (b) a second flow path in which the gas flows through the collection chamber to the chemical exhaust outlet.

26 Claims, 59 Drawing Sheets

(51) Int. Cl.
  *B08B 3/02* (2006.01)
  *H01L 21/683* (2006.01)
  *B08B 3/14* (2006.01)
  *H01L 21/673* (2006.01)

(52) U.S. Cl.
  CPC .......... *B08B 3/14* (2013.01); *B08B 2203/0264* (2013.01); *H01L 21/6708* (2013.01); *H01L 21/67017* (2013.01); *H01L 21/6719* (2013.01); *H01L 21/67393* (2013.01); *H01L 21/6838* (2013.01); *H01L 21/68735* (2013.01); *H01L 21/68742* (2013.01); *H01L 21/68785* (2013.01)

(58) Field of Classification Search
  CPC .......... H01L 21/68764; H01L 21/68742; B08B 3/02
  See application file for complete search history.

(56) References Cited

U.S. PATENT DOCUMENTS

| | | |
|---|---|---|
| 5,209,180 A | 5/1993 | Shoda et al. |
| 5,234,499 A | 8/1993 | Sasaki et al. |
| 5,421,595 A | 6/1995 | Cripe et al. |
| 5,492,566 A | 2/1996 | Sumnitsch |
| 5,513,668 A | 5/1996 | Sumnitsch |
| 5,725,663 A | 3/1998 | Parrette |
| 5,896,877 A | 4/1999 | Pirker |
| 5,967,578 A | 10/1999 | Frey |
| 5,979,475 A | 11/1999 | Satoh et al. |
| 5,997,653 A | 12/1999 | Yamasaka |
| 6,056,825 A | 5/2000 | Sumnitsch |
| 6,242,364 B1 | 6/2001 | Gurer et al. |
| 6,273,104 B1 | 8/2001 | Shinbara et al. |
| 6,328,846 B1 | 12/2001 | Langen et al. |
| 6,435,200 B1 | 8/2002 | Langen |
| 6,589,338 B1 | 7/2003 | Nakamori |
| 6,669,808 B2 | 12/2003 | Adachi et al. |
| 6,793,769 B2 | 9/2004 | Kajino et al. |
| 6,807,974 B2 | 10/2004 | Ono et al. |
| 6,810,888 B2 | 11/2004 | Tsuchiya et al. |
| 6,858,092 B2 | 2/2005 | Langen |
| 7,007,702 B2 | 3/2006 | Langen |
| 7,122,084 B2 | 10/2006 | Hohenwarter |
| 7,172,674 B2 | 2/2007 | Engesser |
| 7,267,129 B2 | 9/2007 | Langen |
| 7,467,635 B2 | 12/2008 | Satoshi et al. |
| 7,584,760 B2 | 9/2009 | Miya et al. |
| 7,608,152 B2 | 10/2009 | Miya et al. |
| 7,681,581 B2 | 3/2010 | Rose et al. |
| 7,722,736 B2 | 5/2010 | Miya |
| 7,726,323 B2 | 6/2010 | Langen |
| 7,726,362 B2 | 6/2010 | Demers et al. |
| 7,799,695 B2 | 9/2010 | Engesser |
| 7,958,898 B2 | 6/2011 | Yoshida |
| 7,988,818 B2 | 8/2011 | Engesser |
| 8,075,731 B2 | 12/2011 | Miya |
| 8,109,282 B2 | 2/2012 | Miya et al. |
| 8,118,945 B2 | 2/2012 | Eitoku |
| 8,361,234 B2 | 1/2013 | Izuta et al. |
| 8,485,204 B2 | 7/2013 | Obweger |
| 8,501,025 B2 | 8/2013 | Hashizume et al. |
| 8,544,483 B2 | 10/2013 | Collins et al. |
| 8,580,042 B2 * | 11/2013 | Nuch ................ H01L 21/67051 134/10 |
| 8,596,623 B2 | 12/2013 | Frank et al. |
| 8,608,146 B2 | 12/2013 | Brugger et al. |
| 8,656,936 B2 | 2/2014 | Collins et al. |
| 8,684,015 B2 | 4/2014 | Lauerhaas et al. |
| 8,696,825 B2 | 4/2014 | Miya et al. |
| 8,721,834 B2 | 5/2014 | Koo et al. |
| 8,845,815 B2 | 9/2014 | Ogata et al. |
| 8,888,952 B2 | 11/2014 | Gigacher et al. |
| 8,899,246 B2 | 12/2014 | Plazonic et al. |
| 8,899,248 B2 | 12/2014 | Collins et al. |
| 8,926,788 B2 | 1/2015 | Hohenwarter |
| 8,955,529 B2 | 2/2015 | Hohenwarter |
| 9,093,482 B2 | 7/2015 | Brugger et al. |
| 9,136,155 B2 | 9/2015 | Kinoshita et al. |
| 9,305,770 B2 | 4/2016 | Kinoshita et al. |
| 9,362,147 B2 | 6/2016 | Izuta et al. |
| 9,364,873 B2 | 6/2016 | Hinode et al. |
| 9,431,276 B2 | 8/2016 | Miya et al. |
| 9,555,437 B2 | 1/2017 | Nakai et al. |
| 2001/0013684 A1 | 8/2001 | Smedt et al. |
| 2003/0170988 A1 | 9/2003 | Izumi et al. |
| 2003/0194878 A1 | 10/2003 | Miya |
| 2004/0040177 A1 | 3/2004 | Izumi et al. |
| 2004/0040584 A1 | 3/2004 | Miya et al. |
| 2004/0050491 A1 | 3/2004 | Miya et al. |
| 2004/0226655 A1 | 11/2004 | Kajino et al. |
| 2005/0021636 A1 | 1/2005 | Kumar |
| 2005/0199503 A1 | 9/2005 | Woodruff |
| 2005/0244579 A1 | 11/2005 | Matsuzawa et al. |
| 2005/0274400 A1 | 12/2005 | Chan |
| 2005/0276921 A1 | 12/2005 | Miya et al. |
| 2006/0021636 A1 | 2/2006 | Miya |
| 2006/0102289 A1 | 5/2006 | Fukatsu et al. |
| 2007/0175500 A1 | 8/2007 | Hohenwarter |
| 2007/0212884 A1 | 9/2007 | Yamamoto |
| 2008/0053493 A1 | 3/2008 | Kimura |
| 2008/0078426 A1 | 4/2008 | Miya et al. |
| 2008/0078428 A1 | 4/2008 | Yoshida |
| 2008/0121251 A1 | 5/2008 | Miya et al. |
| 2008/0142051 A1 | 6/2008 | Hashizume |
| 2008/0254224 A1 | 10/2008 | Kishimoto et al. |
| 2009/0050175 A1 | 2/2009 | Tanaka et al. |
| 2009/0090391 A1 | 4/2009 | Edamoto |
| 2010/0101497 A1 | 4/2010 | Izuta et al. |
| 2011/0290283 A1 | 12/2011 | Obweger et al. |
| 2012/0067847 A1 | 3/2012 | Sakurai |
| 2012/0186275 A1 | 7/2012 | Kato et al. |
| 2012/0223054 A1 | 9/2012 | Azuma et al. |
| 2013/0255718 A1 | 10/2013 | Takahashi |
| 2013/0256273 A1 | 10/2013 | Miura et al. |
| 2013/0291905 A1 | 11/2013 | Hashizume et al. |
| 2013/0327365 A1 | 12/2013 | Sato |
| 2013/0333722 A1 | 12/2013 | Tanaka |
| 2014/0041803 A1 | 2/2014 | Koshizawa et al. |
| 2014/0060573 A1 | 3/2014 | Yoshida |
| 2014/0090669 A1 | 4/2014 | Hinode et al. |
| 2014/0127908 A1 | 5/2014 | Okutani |
| 2014/0137902 A1 | 5/2014 | Aiura et al. |
| 2014/0174483 A1 | 6/2014 | Miya et al. |
| 2014/0202989 A1 | 7/2014 | Kishimoto et al. |
| 2014/0227884 A1 | 8/2014 | Engesser et al. |
| 2014/0261162 A1 | 9/2014 | Yamaguchi |
| 2014/0331927 A1 | 11/2014 | Nakano et al. |
| 2015/0001202 A1 | 1/2015 | Crabb et al. |
| 2015/0013732 A1 | 1/2015 | Negoro et al. |
| 2015/0020850 A1 | 1/2015 | Kato et al. |
| 2015/0020852 A1 | 1/2015 | Kato et al. |
| 2015/0040952 A1 * | 2/2015 | Regan .............. H01L 21/67075 134/104.4 |
| 2015/0047677 A1 | 2/2015 | Muramoto |
| 2015/0060407 A1 | 3/2015 | Negoro et al. |
| 2015/0072078 A1 | 3/2015 | Negoro et al. |
| 2015/0075569 A1 | 3/2015 | Collins et al. |
| 2015/0075571 A1 | 3/2015 | Miura |
| 2015/0090301 A1 | 4/2015 | Higuchi et al. |
| 2015/0114561 A1 | 4/2015 | Higashijima et al. |
| 2015/0187629 A1 | 7/2015 | Obweger et al. |
| 2015/0200087 A1 | 7/2015 | Kobayashi |
| 2015/0234296 A1 | 8/2015 | Yagi |
| 2015/0243543 A1 | 8/2015 | Schwarzenbacher et al. |
| 2015/0262848 A1 | 9/2015 | Sano et al. |
| 2015/0340251 A1 | 11/2015 | Wakita et al. |
| 2016/0016206 A1 | 1/2016 | Osada et al. |
| 2016/0045938 A1 | 2/2016 | Aomatsu et al. |
| 2016/0059274 A1 | 3/2016 | Miya et al. |
| 2016/0093503 A1 | 3/2016 | Tokuri et al. |
| 2016/0111302 A1 | 4/2016 | Kahlon et al. |
| 2016/0126148 A1 | 5/2016 | Mauer et al. |
| 2016/0271655 A1 * | 9/2016 | Kashiyama .............. B08B 3/02 |

(56) References Cited

U.S. PATENT DOCUMENTS

| | | |
|---|---|---|
| 2016/0300727 A1 | 10/2016 | Hinode et al. |
| 2016/0351421 A1 | 12/2016 | Iwao et al. |
| 2017/0043379 A1 | 2/2017 | Sasaki et al. |
| 2017/0056936 A1 | 3/2017 | Nishiyama |
| 2017/0069512 A1 | 3/2017 | Yoshida |
| 2017/0117135 A1 | 4/2017 | Yoshida et al. |
| 2017/0294324 A1 | 10/2017 | Breingan et al. |
| 2018/0308741 A1 | 10/2018 | Breingan et al. |

FOREIGN PATENT DOCUMENTS

| | | |
|---|---|---|
| JP | 4-34902 | 8/1992 |
| JP | 9-181026 | 7/1997 |
| JP | 11-87294 | 3/1999 |
| JP | 3088118 | 9/2000 |
| JP | 3555724 | 8/2004 |
| JP | 2004-265910 | 9/2004 |
| JP | 5155035 | 2/2013 |
| JP | 5421610 | 2/2014 |
| JP | 2015-070157 | 4/2015 |
| KR | 20160090733 | 8/2016 |
| SG | 98382 | 9/2003 |
| SG | 118063 | 1/2006 |
| TW | 548690 | 8/2003 |

\* cited by examiner

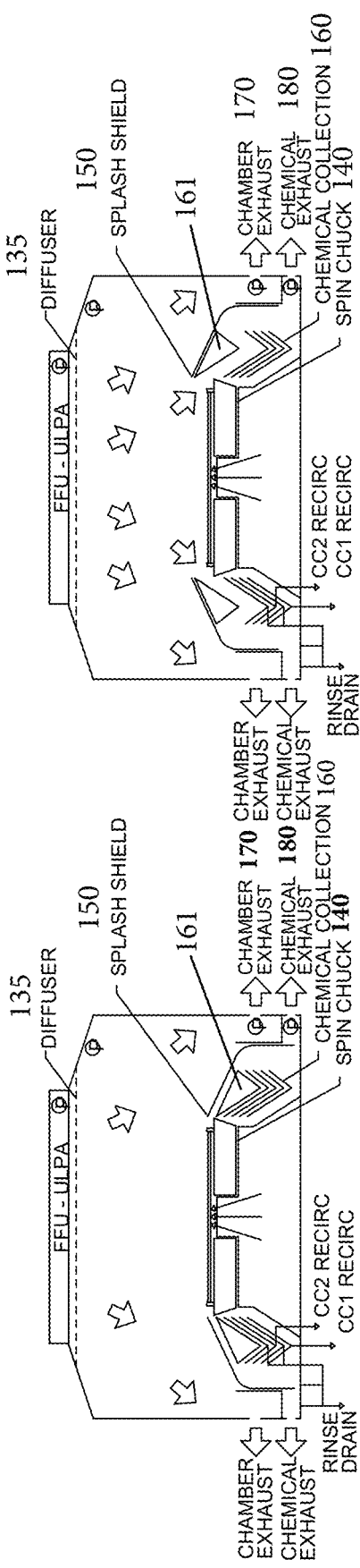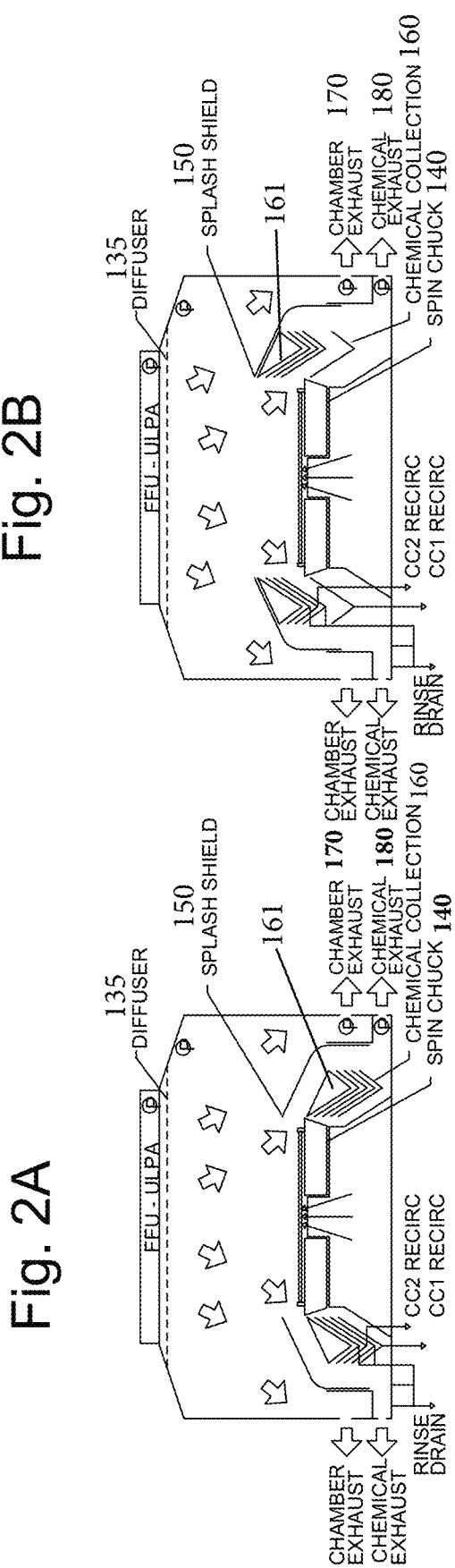

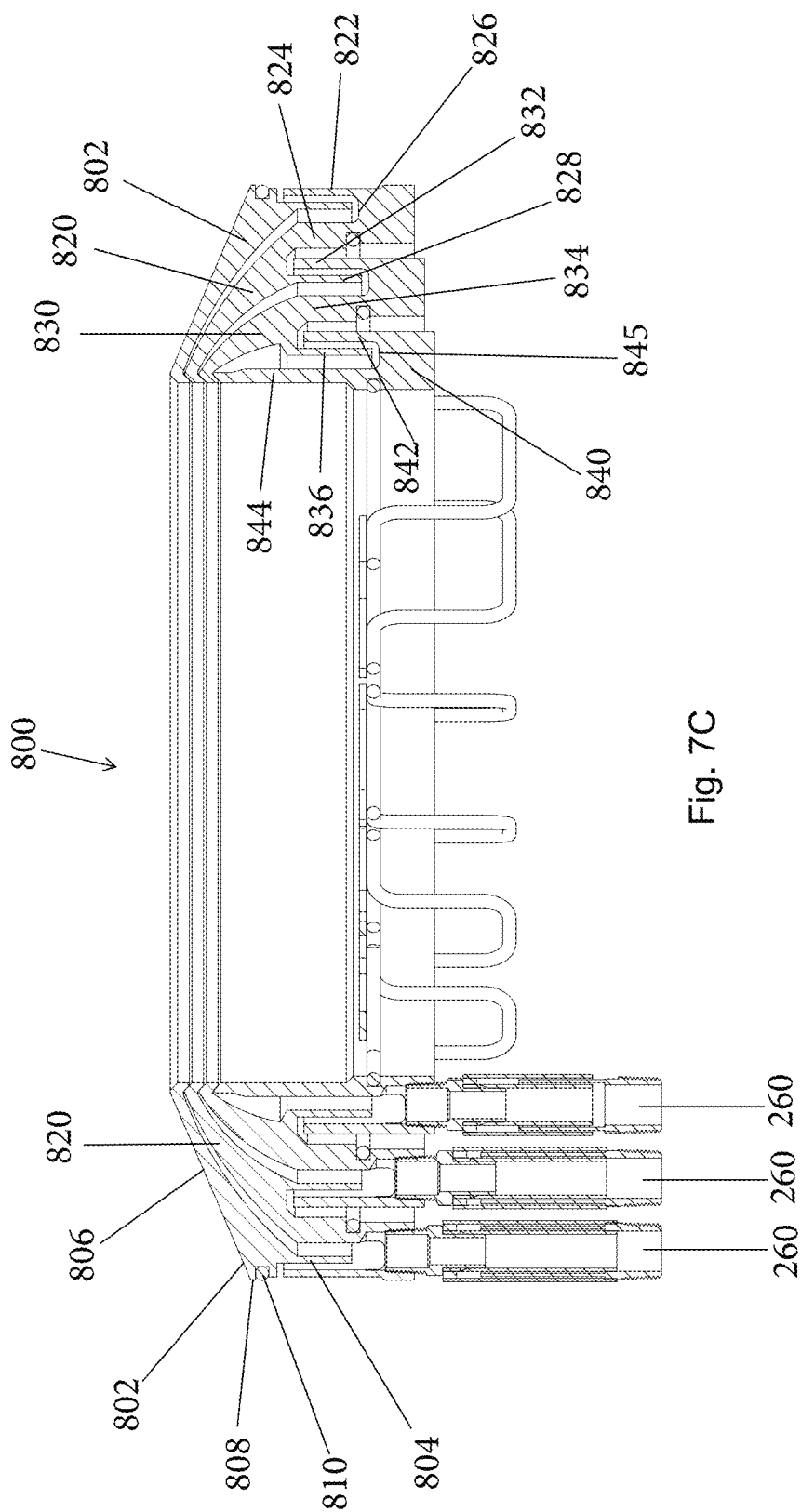

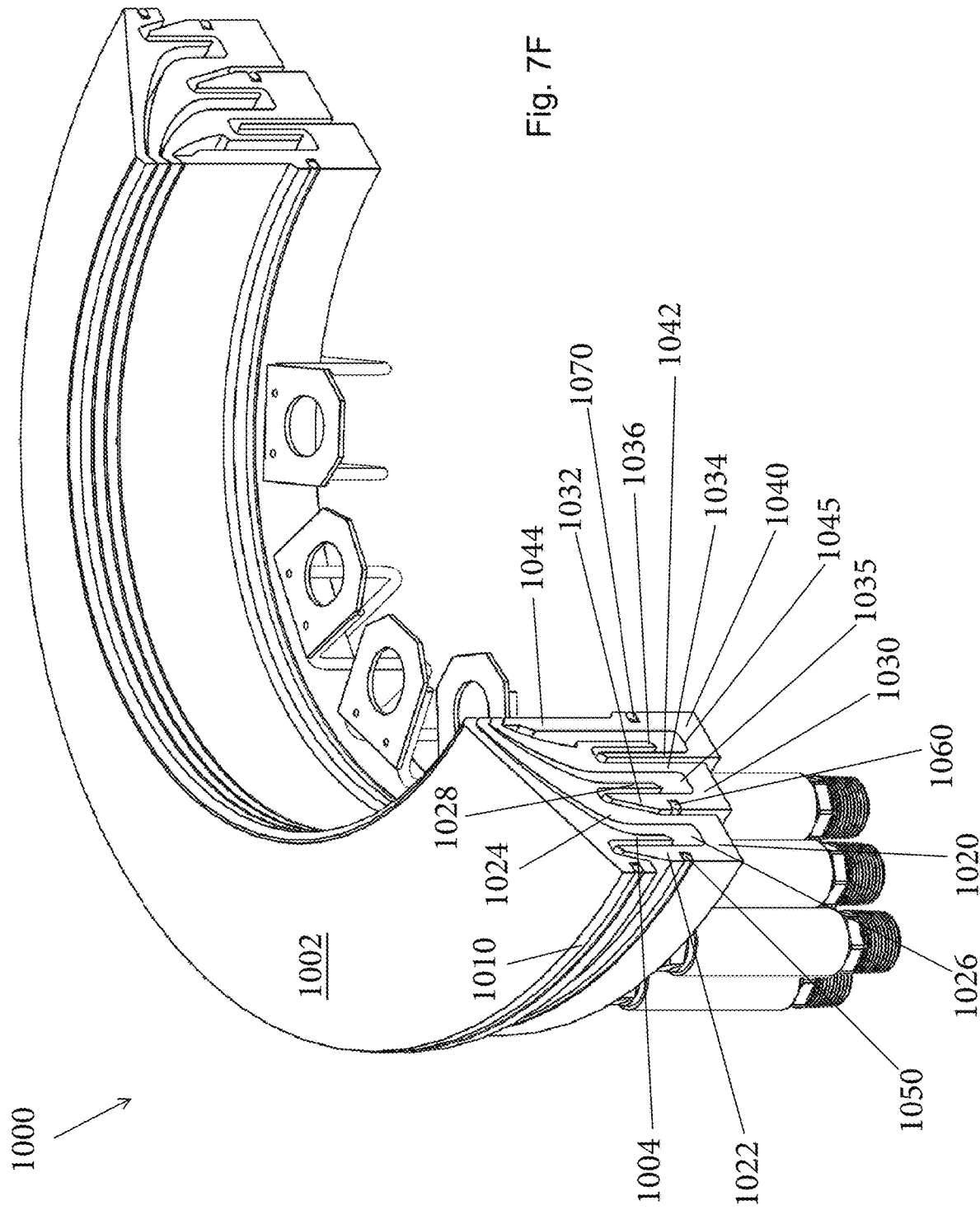

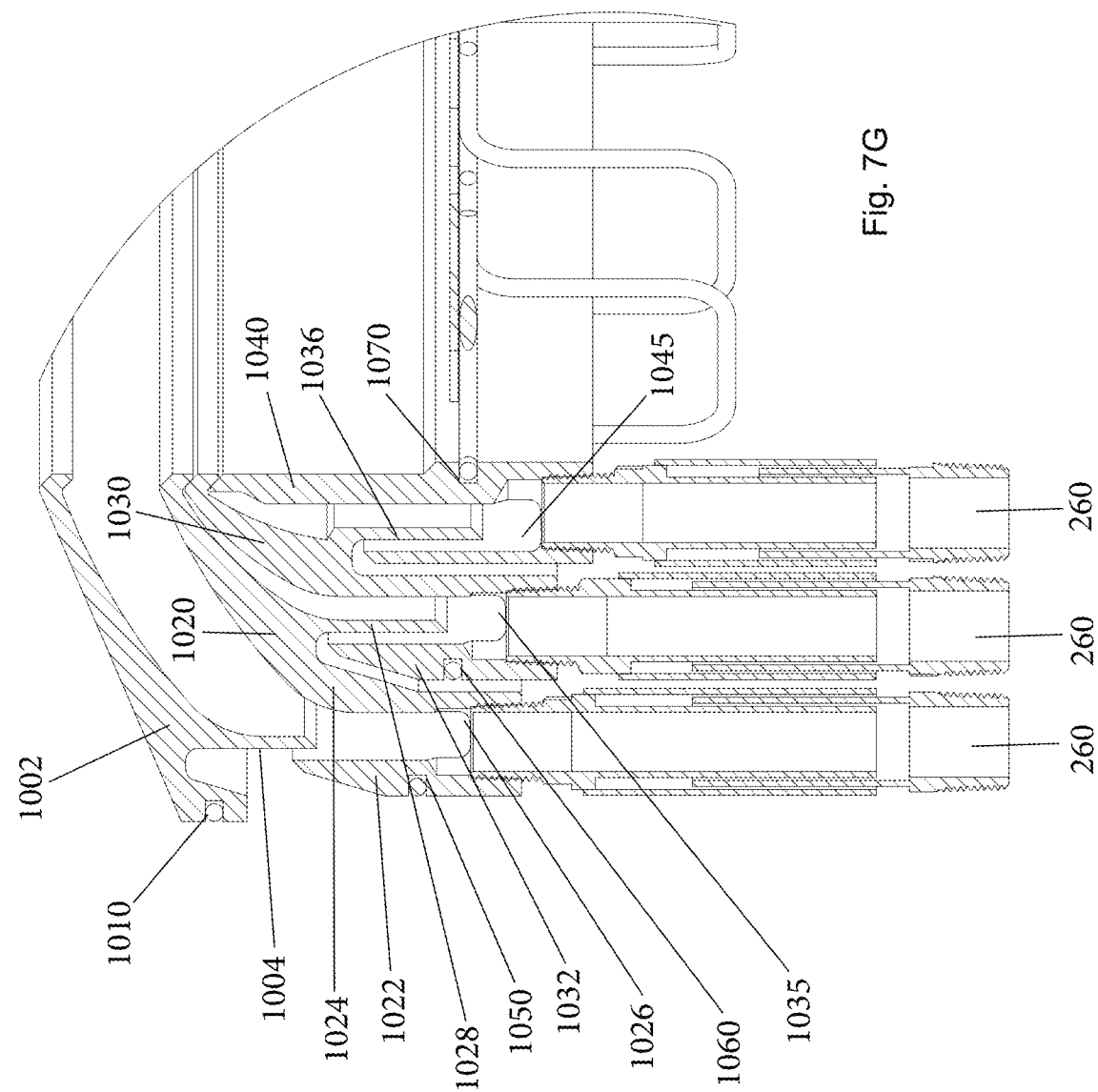

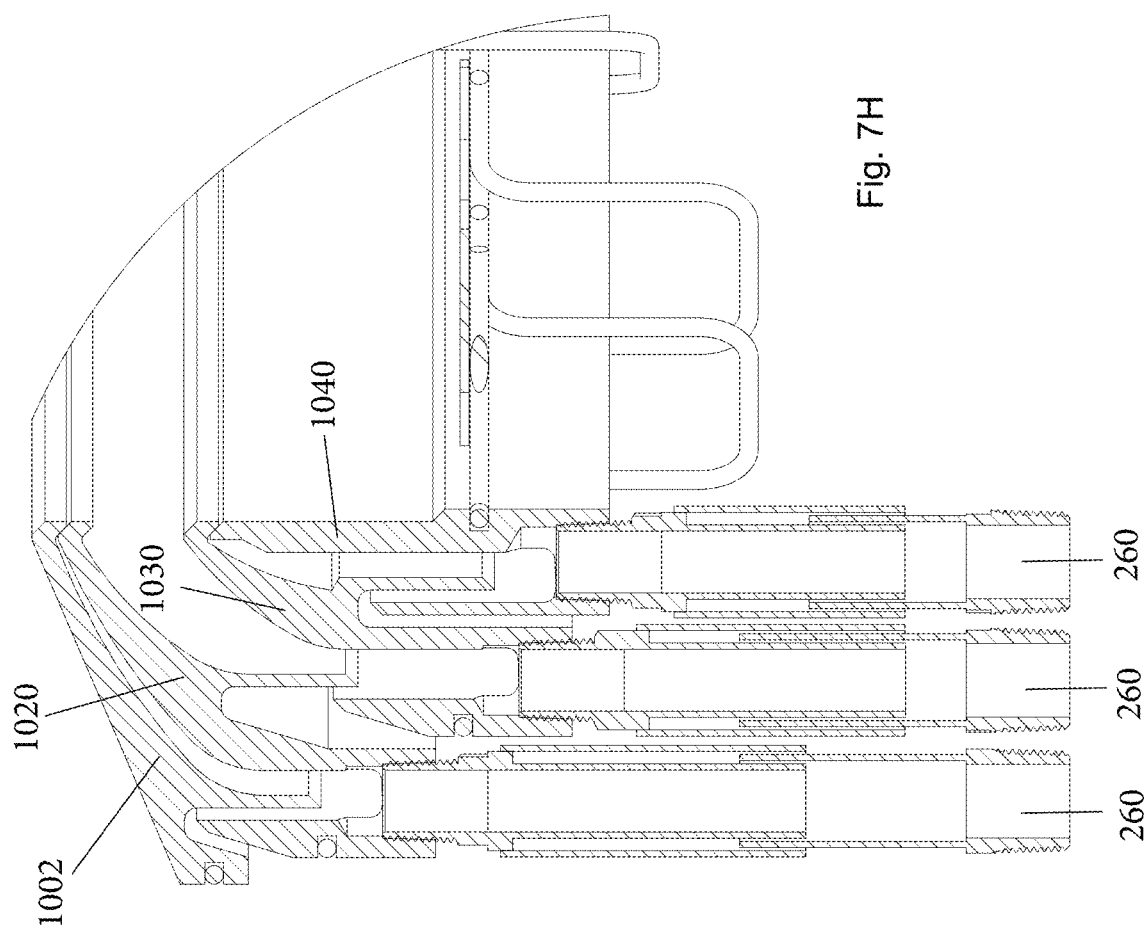

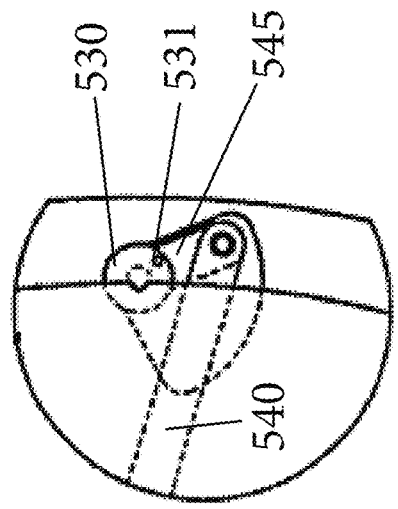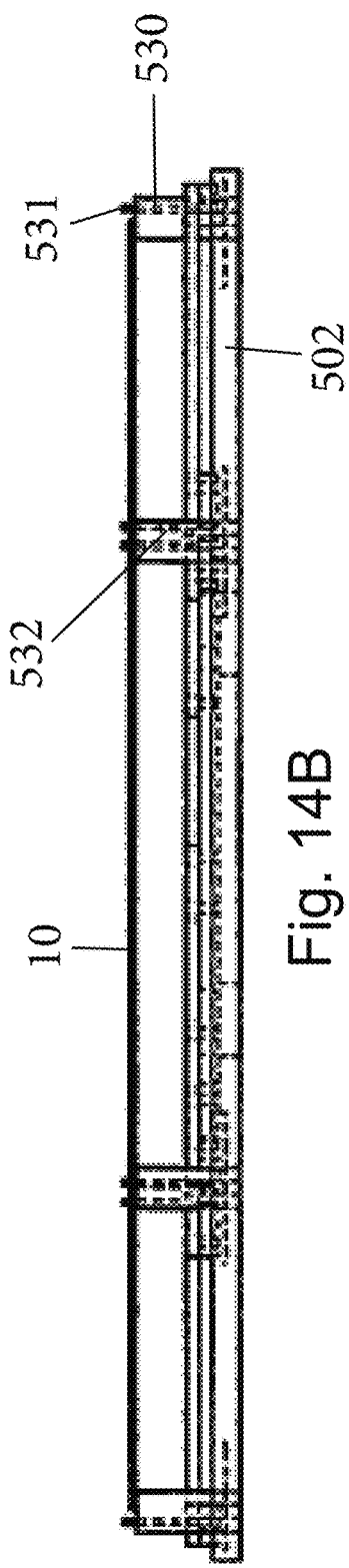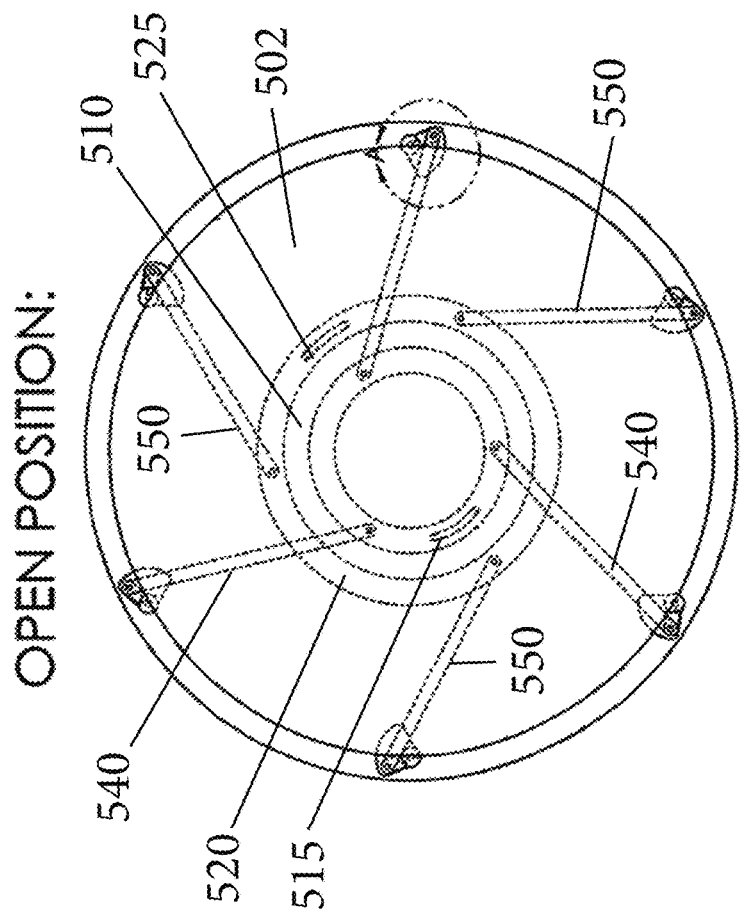

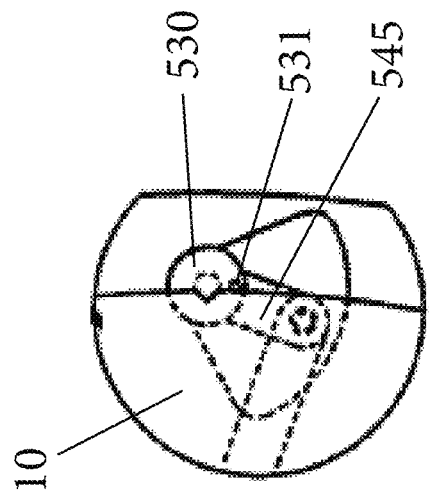
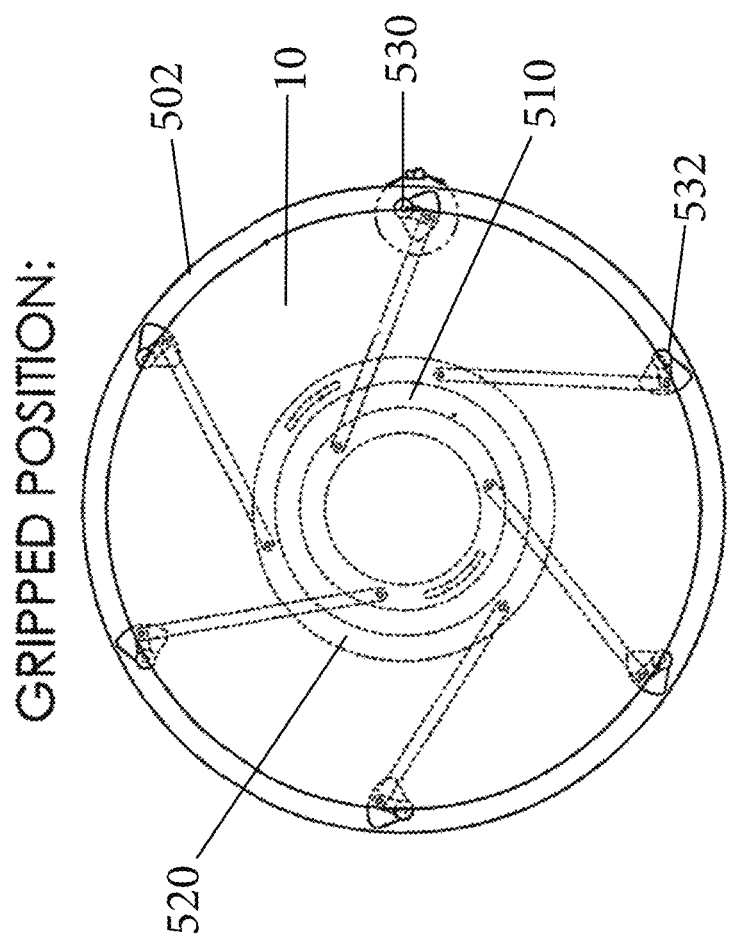
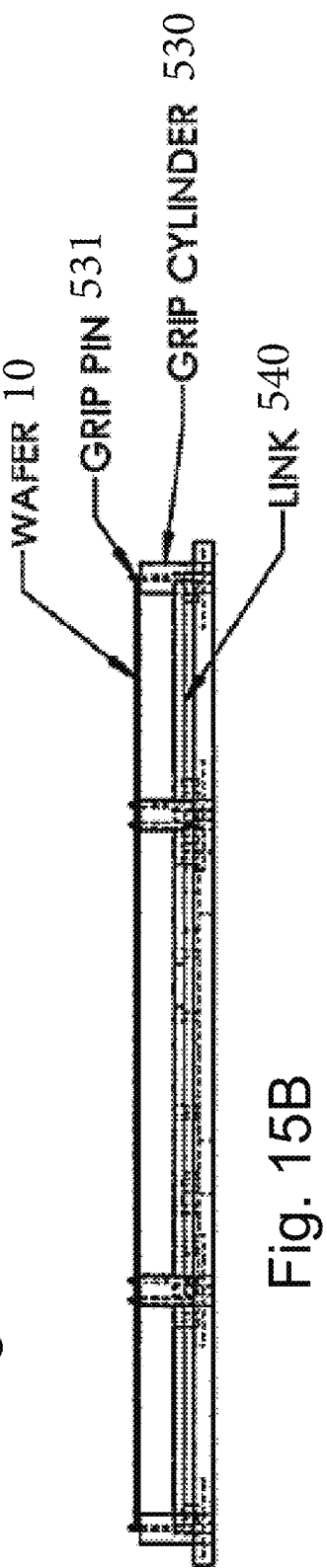

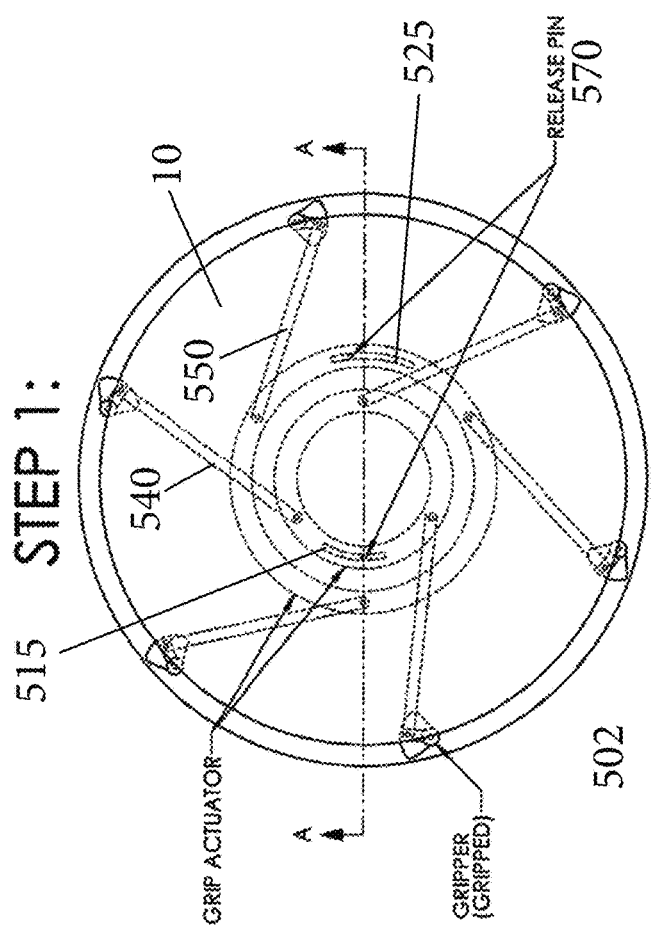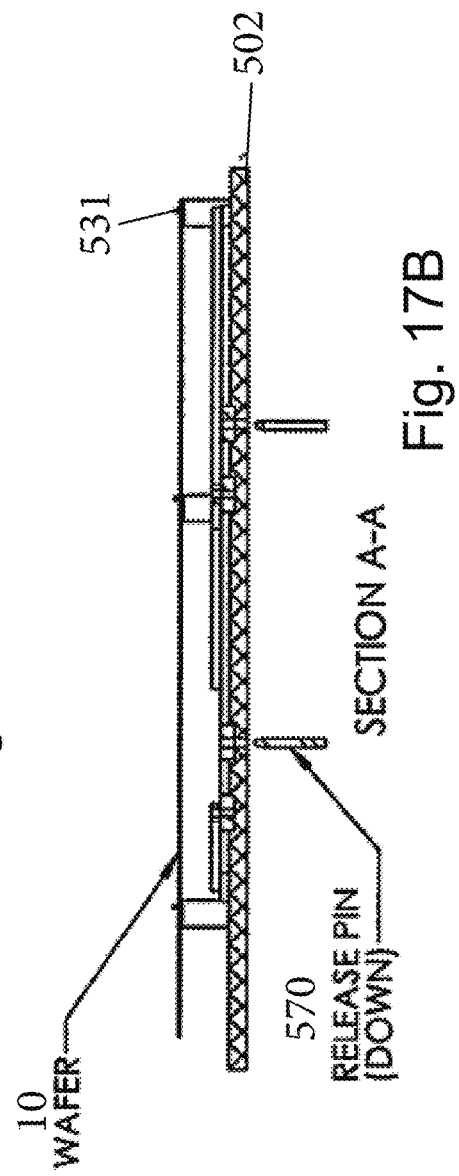

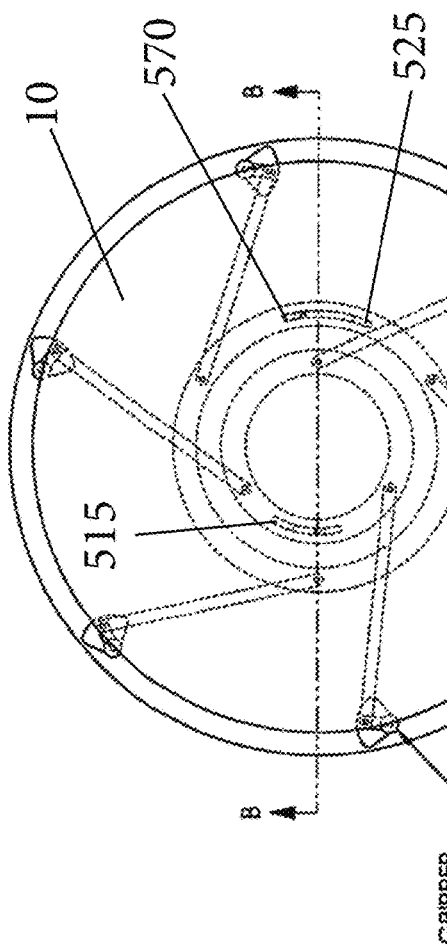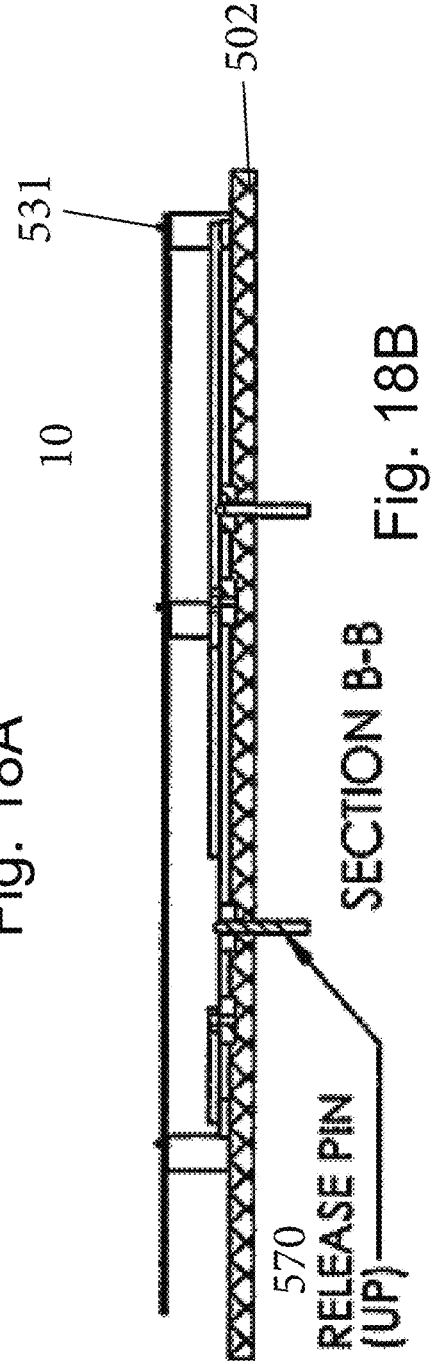

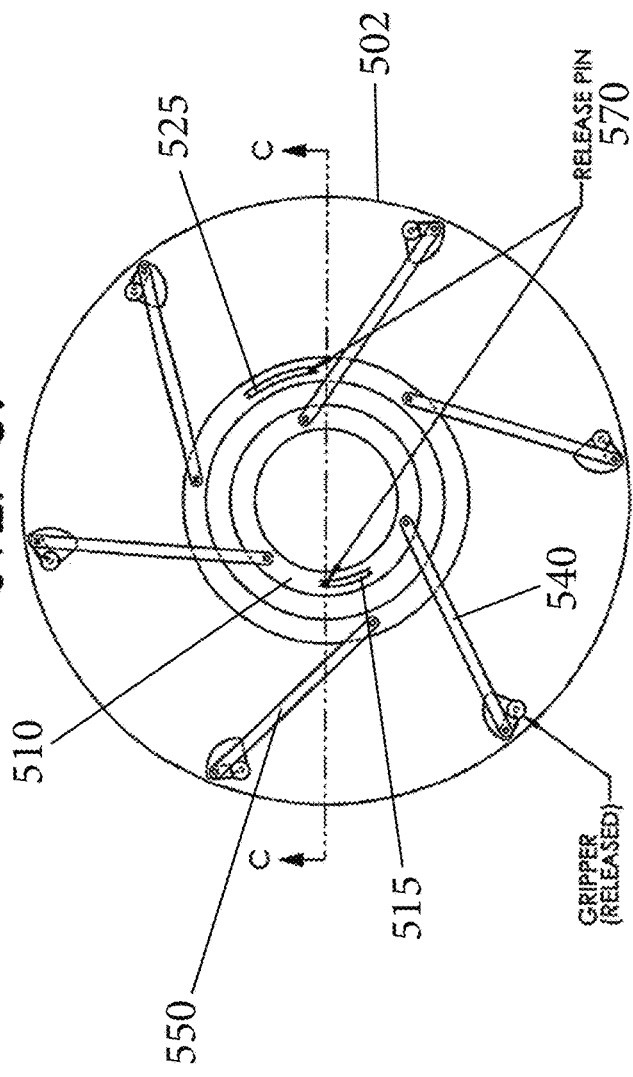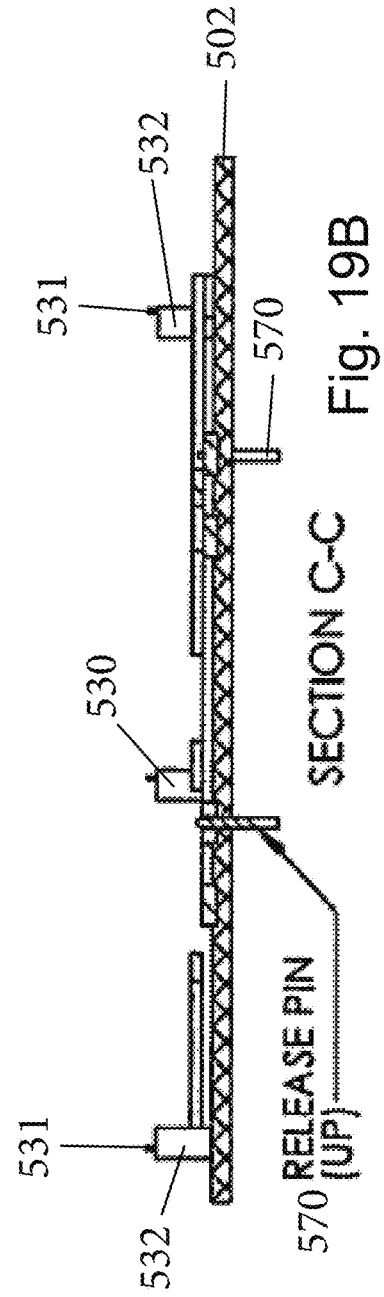

SECTION D-D

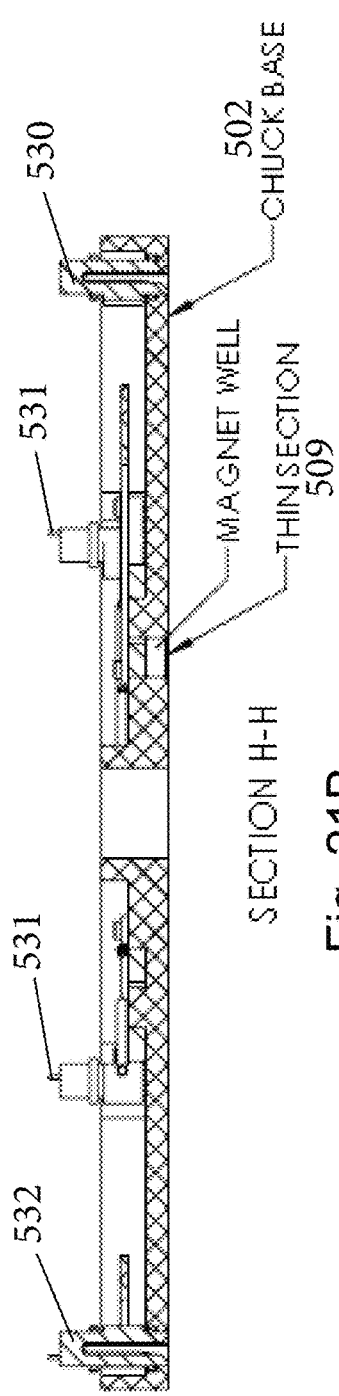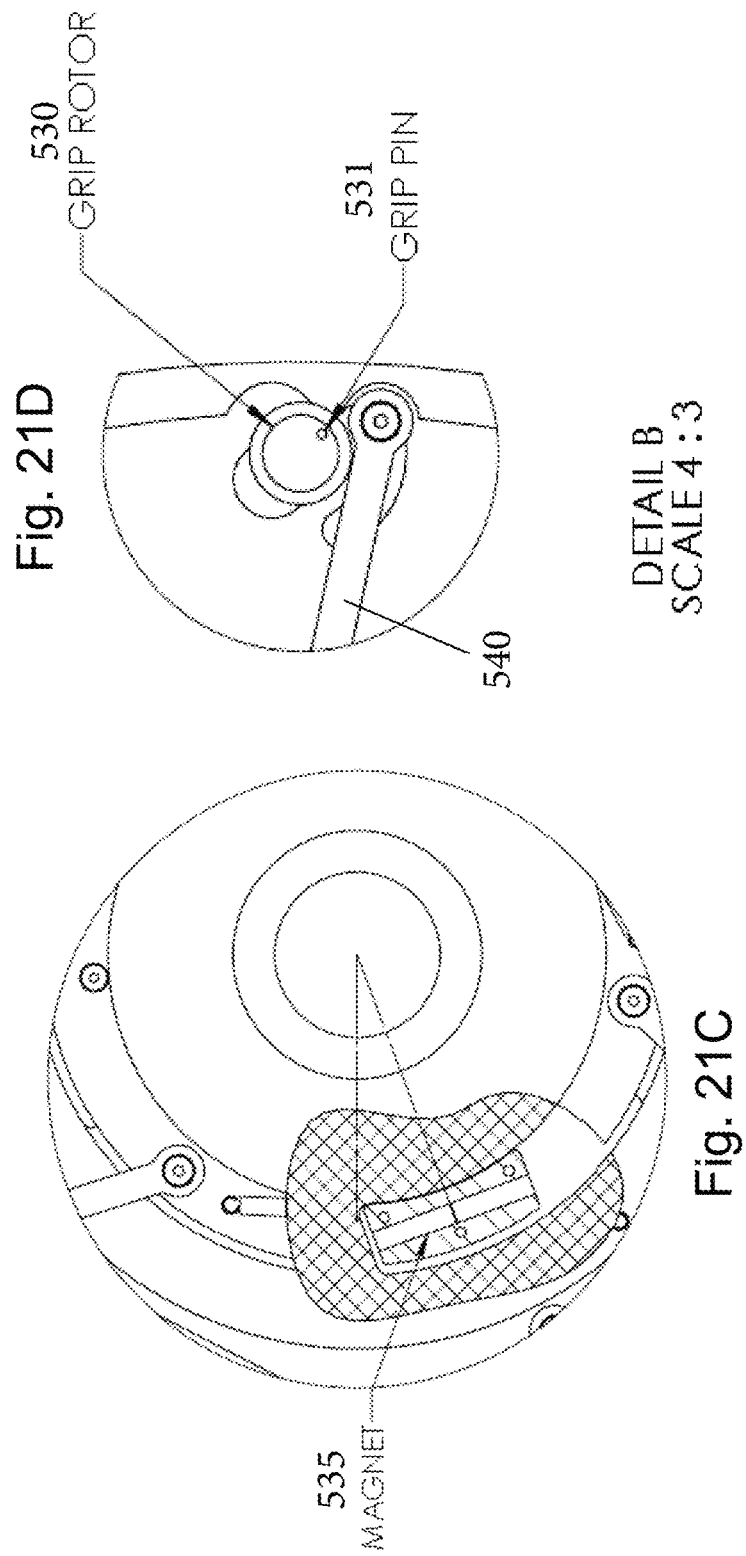

DETAIL C
SCALE 4:3

DETAIL F
SCALE 4:3

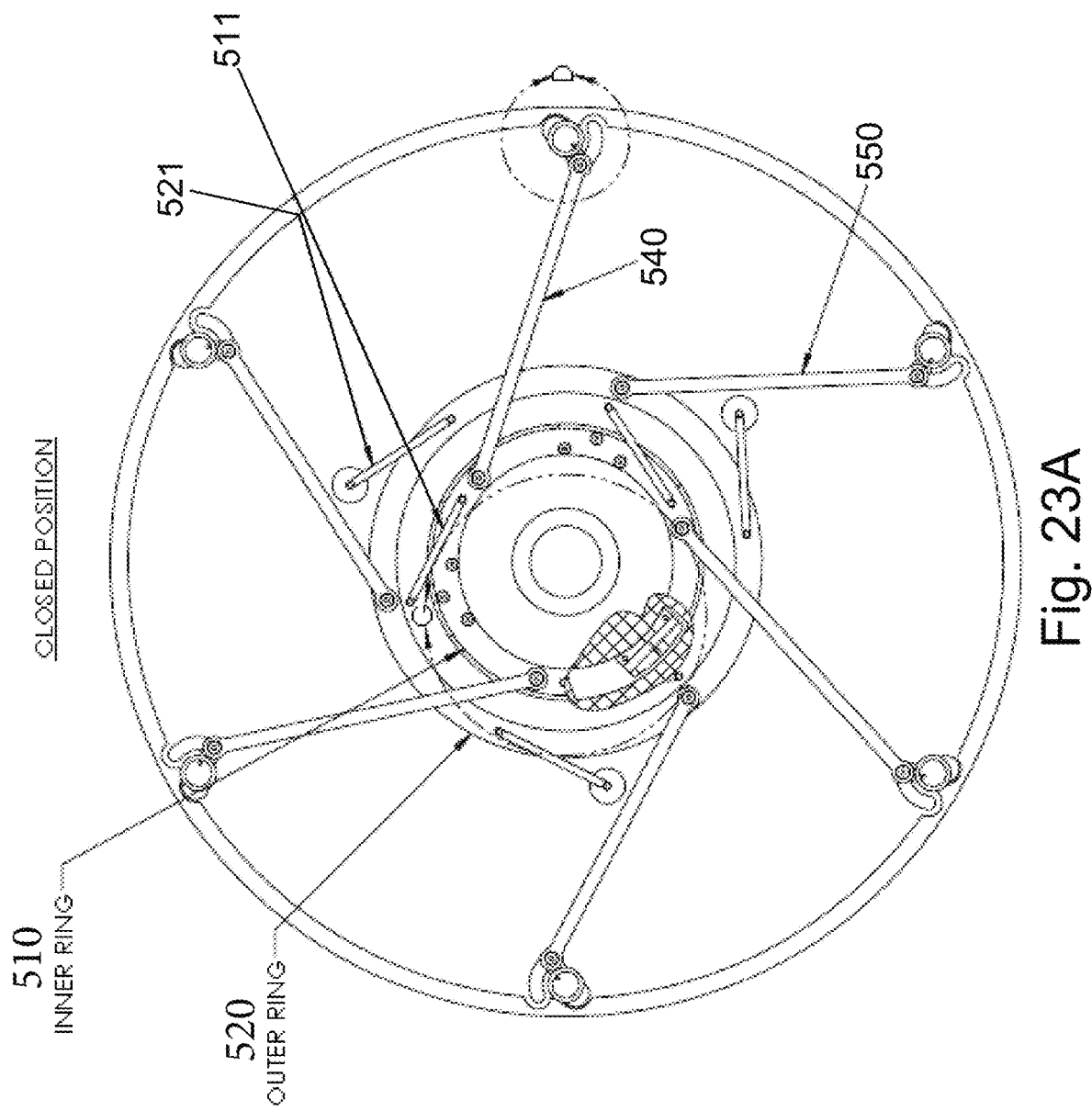

CLOSED POSITION

SECTION K-K

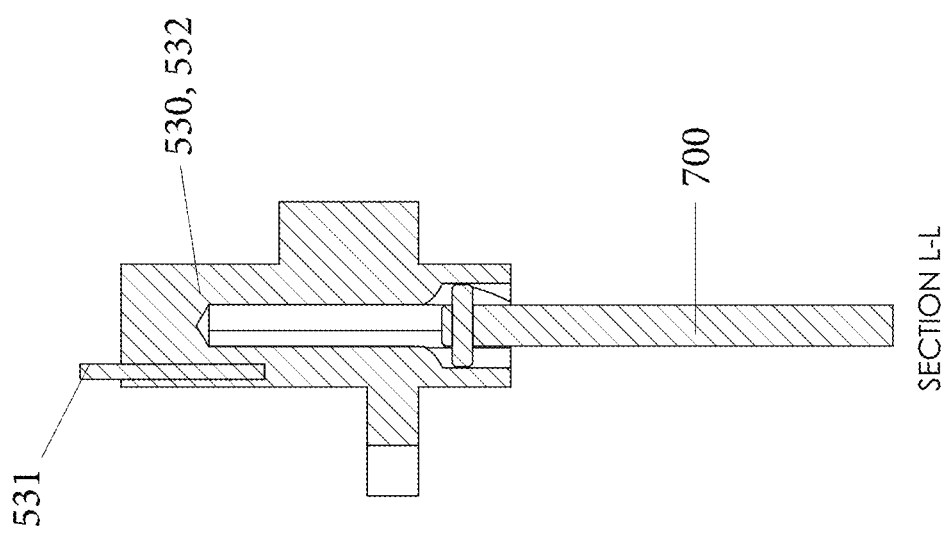
Fig. 30B  SECTION L-L
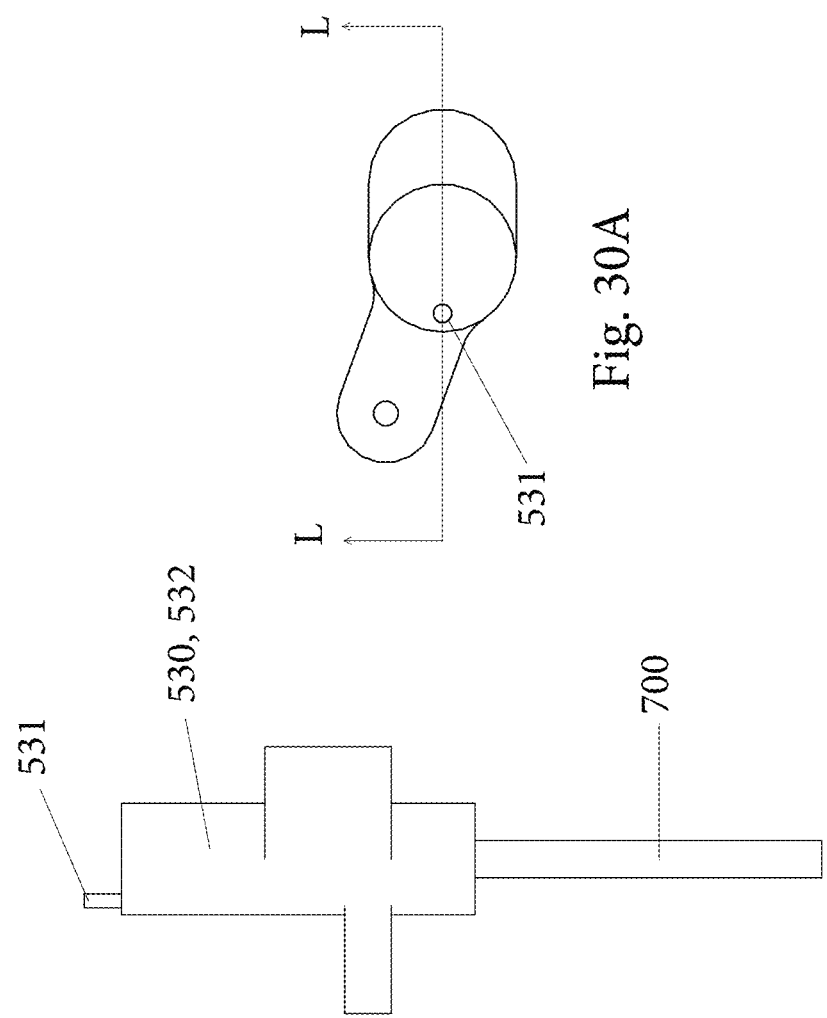
Fig. 30A
Fig. 29

FULL RELEASE

SECTION M-M

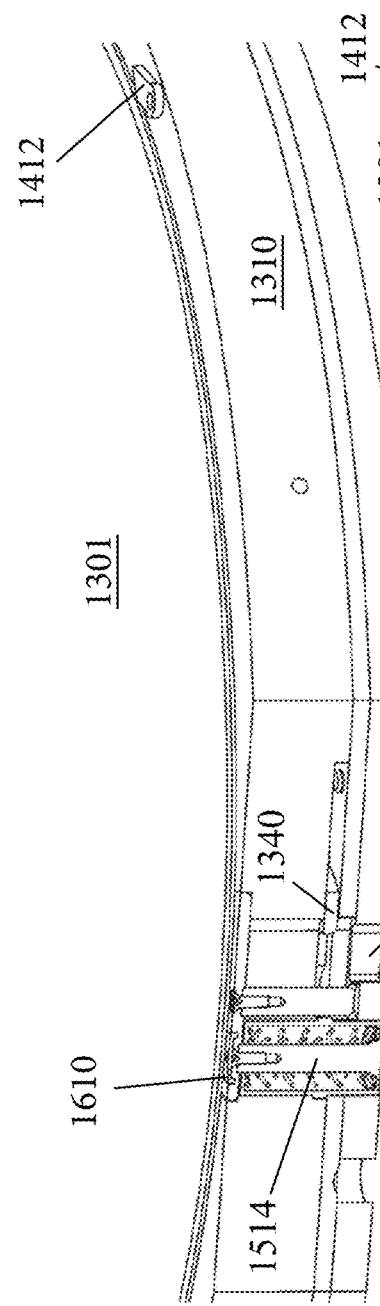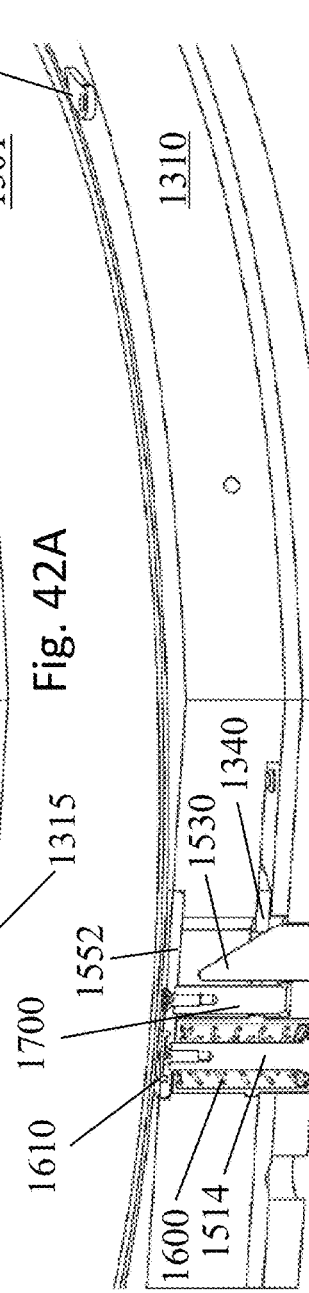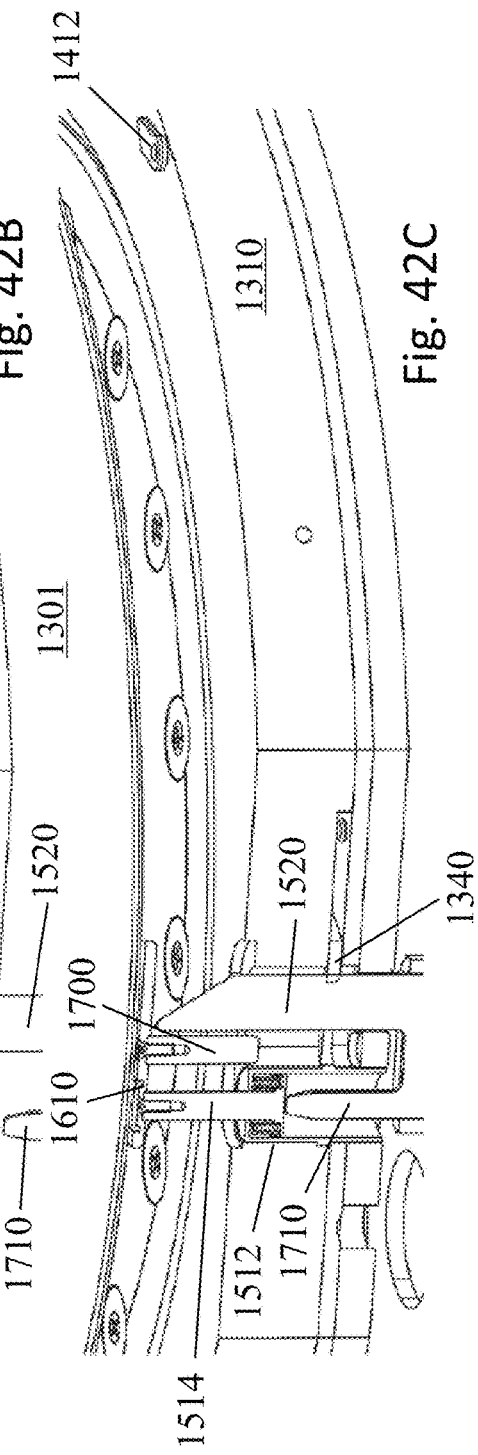

SEMICONDUCTOR WAFER PROCESSING CHAMBER

CROSS-REFERENCE TO RELATED PATENT APPLICATIONS

This application is based on and claims priority to U.S. Provisional Patent Application Ser. No. 62/489,806, filed Apr. 25, 2017, and is related to U.S. patent application Ser. No. 15/496,755 and U.S. Provisional Patent Application Ser. No. 62/489,793, the entire contents of each being hereby expressly incorporated by reference in its entirety as if expressly set forth in its respective entirety herein.

TECHNICAL FIELD

The present invention is generally directed to wafer processing equipment and more particularly, to a semiconductor wafer processing chamber that includes multiple exhaust pathways and a grip mechanism for holding a wafer in place along a rotatable wafer support surface (e.g. a wafer chuck).

BACKGROUND

Integrated circuit wafers, which typically are in the form of flat round disks (although other shapes are possible) and often are made from silicon, Gallium Arsenide, or other materials, may be processed using various chemicals. One process is the use of liquid chemical etchant to remove material from or on the substrate, this process is often referred to as wet etching.

Wet etching is typically performed in a chamber that includes a rotatable chuck on which the wafer rests and one or more dispensing arms are provided for dispensing the chemicals onto the wafer.

In one aspect, this invention relates particularly to silicon wafer processing where multiple fluids are used during a process to clean, etch or do other wet process operations. The fluids are often expensive, and it is desirable to reuse them to exhaustion.

Normal wafer processing employs one collection chamber to separate a special fluid from the waste drain and enable recirculation of the fluid.

One object of this invention is to have multiple, independent collection chambers, with the ability to separate multiple different fluids for recirculation and reuse.

In addition, there is also a need to properly vent gas from within the chamber to avoid redeposition of the chemical onto the wafer. The present invention addresses this need.

SUMMARY

A reconfigurable wafer spin chuck for supporting a wafer includes a rotatable chuck base having a first opening formed therein and including one or more support members extending upwardly therefrom. The spin chuck is reconfigurable between a first chuck type and a second chuck type, wherein the first chuck type comprises a non-contact wafer type chuck and the second chuck type comprises an open backside frame type chuck. In the non-contact wafer type chuck, a first insert is mounted to the chuck base and supported by the one or more support members and in the open backside frame type chuck, a second insert is mounted to the chuck base and supported by the one or more support members. The wafer is spaced a first distance from the first insert and is spaced a second distance from the second insert, the second distance being greater than the first distance.

In accordance with another embodiment, a wafer processing system includes a housing and a gas source configured to provide gas flow within an interior of the housing. With the housing a rotatable wafer support member for supporting a wafer is provided as well as a splash shield that is disposed about a peripheral edge of the wafer support member and is movable between a raised position and a lowered position. A plurality of collection trays is disposed about the peripheral edge of the wafer support member and within a central opening of the splash shield. The collection trays are arranged in a stacked configuration, with each collection tray having a trough section for collecting fluid. At least one of the collection trays has a drain outlet for draining the collected fluid from the wafer processing system.

A drive mechanism is provided for selectively moving one or more of the collection trays to a raised position above the wafer support member so as to define a collection chamber formed between at least one raised collection tray and a lowered collection tray. The collection chamber is configured to collect fluid that is discharged from the wafer during the processing thereof and routes the collected fluid through the drain outlet of the lowered collection tray.

In accordance with one aspect of the wafer processing system, the housing includes at least one chamber exhaust outlet and at least one chemical exhaust outlet. The chamber exhaust outlet is formed in the housing for venting gas from the interior of the housing and the chemical exhaust outlet is formed in the housing for venting gas that flows along at least one of: (a) a first flow path defined between the splash shield in a raised position and the collection trays in the lowered position; and (b) a second flow path in which the gas flows through the collection chamber to the chemical exhaust outlet. The chemical exhaust outlet is separate and spaced from the chamber exhaust outlet.

BRIEF DESCRIPTION OF THE DRAWING FIGURES

FIG. 2A is cross-section side view of the chamber of FIG. 1 in a first operating position;

FIG. 2B is cross-section side view of the chamber of FIG. 1 in a second operating position;

FIG. 2C is cross-section side view of the chamber of FIG. 1 in a third operating position;

FIG. 2D is cross-section side view of the chamber of FIG. 1 in a fourth operating position;

FIG. 7C is a full cross-sectional view of the tray arrangement of FIG. 7B with the trays being shown in a first operating position;

FIG. 7F is a top and side partial perspective view of yet another alternative tray arrangement showing a basket construction used to couple the actuators to the trays;

FIG. 7G is a partial cross-sectional view of the tray arrangement of FIG. 7F with the trays being shown in a first operating position;

FIG. 7H is a partial cross-sectional view of the tray arrangement of FIG. 7F with the trays being shown in a second operating position;

FIG. 7I is a perspective view of the basket construction for individually coupling the trays to the actuators;

FIG. 14A is a top plan view of the grip mechanism in an open position;

FIG. 14B is a side elevation view of the grip mechanism;

FIG. 14C is a close-up of a grip cylinder and grip pin in the open position;

FIG. 15A is a top plan view of the grip mechanism in a gripped position;

FIG. 15B is a side elevation view of the grip mechanism;

FIG. 15C is a close-up of a grip cylinder and grip pin in the open position;

FIG. 17A is a top plan view of the grip mechanism showing a first step to release the wafer;

FIG. 17B is a cross-sectional view taken along the line A-A of FIG. 17A;

FIG. 18A is a top plan view of the grip mechanism showing a second step to release the wafer;

FIG. 18B is a cross-sectional view taken along the line B-B of FIG. 18A;

FIG. 19A is a top plan view of the grip mechanism showing a third step to release the wafer;

FIG. 19B is a cross-sectional view taken along the line C-C of FIG. 19A;

FIG. 21B is a cross-sectional view taken along the line H-H of FIG. 21A;

FIG. 21C is a close-up of a portion of the grip mechanism of FIG. 21A;

FIG. 21D is a close-up of the grip rotor and grip pin of FIG. 21A;

FIG. 23A is a top plan view of the grip mechanism according to a second embodiment and showing the grip mechanism in the closed position;

FIG. 29 is a side elevation view of a grip rotor and grip pin according to another embodiment;

FIG. 30A is a top plan view of the grip rotor and grip pin of FIG. 29;

FIG. 30B is a cross-sectional view taken along the line L-L of FIG. 30A;

FIG. 42A shows the cam member and lifter in the fully retracted position;

FIG. 42B shows the cam member and lifter in a partially extended position;

FIG. 42C shows the cam member and the lifter in a fully extended position;

DETAILED DESCRIPTION OF CERTAIN EMBODIMENTS

Figure 1A:
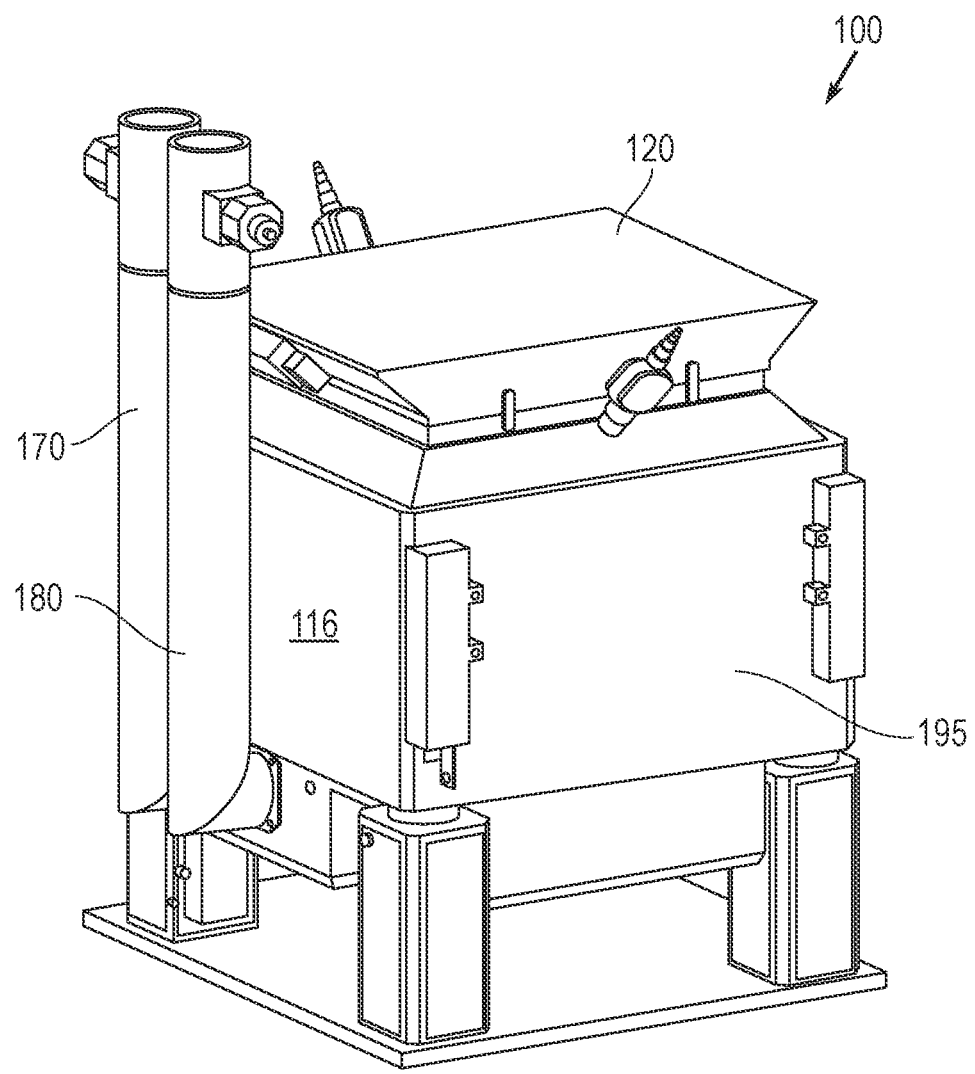
FIG. 1A is a top and side perspective view of an exemplary semiconductor wafer processing chamber in accordance with one embodiment.
Figure 1B:
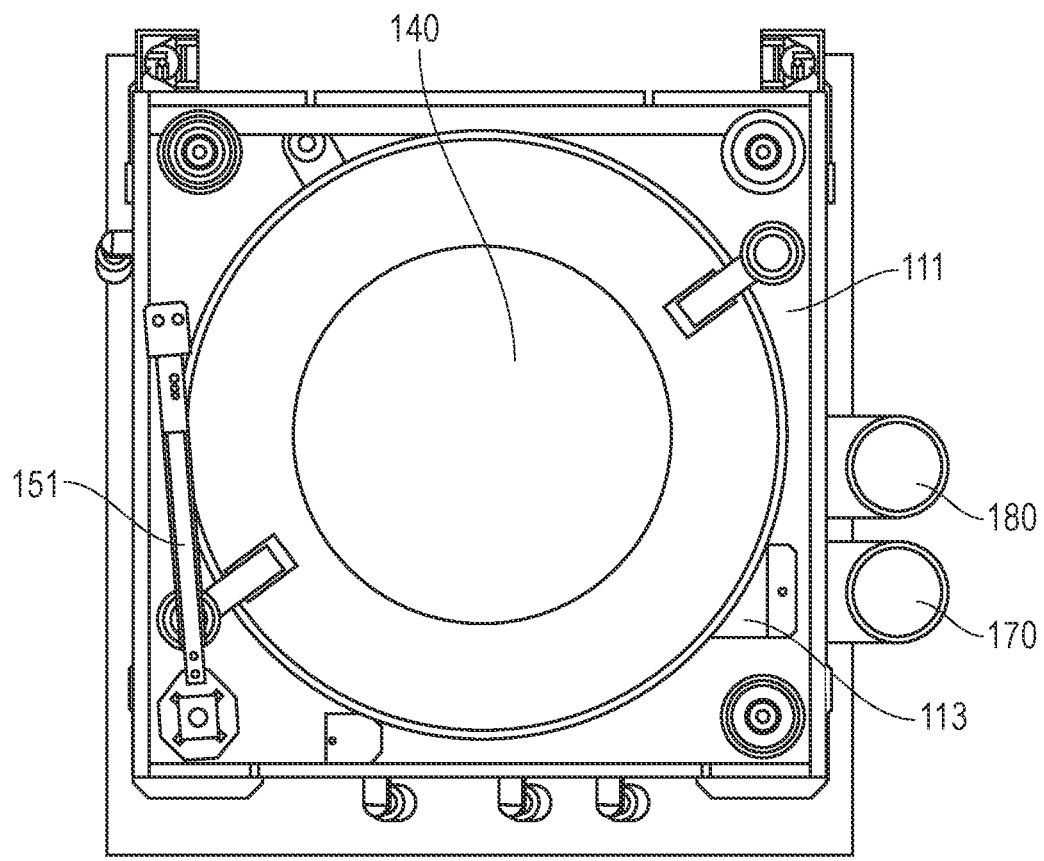
FIG. 1B is a top plan view thereof.
Figure 1C:
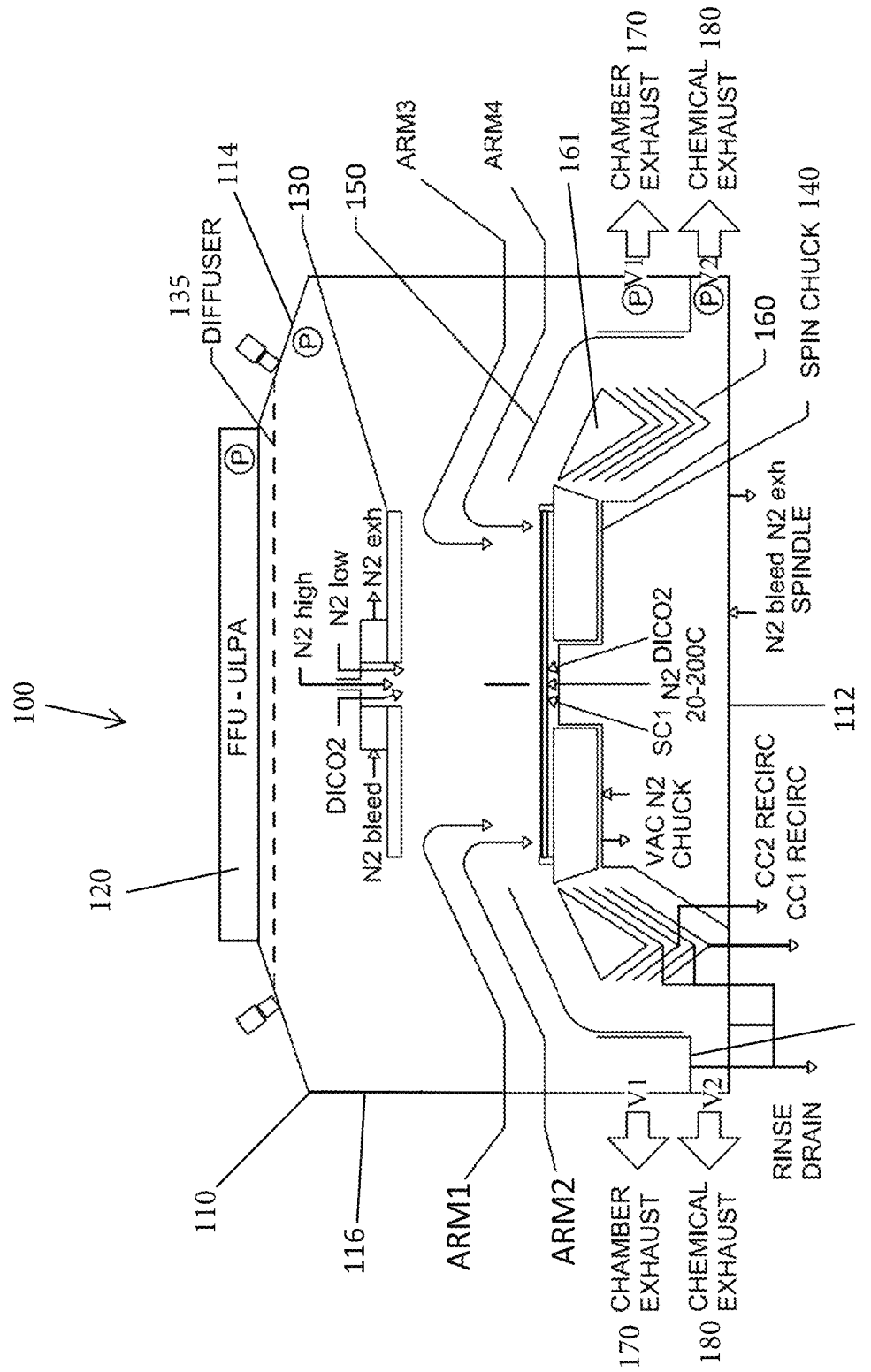
FIG. 1C is cross-sectional side view of the semiconductor wafer processing chamber of FIG. 1A.

FIGS. 1A-1C set forth a general overview of a piece of wafer processing equipment that is configured for the wet treatment of a plate-like article (i.e., a wafer) and in particular, illustrates a semiconductor wafer processing chamber 100 that is defined by a housing 110. The housing 110 has a hollow interior in which working components of the wafer processing equipment are disposed as discussed herein. The housing 110 is thus defined by a bottom wall (floor) 112, an opposite top wall 114 and a side wall 116 that extends between the bottom wall 112 and the top wall 114. The housing 110 can be square or rectangular shaped and therefore, includes four side walls 116. The housing 110 includes a number of exhaust features for distributing and venting gas as discussed herein.

The housing 110 can include a filter fan unit (FFU-ULPA) 120 that is disposed along the top wall 114 of the housing 110 and is in fluid communication with the hollow interior of the housing 110. The filter fan unit 120 is configured to generate air flow within the hollow interior and is thus, part of an exhaust/venting system as described below. The filter fan unit 120 preferably utilizes ULPA filtration with a target of ISO class 1 output with ISO class 100 inlet supply air. In other words, the filter fan unit 120 has a filter component and a fan component. The fan component is a variable speed fan that cooperates with exhaust throttle valves to allow the housing to be maintained at either a net positive or negative pressure in respect to the surrounding environment. The filter fan unit 120 has a pressure detection feature that indicates when the filter media needs to be replaced or when there is a failure. In particular, a computer module that is operatively connected to the filter fan unit 120 monitors differential pressure to detect when the filter media requires changing or when there is system failure. A differential pressure transmitter is connected between the interior of the filter fan unit and the interior of chamber (housing 110).

As also shown in the drawings, a diffuser 135 can be provided below the fan filter unit 120. The diffuser 135 can consist of a plate with rinse nozzles (e.g., ambient deionized water (DI) nozzles) between the plate and the fan filter unit 120 surrounding the peripheral edges for the purpose of rinsing down the entire interior surfaces of the outer walls of the chamber 100. The diffuser 135 can also accommodate mounting of a camera.

The semiconductor wafer processing chamber 100 also includes a rotatable spin chuck 140. Any number of different spin chucks 140 can be used in accordance with the present invention and therefore, the structure of the spin chuck 140 will vary depending upon the type of spin chuck 140 that is implemented. For example, one type of spin chuck 140 is configured to hold and rotate the wafer and includes a gas supply means for directing gas towards the face of the wafer, which is facing the spin chuck, wherein the gas supply means comprises a gas nozzle rotating with the spin chuck, for providing a gas cushion between the plate-like article and the spin chuck. Such a chuck is commonly known as Bernoulli-Chuck because the plate-like article is pulled towards the chuck by vacuum generated due to the aerodynamic paradox called Bernoulli-Effect. Such Bernoulli-chucks may comprise radially movable pins, wherein the pins securely hold the plate-like article even if no pressurized gas is providing the Bernoulli-Effect.

It will be understood that other types of spin chucks 140 can be used including but not limited to air bearing, gas sealed, pedestal and vacuum chucks.

The spin chuck 140 is centrally located within the housing 110 below the spin shield 130 and in the case of a Bernoulli type chuck, as illustrated, is fluidly connected to one or more fluids (gases and/or liquids). A main spindle is provided and is operatively coupled to the spin chuck 140 for controlled rotation thereof under action of a motor, such as a frameless three phase servo motor with a rotor directly coupled to the spin chuck 140. The spin shield 130 serves to protect against fluid redeposit on the spin chuck 140. The spin shield 130 can not only be positioned in a full raised position and a full lowered position but also can be placed in a partially raised position.

The semiconductor wafer processing chamber 100 also preferably includes a movable splash shield 150. The splash shield 150 is disposed external to the spin chuck 140 and in particular, the splash shield 150 surrounds the spin chuck 140.

The splash shield 150 is operatively coupled to an actuator to allow for the controlled raising and lowering of the splash shield 150. In other words, the splash shield 150 moves in a vertical direction within the housing 110 between a raised position and a retracted position. The splash shield 150 thus can have an outer wall portion and an inwardly angled top wall portion. A free end of the inwardly angled top wall portion is disposed proximate the outer edge of the spin chuck 140.

The splash shield 150 also serves a role in the fluid flow dynamics within the housing 110, as described below, in that gas flow paths within the chamber interior depends at least in part on the position of the splash shield 150. In particular, there can be two distinct flow paths within the housing interior for venting gas (fumes) that are generated within the housing interior during the wafer processing. Venting of this gas is desirable since undesired gas buildup within the housing interior can lead to condensate forming on the wafer. The two distinct gas flow paths are described below.

The semiconductor wafer processing chamber 100 also preferably includes a plurality of fluid collectors 160 which can be in the form of fluid collection (trays) cups that are configured to collect fluid (chemistry) that is discharged from the top of the rotating wafer due to centrifugal forces. The fluid collectors 160 generally are in the form of stacked annular shaped collectors that have a collection space, such as a trough, and are each independently movable between a raised position and a lowered position. The fluid collectors 160 are configured to nest with each other as shown. A fluid collection chamber is defined between one or more raised fluid collectors 160 and one or more lowered fluid collectors 160. The fluid collectors 160 surround the spin chuck 140 and are disposed between the splash shield 150. Each of the fluid collectors 160 includes one or more drain outlets that allow the collected fluid to be routed away from the fluid collectors 160 and more particularly, from the collection chamber for collection and reuse, etc.

There can also be a fluid collector cover 161 that is disposed above the uppermost fluid collector 160 and covers a trough section thereof. In one embodiment, there are two or more fluid collectors 160 and in particular, there are three or more fluid collectors 160 (e.g., four fluid collectors). It will also be understood that a fluid collection chamber can be defined between the cover 161 and the uppermost fluid collector 160.

The cover 161 and fluid collectors 160 are independently movable using any number of techniques, including but not limited to the drive mechanisms described in relation to FIGS. 1-10 of U.S. patent application Ser. No. 14/457,645, which is hereby incorporated by reference in its entirety. The drive mechanism can thus be in the form of independent guided stepper driven lead screws with position feedback encoder. When actuated, the drive mechanism causes the controlled raised of one or more fluid collectors 160. As mentioned, the fluid collectors 160 can be nested such that as the subsequent fluid collector 160 is actuated it pushes up and disengages the previous fluid collector 160 from its respective actuator. The nesting is such that no overspray can occur in the fluid collector 160 or at the drain location of the fluid collector 160. In the case of using three fluid collectors 160, the lower and upper fluid collectors 160 are provided with recirculation, while the center fluid collector 160 is used for chemical rinse between the steps.

Figure 3:
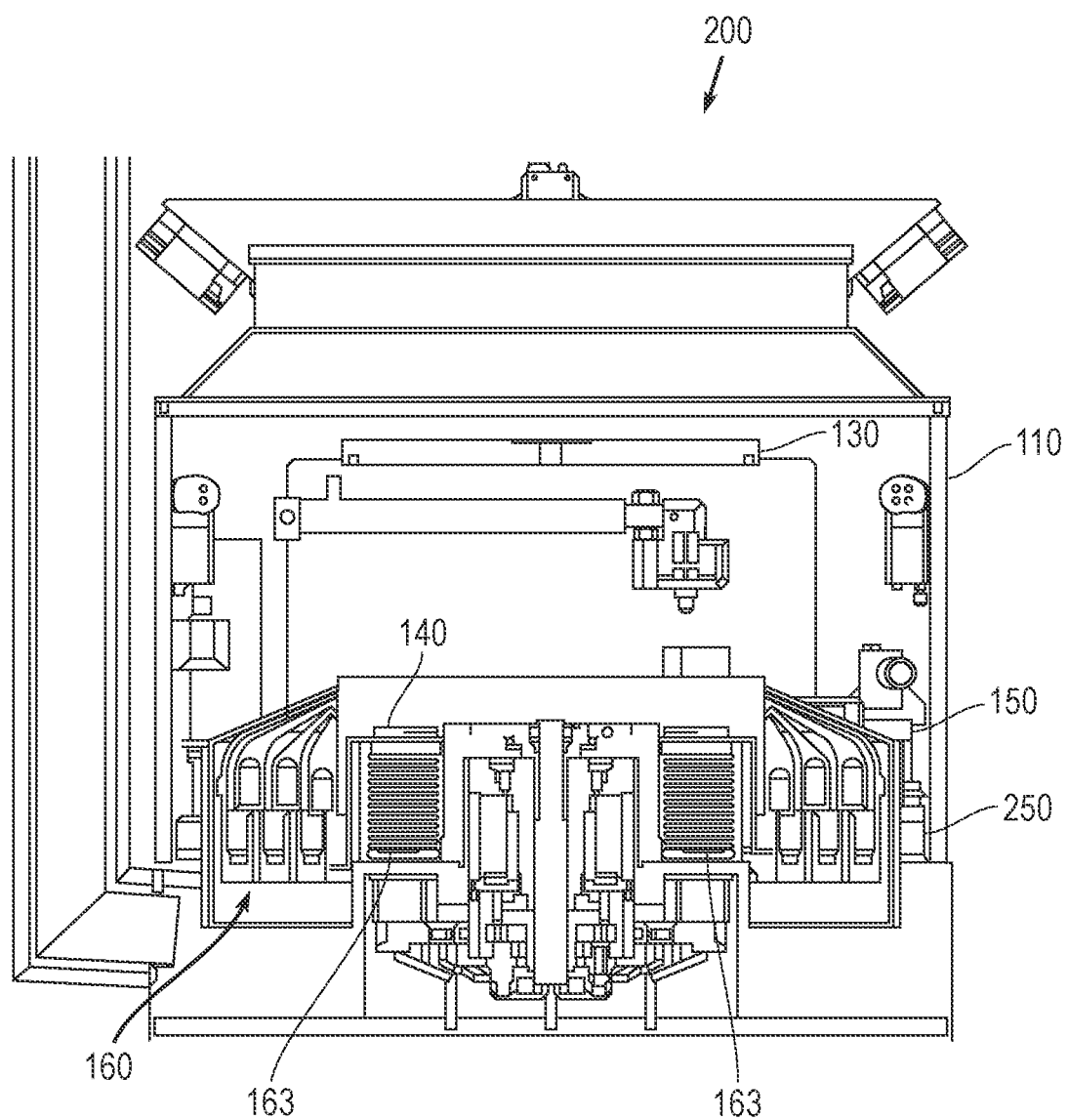
FIG. 3 is cross-sectional side view of an exemplary semiconductor wafer processing chamber in accordance with another embodiment.

FIG. 3 shows one exemplary drive mechanism for controlling the movement of the fluid collectors 160. More specifically, lifting actuators 163 are provided for controllably and independently moving each of the fluid collectors 160. The lifting actuators 163 can be in the form of bellows and motors (e.g., stepper motors) as illustrated (and thus can be referred to as a bellows actuator).

It will also be appreciated that the shield 130 has a separate drive mechanism that selectively rotates the shield 130 and also selectively raises and lowers the shield 130. For example, a brushless servo motor can be used to rotate the shield 130 and a servo driven lead screw can be used to both raise and lower the shield 130.

The semiconductor wafer processing chamber 100 includes two separate exhausts that can be throttled independently, namely, a chamber exhaust 170 and a chemical exhaust 180 (in other words, the degree of exhaust being discharged (evacuated) can be controlled by the user). The chamber exhaust 170 and the chemical exhaust 180 are separated by the splash shield 150 and a splash shield labyrinth so as to create separate, independent flow paths within the interior of the chamber. By incorporating a valve member into each of the chamber exhaust 170 and the chemical exhaust 180, the respective flow rates can be altered.

The chamber exhaust 170 is located at the outer periphery of the chamber and exhausts air past chemical dispense arms 151 when they are in the lowered and stowed position. As will be appreciated, the chemical dispense arms are configured to dispense fluids onto the surface of the wafer during a wafer processing operation. As shown in FIGS. 1A-1C, the chamber exhaust 170 can be in the form of an opening in the side wall of the housing 110 at a location outside of the splash shield 150. As described herein, fluid flows to the chamber exhaust 170 by flowing over and around the splash shield 150 to a dedicated exhaust outlet 170. There can be multiple chamber exhaust outlets formed along the side wall of the housing 110. Alternately, a single exhaust outlet may be provided as described herein with respect to other embodiments such as the one disclosed in FIGS. 43A and 43B. It will also be appreciated that the chamber exhaust 170 includes not only an outlet formed in the housing 110 but also an external conduit that can be routed along the exterior of the housing 110.

The chamber exhaust 170 includes an independent first valve member V1 that is configured to control the flow through the chamber exhaust 170. Any number of different types of valves can be used as the first valve member V1. For example, the first valve member V1 can be in the form of a butterfly valve or throttle valve.

The chamber exhaust 170 thus exhausts gas within the chamber from areas generally outside of the fluid collectors 160. As shown in FIG. 1B, the floor 111 can include an opening (cutout) 113 that provides direct fluid communication between the interior of the chamber and the chamber exhaust (conduit) 170. As described herein, the chamber exhaust 170 is sealed off from the chemical exhaust 180. It will be appreciated that a diffuser plate (not shown) can cover the outer periphery of the chamber surrounding the splash shield and spaced from the floor 111 to distribute exhaust flow uniformly around the splash shield.

The chemical exhaust 180 exhausts gas that flows through the splash shield 150 and the chemical collectors (cups) 160 to a chemical exhaust (outlet) that can also be formed along the side wall of the housing 110 but is fluidly isolated from the chamber exhaust 170. The chemical exhaust 180 can be located side-by-side relative to the chamber exhaust 170 as shown. As shown, the floor 111 within the housing 110 can separate each chamber exhaust 170 from each chemical exhaust 180. In particular, the chemical exhaust 180 is only reached by flowing internally within the splash shield 150 and/or by flowing internally within the fluid collectors 160. The chemical exhaust 180 thus vents gases that may have built up in the splash shield/fluid collectors area.

Figure 43A:
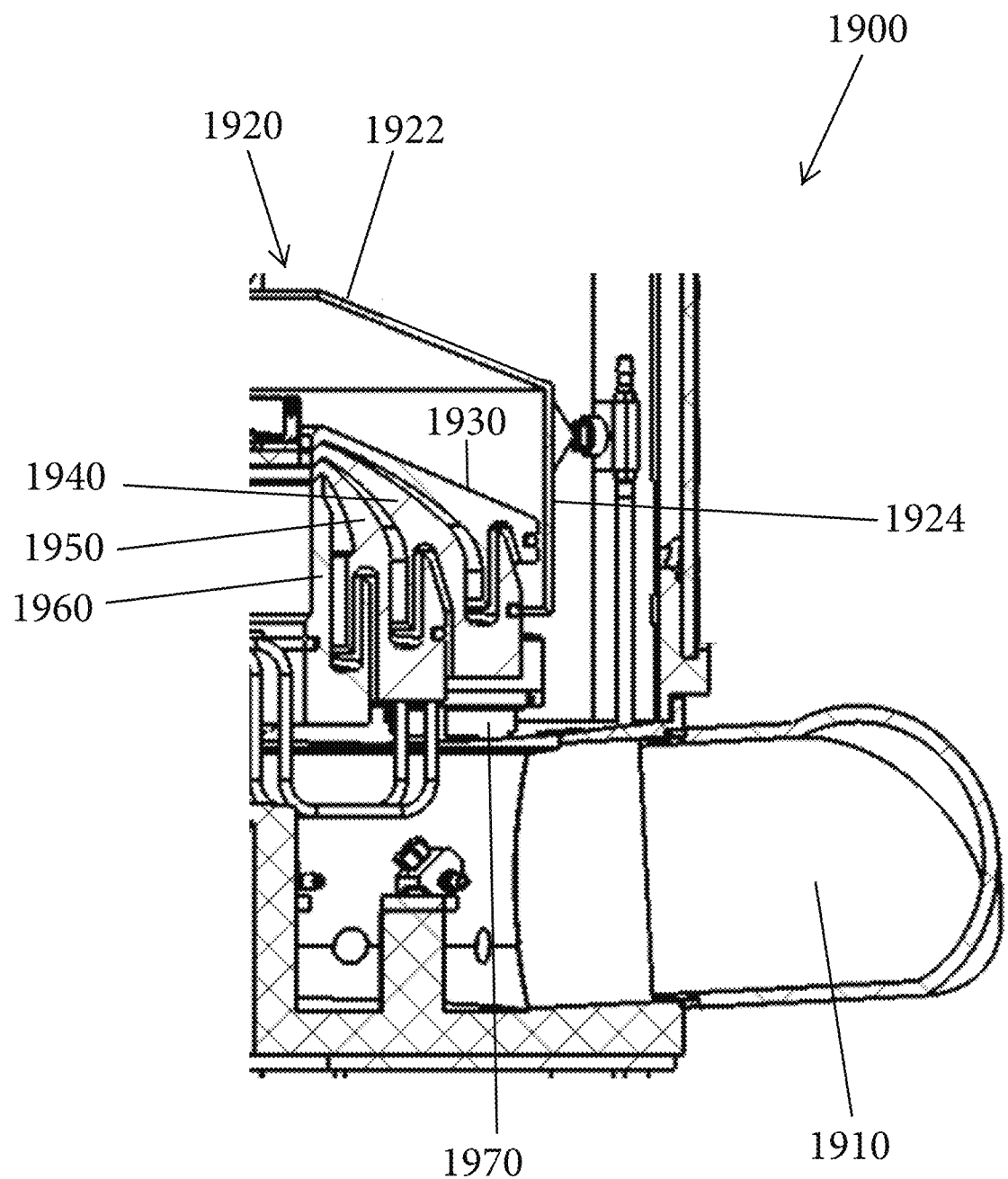
FIG. 43A is a cross-sectional view of an alternative exhaust system in which only one exhaust is shown with the splash shield being in an open position which allows air to get around the splash shield into the exhaust.
Figure 43B:
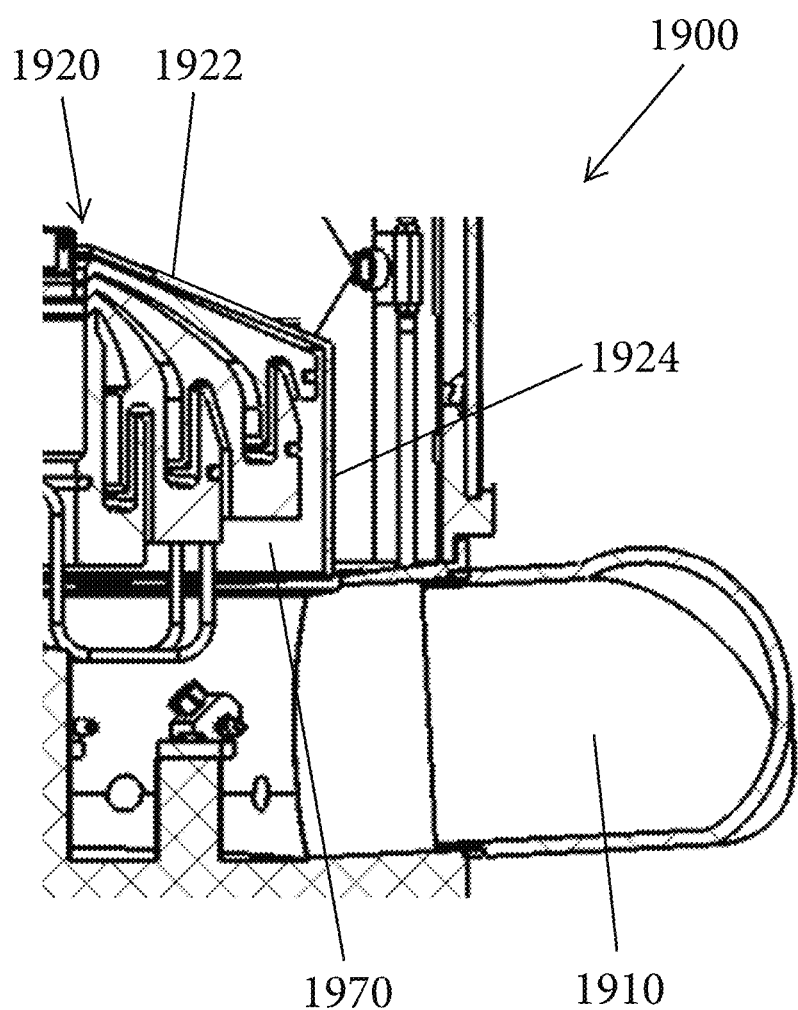
FIG. 43B is a cross-sectional view of the exhaust system of FIG. 43A with the splash shield in the closed position.

The chemical exhaust 180 includes an independent second valve member V2 that is configured to control the flow through the chemical exhaust 180. Any number of different types of valves can be used as the second valve member V2. For example, the second valve member V2 can be in the form of a butterfly valve or throttle valve. The valves V1 and V2 can be the same or different. Alternately and as shown in FIGS. 43A and 43B the chamber exhaust 170 is not provided and labyrinth 250 which is in the form of an annular shaped ring that is outwardly radial to the splash shield 150 is also not provided. In this embodiment, the height of splash shield 150 can be adjusted to throttle flow from the outer portion of splash shield 150 and the inner portion of shield 150 with the collection cups through exhaust 180.

The semiconductor wafer processing chamber 100 can also include a gate valve 195 which can be in the form of a sealed valve that can be selectively opened to insert and remove substrate (wafers).

FIGS. 2A-2D show various exhaust flow patterns depending upon the various positions of the splash field 150 and the fluid collectors 160. FIG. 2A shows the splash shield 150 in the retracted (lowered) position and the cover 161 and fluid collectors 160 in the lowered positions. As shown by the arrows which indicate fluid flow, fluid (air) is exhausted by flowing over the retracted dispensing arms (See, FIG. 1: arms 1, 2, 3, 4) and the splash shield 150 to the chamber exhaust 170. Since the collector cover 161, along with all of the collectors 160, and the splash shield 150 are retracted, fluid does not flow into the fluid collectors 160 to the chemical exhaust 180. FIG. 2B shows the splash shield 150 in a raised position and the collector cover 161 and fluid collectors 160 in the retracted (lowered) position. As shown, a portion of the exhaust gas (air) flows above and over the splash shield 150 to the chamber exhaust 170 and another portion of the exhaust gas is drawn into a space between the splash shield 150 and the collector cover 161 where it then flows to the chemical exhaust 180. FIG. 2C shows the splash shield 150 and the collector cover 161 in the raised positions, while the fluid collectors 160 are in the lowered position. A portion of the exhaust gas (air) flows above and over the splash shield 150 to the chamber exhaust 170 and another portion of the exhaust gas is drawn into a space (first collection chamber) between the collector cover 161 and the topmost fluid collector 160 where it then flows to the chemical exhaust 180. It will be appreciated that the degree of which the splash shield 150 is raised influences the volume of gas that flows to the chemical exhaust 180. FIG. 2D shows a position in which the splash shield 150, the collector cover 161 and three of the four fluid collectors 160 are in the raised position. Only the fourth fluid collector 160 which represents the bottommost fluid collector is in the retracted (lowered) position, thereby defining a collection chamber for collecting fluid expelled from the rotating wafer. A portion of the exhaust gas (air) flows above and over the splash shield 150 to the chamber exhaust 170 and another portion of the exhaust gas is drawn into a fourth collection chamber (defined between the third and fourth fluid collectors) where it then flows to the chemical exhaust 180.

As shown in FIGS. 2A-2D, the chamber can include a plurality of pressure transducers (P) that are located throughout the chamber including at locations at or near the chamber exhaust 170 and the chemical exhaust 180. Measurements at the pressure transducers can be used as part of a process to monitor interior gas flow and to control the operation of the valve members V1 and V2. In addition, the feedback from the pressure transducers can also be used to vary the fan velocity of the filter fan unit 120.

It will be understood that the gas that is exhausted through the chamber including through the collection cups (i.e., to the exhausts 170, 180) can be via the filter fan unit 120 or may simply be the ambient air around the chamber (in the case where there is no filter fan unit 120). The gas can be any number of suitable gases, including but not limited to filtered air or nitrogen.

FIGS. 3-6D illustrate a semiconductor wafer processing chamber 200 that is very similar to the one generally shown in FIG. 1 with the exception that FIGS. 3-6D illustrate fluid collectors that are different in construction than the general fluid collectors 60 shown in FIG. 1. The semiconductor wafer processing chamber 200 otherwise includes the same components as shown in FIG. 1 including but not limited to the housing 110, filter fan unit 120, spin shield 140, spin chuck 140, splash shield 150, chamber exhaust 170, and chemical exhaust 180. Like elements are thus numbered alike.

The fluid collectors of the semiconductor wafer processing chamber 200 are similar in function and operation to the fluid collectors 60 in that each of these fluid collectors can be independently controlled and driven between a raised position and a lowered position (vertical movement). Between two adjacent fluid collectors, a fluid collection chamber is defined when one of the fluid collectors is in the raised position and the other of the fluid collectors is in the lowered position, thereby creating a space in which fluid (chemicals) that is expelled from the wafer is collected and then subsequently flows through a drain to a collection site.

As shown in FIGS. 3-6D, the semiconductor wafer processing chamber 200 includes a plurality of fluid collectors and in particular, there can be three or more fluid collectors in one embodiment or four or more fluid collectors in another embodiment. In the illustrated embodiment, there are four fluid collectors, namely, a first fluid collector 210 (first collection cup), a second fluid collector 220 (second collection cup), a third fluid collector 230 (third collection cup), and a collection cover 240. It will be seen that the collection cover 240 does not includes a trough for collecting fluid; however, it acts as a cover that does define one of the fluid collector chambers defined by the third fluid collector 230 and the collection cover 240. It will be understood that terms first, second and third collectors (collection chambers, collection troughs, etc.) are used to describe distinct collection chambers and the order of the terms can be reversed or the collection chambers can be referred to as being an outer collection chamber (the one farthest from the center chuck), a middle collection chamber and an inner collection chamber (the one closest to the center chuck). The collection cover 240 moves independent of the collection cups.

The three fluid collectors 210, 220, 230 are independently movable in the vertical direction to move between the raised and lowered positions and they are also configured to nest with one another in both the raised position and the lowered position. As illustrated, the ring 250 (labyrinth) is in the form of a wall can that surrounds the spin chuck 140. The splash shield 150 is located inside of the ring 250 in close proximity thereto. As previously mentioned, the splash shield 150 moves between a raised position (FIG. 4B) and a lowered position (FIG. 4A) and can selectively be put in any position. In the lowered position, a lower wall portion 151 of the splash shield 150 is in close proximity to the first fluid collector 210 (which represents the uppermost fluid collector) and the angled upper wall portion 152 of the splash shield 150 is designed to cover the underlying fluid collectors to prevent fluid from flowing thereto.

In general, the fluid collectors 210, 220, 230, 240 are constructed so as to define serpentine fluid flow paths within a given fluid collection chamber.

The first fluid collector 210 has a base portion 211 defined by an inner wall 212 and an outer wall 213 with a trough 214 being formed between the inner wall 212 and the outer wall 213. The trough 214 can have a curved floor such that the trough 214 has a concave recessed shape. The outer wall 213 as an upper portion 215 that curves inwardly toward the spin chuck 140. The curvature of the upper portion 215 is complementary to the angled upper wall portion 152 of the splash shield 150 so as to allow the upper portion 215 to seat against or be positioned in very close proximity to the upper portion 215 when the two are both in either the raised position or the lowered position. As shown, the first fluid collector 210 is positioned radially outward relative to the other fluid collectors 220, 230, 240. As shown in the figures, the first fluid collector 210 includes a throat portion 209 that is in the form of an overhanging portion that seals the collector (cup) when it is closed and thereby prevents liquid from entering into the collection chamber (cup). As shown, the throat portion 209 is downwardly angled with a tip portion seating against an inner edge of the below collection cup. It will be understood that the other collection cups have similar throat portion although not specifically labeled with reference characters.

The second fluid collector 220 has a base portion 221 defined by an inner wall 222 and an outer wall 223 with a trough 224 being formed between the inner wall 222 and the outer wall 223. The trough 224 can have a curved floor such that the trough 224 has a concave recessed shape. The outer wall 223 as an upper portion 225 that curves inwardly toward the spin chuck 140 and also defines a downwardly extending finger 227 that is spaced from, is located radially outward from, and is parallel to the outer wall 223. A concave shaped space is defined between the outer wall 223 and the finger 227. The finger 227 is thus positioned such that it can be positioned within the trough 214 of the first fluid collector 210 (i.e., it is positioned between the inner wall 212 and the outer wall 213). As shown, in one embodiment, a top edge (B) of the inner wall 212, 222 is higher than a bottom edge (A) of the finger 227. The fingers are arranged so that fluid is directed into the cup and not leaking between the cups.

As can be seen when the first and second fluid collectors 210, 220 are both in either the raised position or the lowered position, positioning of the finger 227 within the trough 214 defines a serpentine shaped flow path.

The outer wall 223 of the second fluid collector 220 terminates at inner edge that aligns with the inner edge of the outer wall 213 of the first fluid collector 210.

The third fluid collector 230 has a base portion 231 defined by an inner wall 232 and an outer wall 233 with a trough 234 being formed between the inner wall 232 and the outer wall 233. The trough 234 can have a curved floor such that the trough 234 has a concave recessed shape. The outer wall 233 as an upper portion 235 that curves inwardly toward the spin chuck 140 and also defines a downwardly extending finger 237 that is spaced from, is located radially outward from, and is parallel to the outer wall 233. A concave shaped space is defined between the outer wall 233 and the finger 237. The finger 237 is thus positioned such that it can be positioned within the trough 224 of the second fluid collector 220 (i.e., it is positioned between the inner wall 222 and the outer wall 223). As shown, in one embodiment, a top edge (B) of the inner wall 232 is higher than a bottom edge (A) of the finger 237.

As can be seen when the second and third fluid collectors 220, 230 are both in either the raised position or the lowered position, positioning of the finger 237 within the trough 224 defines a serpentine shaped flow path.

The outer wall 233 of the third fluid collector 230 terminates at inner edge that aligns with the inner edge of the outer wall 213 of the first fluid collector 210 and the inner edge of the outer wall 223 of the second fluid collector 220.

The second fluid collection 220 is thus disposed between the first fluid collector 210 and the third fluid collector 230.

The collection cover 240 thus has a construction that is different each of the first, second and third fluid collectors 210, 220, 230. The collection cover 240 is defined by an upper base portion 241 that has an inner finger 242 that extends downwardly from the upper base portion 241 and an outer finger 243 that extends downwardly from the upper base portion 241 and is spaced from the inner finger 242. This space between the inner finger 242 and outer finger 243 is defined by a concave shaped ceiling.

The outer finger 243 is thus positioned such that it can be positioned within the trough 234 of the third fluid collector 230 (i.e., it is positioned between the inner wall 232 and the outer wall 233). The inner finger 242 lies outside of the inner wall 232 of the third fluid collector 230.

As can be seen when the third and fourth fluid collectors 220, 230 are both in either the same position, positioning of the outer finger 243 within the trough 234 defines a serpentine shaped flow path.

The upper base portion 241 of the collection cover 240 terminates at an inner edge that aligns with the inner edge of the outer wall 213 of the first fluid collector 210, the inner edge of the outer wall 223 of the second fluid collector 220, and the inner edge of the outer wall 233 of the third fluid collector 230.

Figure 4B:
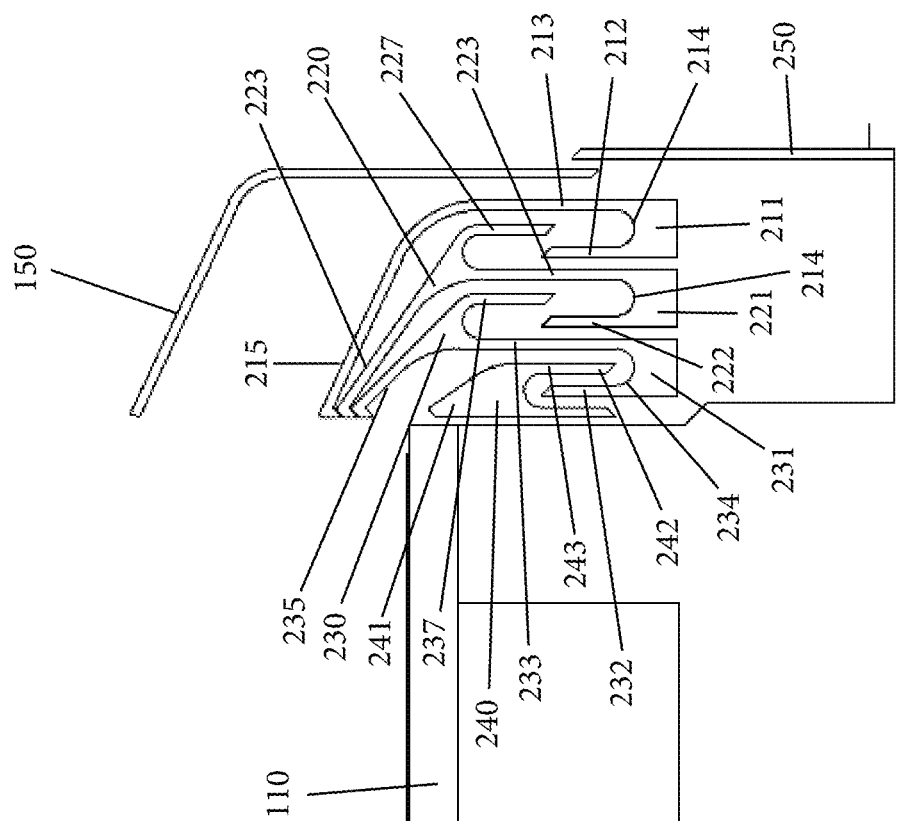
FIG. 4B is a localized cross-sectional view of the stackable collection trays and a splash shield of FIG. 4A shown with the splash shield and first, second and third collection trays in raised positions and a fourth collection tray in a lowered position.
Figure 4A:
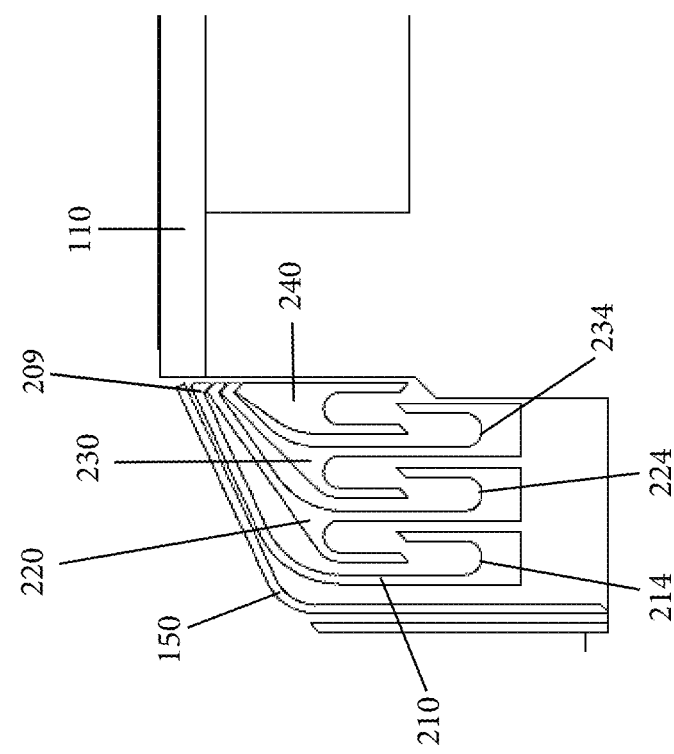
FIG. 4A is a localized cross-sectional view of exemplary stackable collection trays and a splash shield shown in lowered positions.

FIG. 4A shows the splash shield 150 and the first, second, and third fluid collectors 210, 220, 230 and the collection cover 240 in the lowered position which as described herein seals off the fluid collection chambers defined therein (in part because the inner edges of the collectors are in close stacked relationship and are adjacent the spin chuck 140) and also causes exhaust gas (air) to flow over the lowered splash shield 150 (which covers the fluid collectors) to the chamber exhaust 170.

It will be understood that a first collection chamber is formed between the raised first fluid collector 210 and the lowered second fluid collector 220. Similarly, a second collection chamber is formed between the raised second fluid collector 220 and the lowered third fluid collector 230. In addition, the third collection chamber is formed between the raised third fluid collector 230 and the lowered fourth fluid collector 240.

Drainage of each of the first, second, and third collection chambers occurs in the following manner. A drain outlet can be incorporated into the trough section of each of the first, second and third fluid collectors 210, 220, 230. More specifically, one or more drain outlets can be formed in a bottom of the trough 214 of the first fluid collector 210, one or more drain outlets can be formed in bottom of the trough 224 of the second fluid collector 220, and one or more drain outlets can be formed in the bottom of the trough 234 of the third fluid collector 230. The drain outlets are in fluid communication with conduits or the like for routing the collected fluid away from each collection chamber to a location at which the fluid can be collected.

Figure 5A:
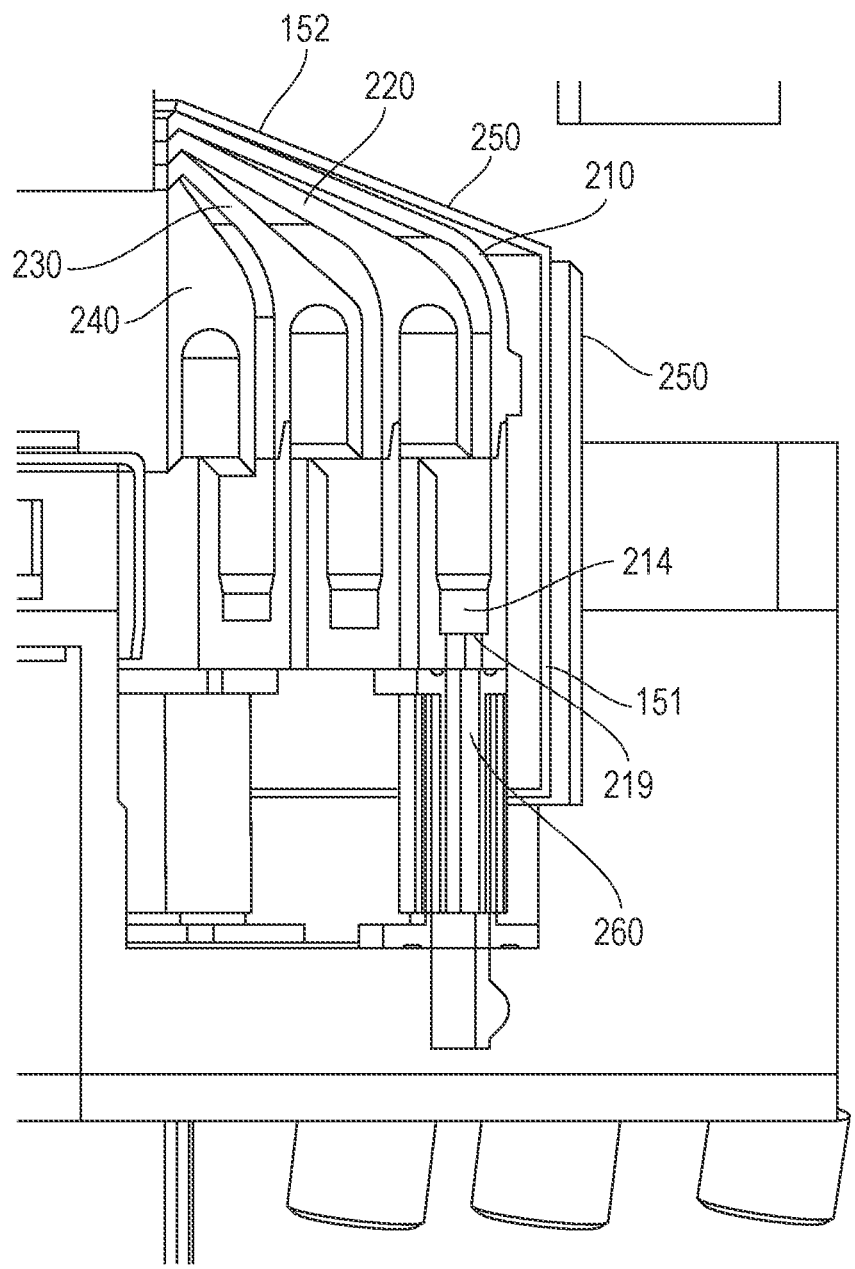
FIG. 5A is a localized cross-sectional view of stackable collection trays with a drainage outlet being shown.
Figure 5B:
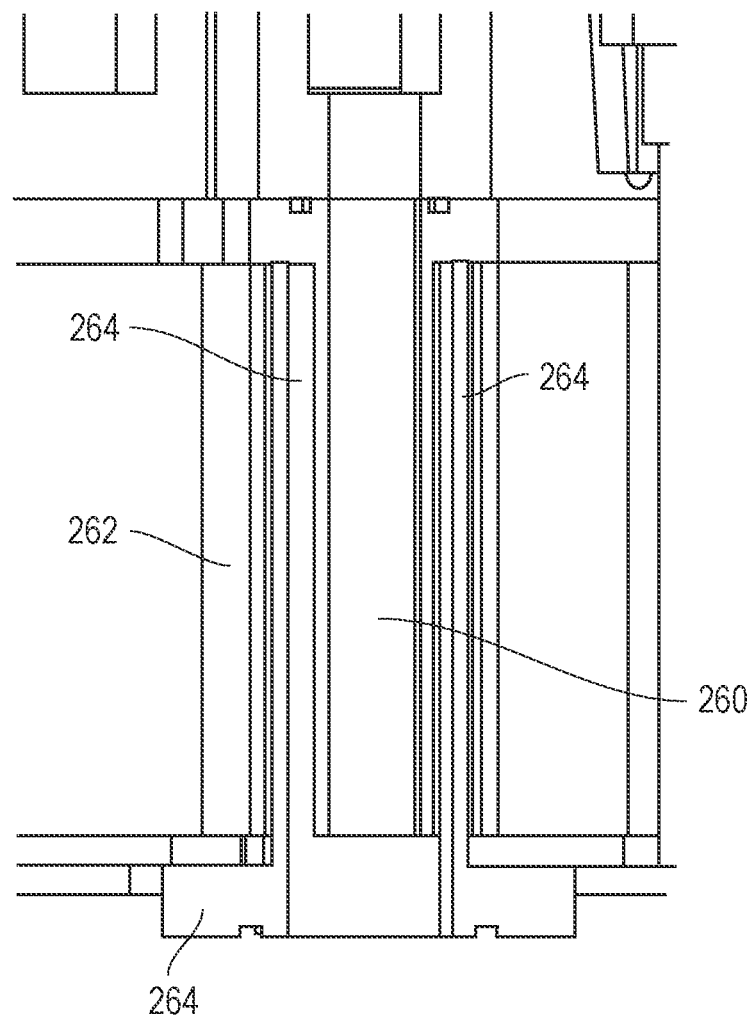
FIG. 5B is a close-up of the drainage outlet.

FIGS. 5A and 5B show an exemplary drainage system with respect to the first collection chamber in that an opening 219 is formed in the bottom of the trough 214 of the first fluid collector 210. A drainage conduit (e.g., a tube or hose) 260 is in fluid communication with the opening 219 and fluid collected within the trough 214 flows into the opening 219. The drainage conduit 260 can be vertically oriented that routes the collected fluid away from the trough 214 and can be fluidly coupled to a manifold or the like to route the fluid to a desired location.

It will be understood that the trough 214 can have two or more openings 219 and two or more drainage conduits 260 for draining the collected fluid. For example, the openings 219 and drainage conduits 260 can be located opposite one another (e.g., 180 degrees apart).

While, FIG. 5A shows only the trough 214 having drainage provisions, it will be understood that the other troughs 224, 234 also include the same drainage provisions as that shown with respect to trough 214.

FIG. 5B is a close-up of the drainage conduit 260 which can be formed of an outer tubular part 262 and an inner tubular part 264 that is received within the hollow interior of the outer tubular part 262. The outer tubular part 262 moves with the corresponding fluid collector (collection tray), while the inner tubular part 264 is stationary. This arrangement is thus generally a tube within a tube construction. The outer tubular part 262 is in sealed arrangement with the inner tubular part 264 and can slide along the stationary inner tubular part 264 as a result of vertical movement of the fluid collector (collection tray) (i.e., as during a raising and lowering of the fluid collector). As the outer tubular part 262 moves upward, the inner drainage space thus increases.

Figure 6A:
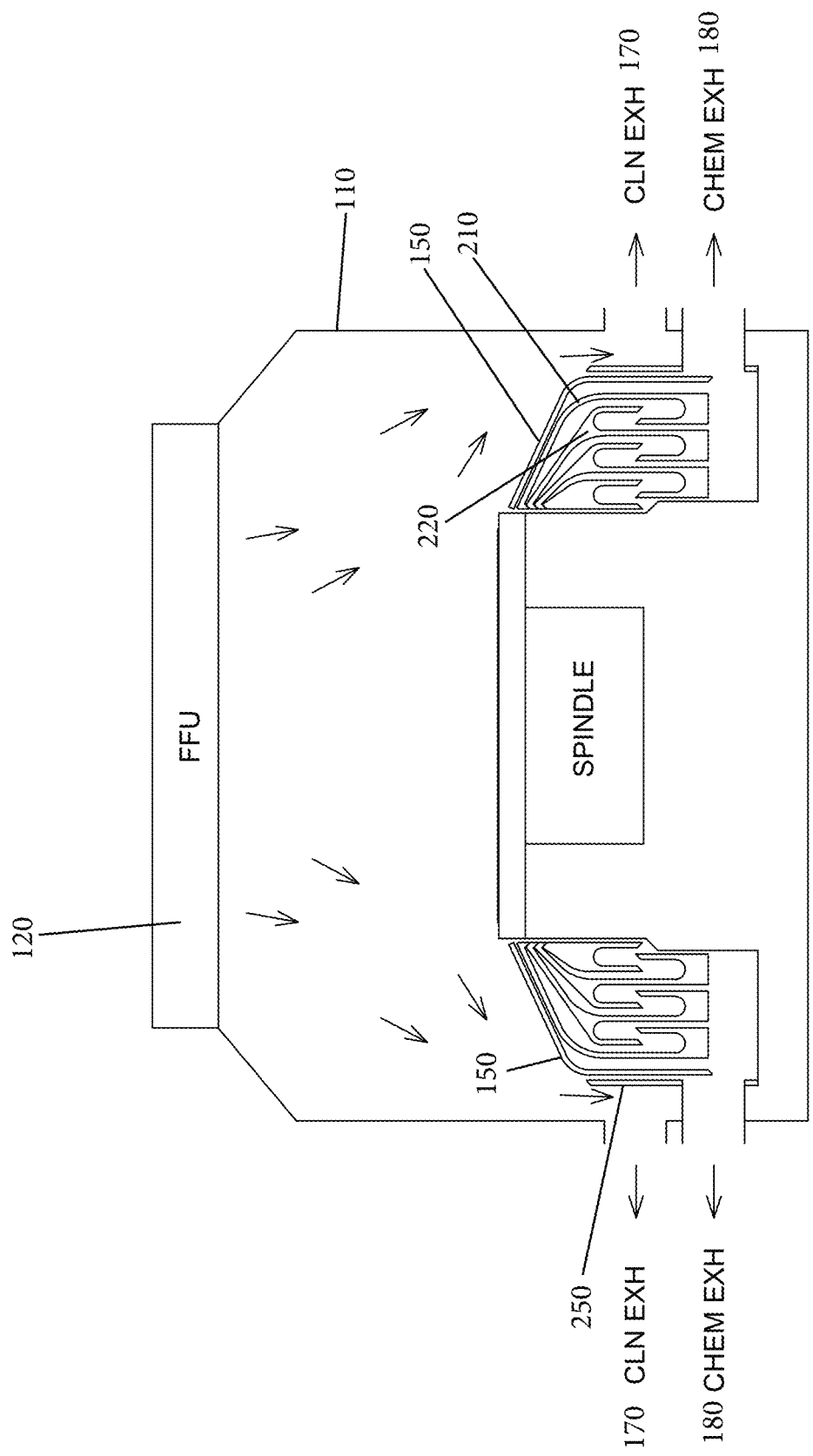
FIG. 6A is side cross-sectional view of an exemplary semiconductor wafer processing chamber shown in a first operating position with internal gas flow being shown with arrows.

As previously mentioned, the first, second, third collectors 210, 220, 230 and collection cover 240 also play a role in exhausting gas (air) from the interior of the housing 110. FIGS. 6A-6E depict various exhaust flow paths within the interior of the housing 110, with the flow paths being defined at least in part by the positions of the splash shield 150 and the fluid collectors 210, 220, 230 and collection cover 240. FIG. 6A shows an arrangement in which the splash shield 150 and all of the fluid collectors 210, 220, 230 and collection cover are in the lowered position. The exhaust gas flow is indicated by arrows and as can be seen, the exhaust gas flow flows along the top of the splash shield 150 (and the lowered dispensing arms (not shown)) and flows outside of the inner wall 250 to the chamber exhaust 170 where it is discharged from the housing 110. Since the splash shield 150 is lowered and all of the fluid collectors 210, 220, 230, 240 are nested with respect to one another, the exhaust gas does not flow into the fluid collectors 210, 220, 230 and collection cover 240.

Figure 6B:
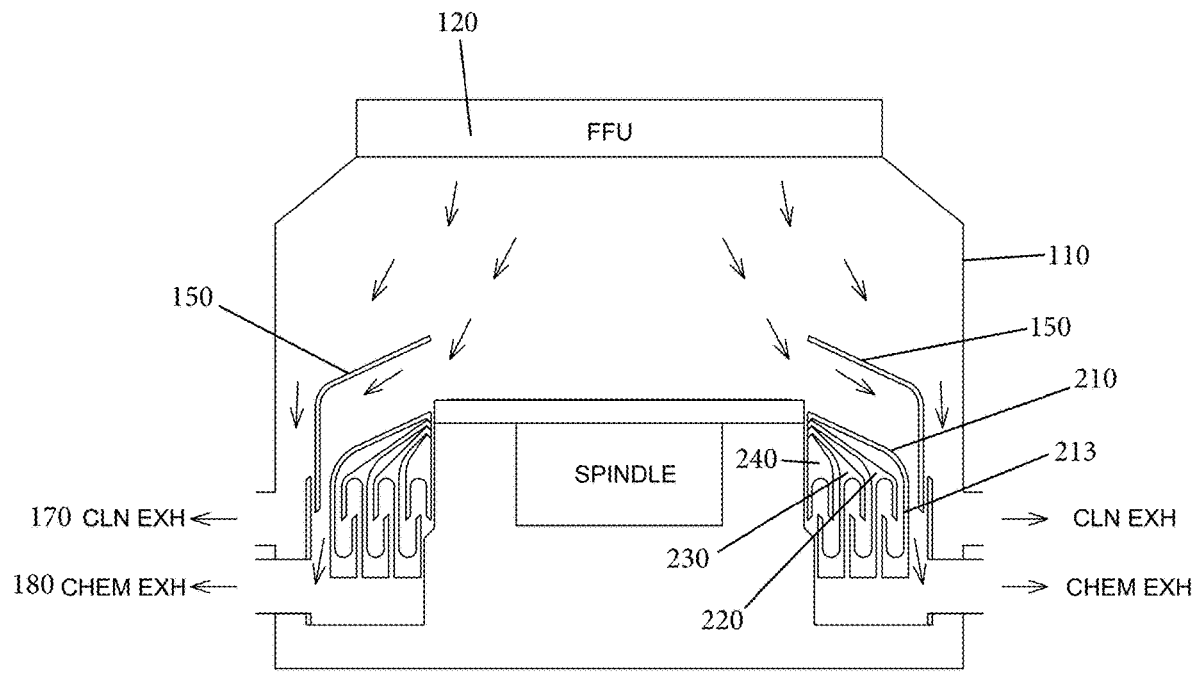
FIG. 6B is side cross-sectional view of an exemplary semiconductor wafer processing chamber shown in a second operating position with internal gas flow being shown with arrows.

FIG. 6B shows an arrangement in which the splash shield 150 is in the raised position and all of the fluid collectors 210, 220, 230 and collection cover 240 are in the lowered position. In this arrangement, a portion of the exhaust gas flows over the raised splash shield 150 to chamber exhaust 170, while another portion of the exhaust gas flows between the raised splash shield 150 and the lowered first fluid collector 210 and flows to the chemical exhaust 180. More specifically, the exhaust gas flows between the raised splash shield 150 and the outer wall 213 of the first fluid collector 210.

Figure 6C:
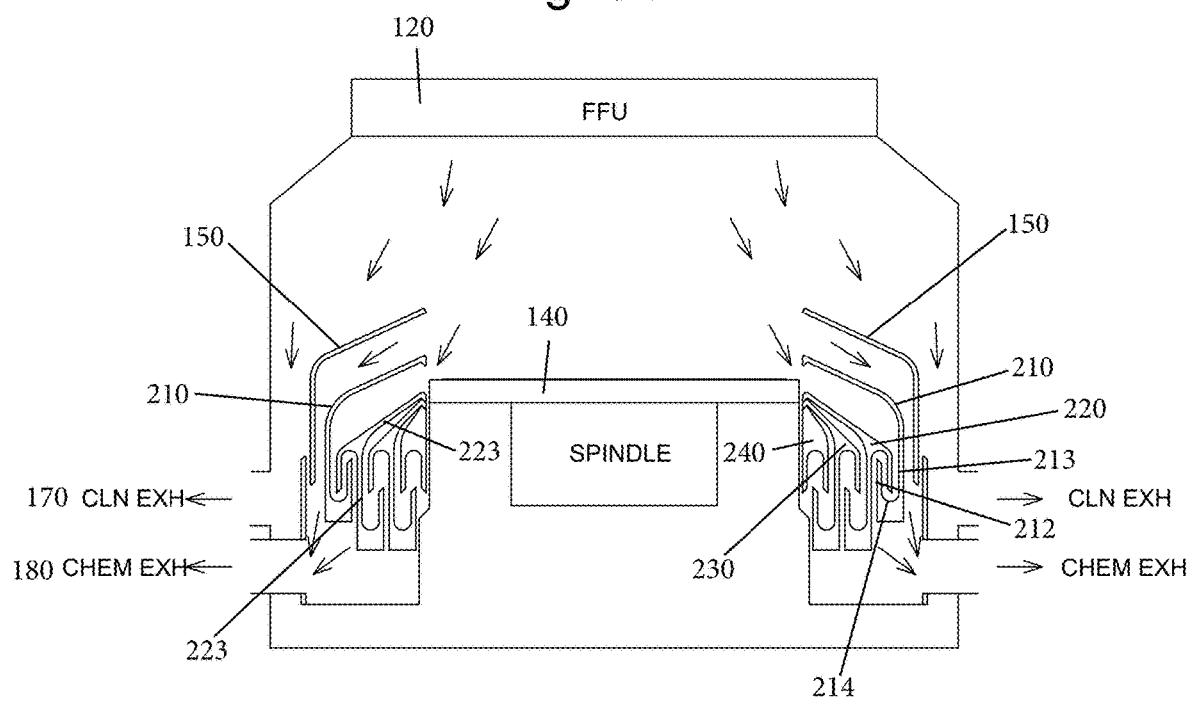
FIG. 6C is side cross-sectional view of an exemplary semiconductor wafer processing chamber shown in a third operating position with internal gas flow being shown with arrows.

FIG. 6C shows an arrangement in which the splash shield 150 is in the raised position, the first fluid collector 210 is in the raised position, and the second, third fluid collectors 220, 230 and collection cover 240 are in the lowered position. In this arrangement, a portion of the exhaust gas flows over the raised splash shield 150 to chamber exhaust 170, while another portion of the exhaust gas flows along two different paths to the chemical exhaust 180. One of these flow paths is defined between the raised splash shield 150 and the outer wall 213 of the raised first fluid collector 210, while the other path is defined between the raised first fluid collector 210 and the lowered second fluid collector 220 (i.e., the exhaust gas flows through the first collection chamber). The exhaust gas flows in a serpentine manner within the first collection chamber by entering between the outer wall 213 and the outer wall 223 and then flows into the trough 214 before flowing between the inner wall 212 and the outer wall 223 and then finally to the chemical exhaust 180.

Figure 6D:
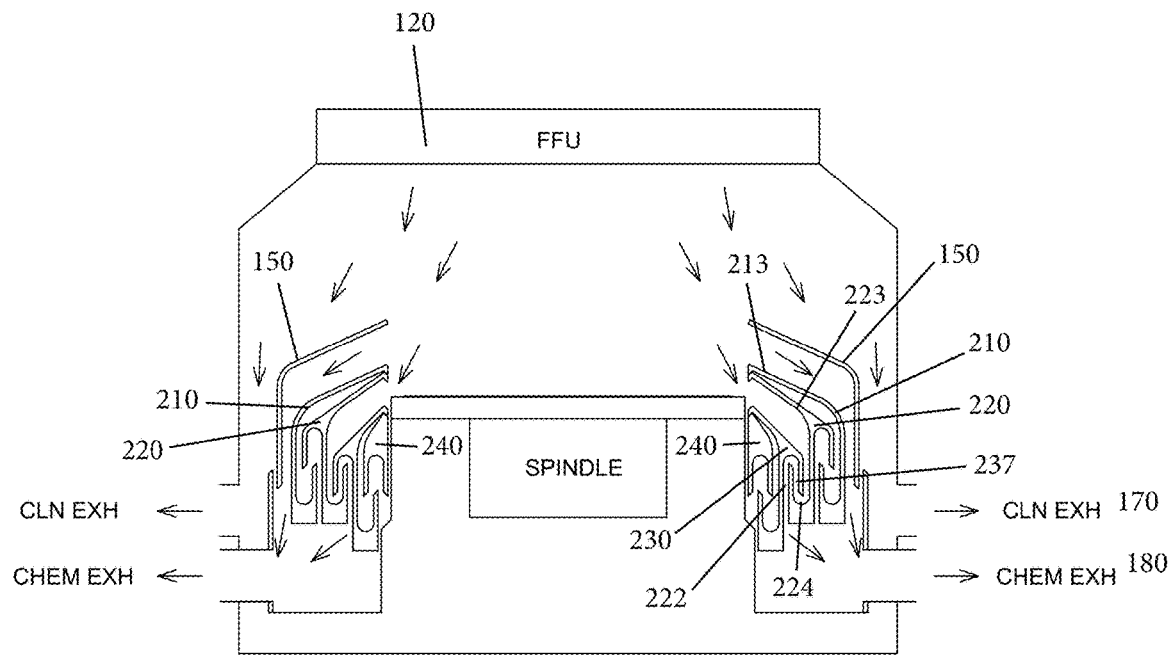
FIG. 6D is side cross-sectional view of an exemplary semiconductor wafer processing chamber shown in a fourth operating position with internal gas flow being shown with arrows.

FIG. 6D shows an arrangement in which the splash shield 150 is in the raised position, the first and second fluid collectors 210, 220 are in the raised position, and the third fluid collector 230 and collection cover 240 are in the lowered position. In this arrangement, a portion of the exhaust gas flows over the raised splash shield 150 to chamber exhaust 170, while another portion of the exhaust gas flows along two different paths to the chemical exhaust 180. One of these flow paths is defined between the raised splash shield 150 and the outer wall 213 of the raised first fluid collector 210, while the other path is defined between the raised second fluid collector 220 and the lowered third fluid collector 230 (i.e., the exhaust gas flows through the second collection chamber). The exhaust gas flows in a serpentine manner within the second collection chamber by entering between the outer wall 223 and the outer wall 233 and then flows into the trough 224 before flowing between the inner wall 222 and the outer wall 233 and then finally to the chemical exhaust 180.

Figure 6E:
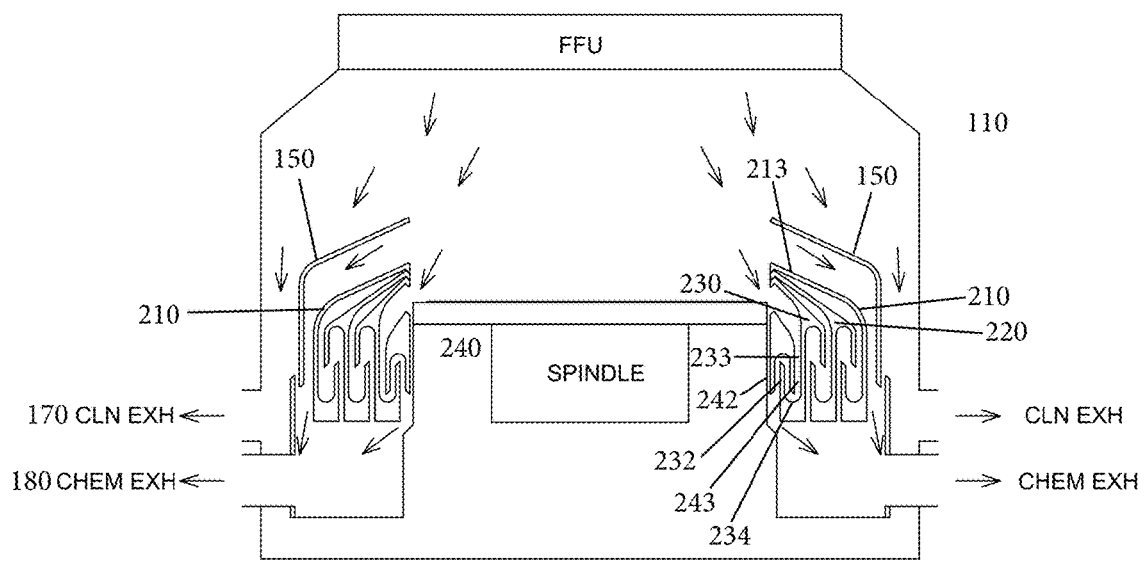
FIG. 6E is side cross-sectional view of an exemplary semiconductor wafer processing chamber shown in a fifth operating position with internal gas flow being shown with arrows.

FIG. 6E shows an arrangement in which the splash shield 150 is in the raised position, the first, second and third fluid collectors 210, 220, 230 are in the raised position, and the collection cover 240 is in the lowered position. In this arrangement, a portion of the exhaust gas flows over the raised splash shield 150 to chamber exhaust 170, while another portion of the exhaust gas flows along two different paths to the chemical exhaust 180. One of these flow paths is defined between the raised splash shield 150 and the outer wall 213 of the raised first fluid collector 210, while the other path is defined between the raised third fluid collector 230 and the lowered fourth fluid collector 240 (i.e., the exhaust gas flows through the third collection chamber). The exhaust gas flows in a serpentine manner within the third collection chamber by entering between the outer wall 233 and the outer finger 243 and then flows into the trough 234 before flowing between the inner wall 232 and the inner finger 242 and then finally to the chemical exhaust 180.

Figure 7A:
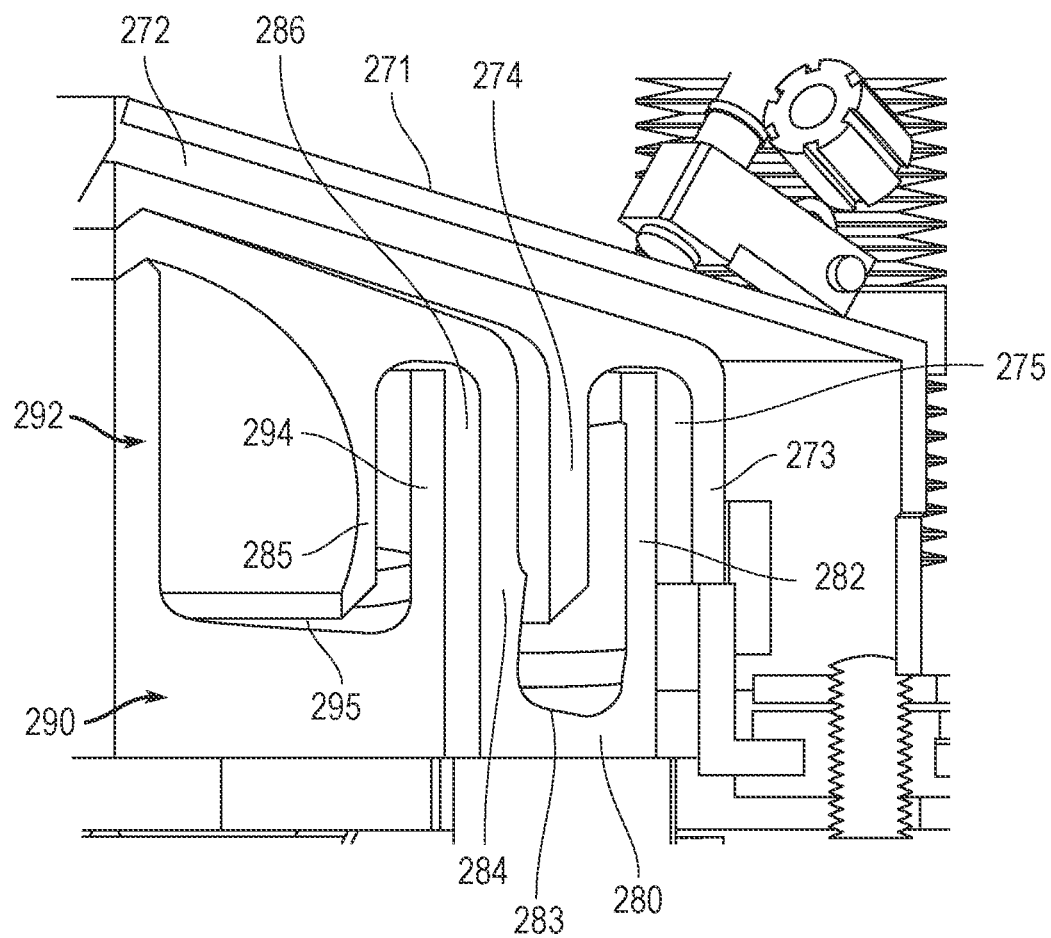
FIG. 7A is a cross-sectional view of an alternative collection tray arrangement.
Figure 7B:
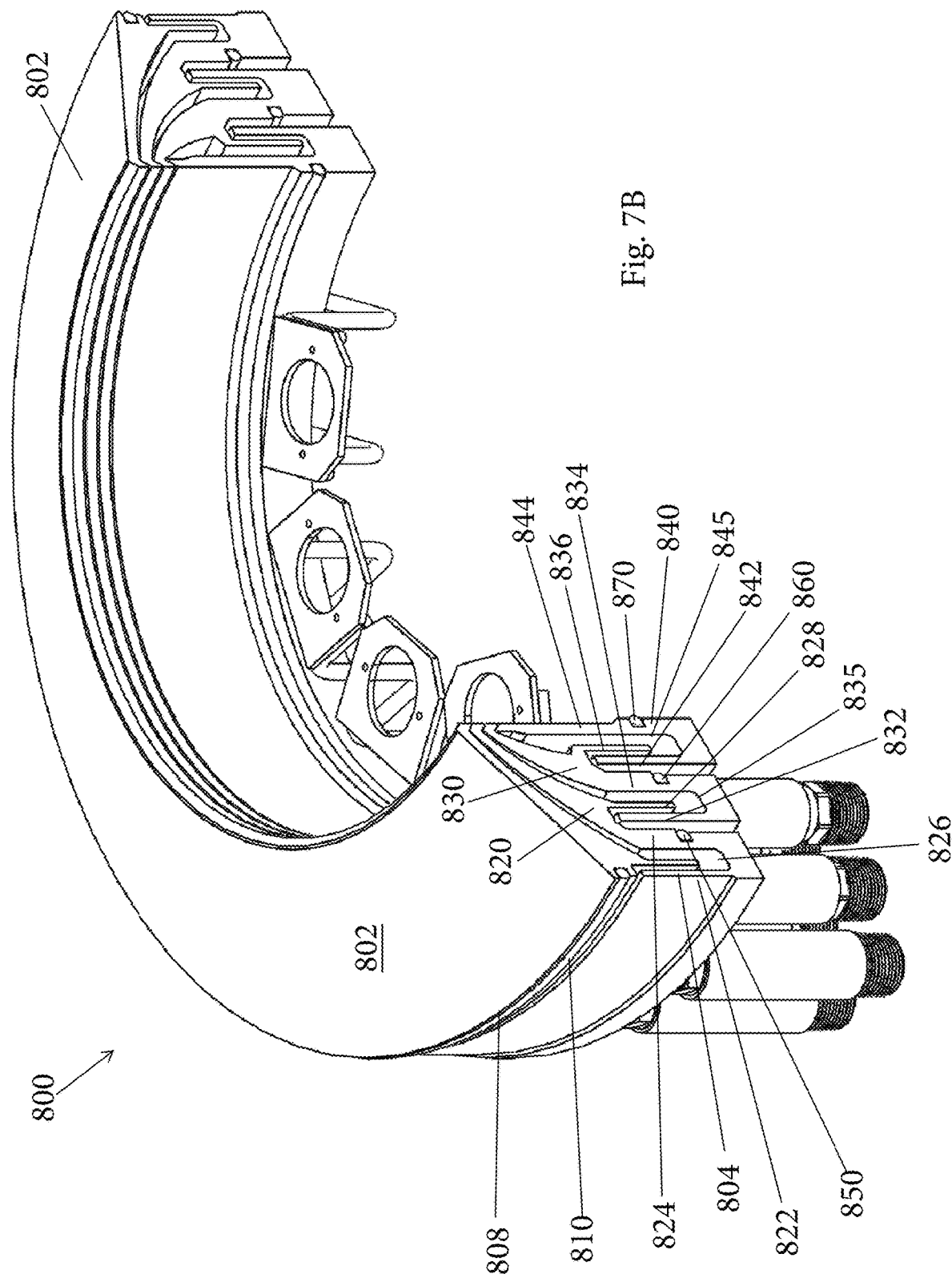
FIG. 7B is a top and side partial perspective view of yet another alternative tray arrangement showing a basket construction used to couple the actuators to the trays.

FIG. 7A illustrates a collection tray (cup) arrangement 270 according to an alternative embodiment. In particular, the collection tray arrangement 270 includes a movable splash shield 271 that can be moved between a fully raised position and a fully lowered position, as well as positions therebetween. As in the other embodiments, the splash shield 271 has a vertical outer wall and an inwardly angled inner wall. A movable collection tray (cup) cover 272 is provided and is defined by a first downwardly depending outer wall 273 and a depending inner wall 274 with a first space 275 formed between the outer wall 273 and the inner wall 274. A movable first collection tray (cup) 280 is also provided and includes an upwardly extending outer wall 282, an intermediate wall 284 with a first trough section 283 defined between the walls 282, 284 and a downwardly depending inner wall 285 that is spaced from the intermediate wall 284 with an open space 286 defined between the inner wall 285 and the intermediate wall 284. The first trough section 283 defines in part a first collection chamber. A movable second collection tray (cup) 290 is provided and is position closest to the chuck 140. The second collection tray 290 is defined by an upstanding inner wall 292 and an upstanding outer wall 294 with a second trough section 295 formed between the inner wall 292 and outer wall 294.

FIG. 7A shows when the shield 271, cover 272, first collection tray 280 and second collection tray 290 are in the lowered position. In this arrangement, the inner wall 282 is disposed in space 275, the inner wall 274 is disposed in the open space above the first trough section 283, the inner wall 294 is disposed in the space 286 and the inner wall 285 is disposed in the space above the second trough section 295. As with previous embodiments, a drain outlet can be in fluid communication with each of the first trough section 283 and the second trough section 295 to permit fluids collected therein to separately collected and then transported away from the collection trays. The inner walls 285 and 274 are provided such that when the cup is opened, fluid cannot exit over inner walls 294, 282 respectively, when opened.

To open up the first collection chamber 283, the shield 271 and collection tray cover 272 are in the raised positions and the first and second collection trays 280, 290 are in the lowered position. Fluid is collected within the first trough section 283 and exhaust gas can flow in a serpentine pattern in the space about the first trough section 283 and then subsequently flows to the chemical exhaust 180 (FIG. 1).

Similarly, to open up the second collection chamber 295, the shield 271, collection tray cover 272, and first collection tray 280 are in the raised positions and the second collection tray 290 is in the lowered position. Fluid is collected within the second trough section 295 and exhaust gas can flow in a serpentine pattern in the space about the second trough section 295 and then subsequently flows to the chemical exhaust 180 (FIG. 1).

The shield 271, collection tray cover 272, first collection tray 280 and the second collection tray 290 can be driven in a vertical manner using any number of the drives discussed herein, including but not limited to the use of stepper driven guide (rods) or pneumatic pistons, etc.

Figure 7D:
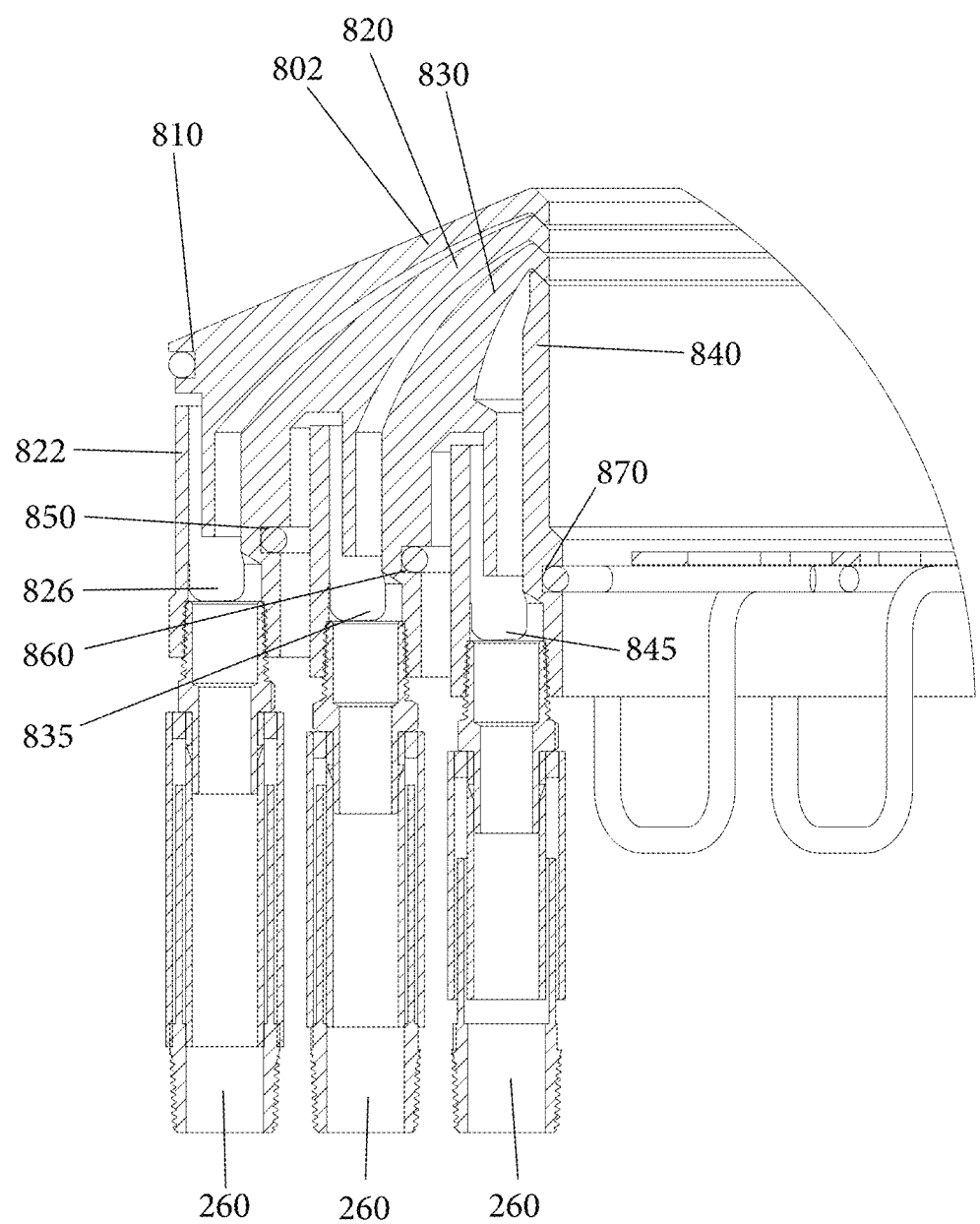
FIG. 7D is a partial cross-sectional view of the tray arrangement of FIG. 7B with the trays being shown in the first operating position.

FIGS. 7B-7E illustrates a collection tray (cup) arrangement 800 according to an alternative embodiment. In particular, the collection tray arrangement 800 includes a movable collection cover 802 that can be moved between a fully raised position and a fully lowered position, as well as positions therebetween. As in the other embodiments, the collection cover 802 has a vertical outer wall 804 and an inwardly angled inner wall 806. The collection cover 802 as an outer edge 808, along an outer surface, in which a groove 810 is formed. As best shown in FIG. 7D, outer edge 808 and the groove 810 is located above and radially outward relative to the vertical outer wall 804.

A movable first collection tray (cup) 820 is also provided and includes an upwardly extending outer wall 822, an intermediate wall 824 with a first trough section 826 defined between the walls 822, 824 and a downwardly depending inner wall 828 that is spaced from the intermediate wall 824 with an open space defined between the inner wall 828 and the intermediate wall 824. The first trough section 826 defines in part the first collection chamber. The outer wall 822 is located radially outside the outer wall 804.

A movable second collection tray (cup) 830 is located radially inward of the first collection tray 820. The movable second collection tray 830 includes an upwardly extending outer wall 832, an intermediate wall 834 with a second trough section 835 defined between the walls 832, 834 and a downwardly depending inner wall 836 that is spaced from the intermediate wall 834 with an open space defined between the inner wall 836 and the intermediate wall 834. The second trough section 835 defines in part the second collection chamber.

As shown, the inner wall 828 of the first collection cup 820 is disposed within the space of the second trough section 835.

A movable third collection tray (cup) 840 is provided and is located radially inward of the second collection tray 830. The movable third collection tray 840 includes an upwardly extending outer wall 842 and an upwardly extending inner wall 844 spaced from the outer wall 842 so as to define a third trough section 845. The third trough section 845 defines in part the third collection chamber.

As shown, the inner wall 836 of the second collection cup 830 is disposed within the third trough section 845. The inner walls 836 and 828 are provided such that when the cup is opened, fluid cannot exit over inner walls 832, 842, respectively, when opened.

As with the previous embodiments, each of the shield 802, first collection tray 820, the second collection tray 830, and third collection tray 840 is independently movable by being connected to an actuator as described herein and in Applicant's applications incorporated by reference. A mechanism is thus provided for coupling one collection tray to its corresponding actuator.

In addition, and similar to the previous embodiment, drainage conduit (e.g., a tube or hose) 260 is in fluid communication with an opening in each respective collection tray and fluid collected within the trough flows into the opening. The drainage conduit 260 can be vertically oriented that routes the collected fluid away from each respective trough and can be fluidly coupled to a manifold or the like to route the fluid to a desired location.

It will be understood that the trough can have two or more openings and two or more drainage conduits 260 for draining the collected fluid. For example, the openings and drainage conduits 260 can be located opposite one another (e.g., 180 degrees apart).

FIGS. 7B-7J depict one technique for coupling the collection trays to the actuators and more particularly, a mechanism having a basket construction is illustrated. The basket construction includes a first rail structure 900 that is circular in nature and includes a pair of first actuator platforms 902 that have holes 903 formed therein. The first actuator platforms 902 are connected to the first rail structure 900 includes inwardly extending arms 904 and upwardly extending arms 905 that position each first actuator platform 902 radially inward from the outer circular shaped rail. The pair of first actuator platforms 902 can be located opposite one another and the platforms 902 can be at least generally horizontally oriented. It will be appreciated that each of the basket's actuator platforms is coupled to a vertical actuator that may be electrically, pneumatically or otherwise driven and note the feature (works like a safety pin) on each that allows the assembly to be decoupled from it's respective cup. The feature is on the upper portion of the platform in FIG. 7J. These can be made from steel, Hastelloy or other suitable compatible material and may be formed welded or otherwise constructed. The clip feature would not be welded to the tubular portion of the basket to allow the two to be separated at that point.

The basket construction includes a second rail structure 910 that is circular in nature and includes a pair of second actuator platforms 912 that have holes 913 formed therein. The second actuator platforms 912 are connected to the second rail structure 920 includes inwardly extending arms 914 and upwardly extending arms 915 that position each first actuator platform 912 radially inward from the outer circular shaped rail. The pair of second actuator platforms 912 can be located opposite one another and the platforms 912 can be at least generally horizontally oriented.

The basket construction includes a third rail structure 920 that is circular in nature and includes a pair of third actuator platforms 922 that have holes 923 formed therein. The third actuator platforms 922 are connected to the third rail structure 920 includes inwardly extending arms 924 and upwardly extending arms 925 that position each first actuator platform 922 radially inward from the outer circular shaped rail. The pair of third actuator platforms 922 can be located opposite one another and the platforms 922 can be at least generally horizontally oriented.

The basket construction includes a fourth rail structure 930 that is circular in nature and includes a pair of fourth actuator platforms 932 that have holes 933 formed therein. The fourth actuator platforms 932 are connected to the fourth rail structure 900 that includes inwardly extending arms 934 that position each fourth actuator platform 932 radially inward from the outer circular shaped rail. The pair of fourth actuator platforms 932 can be located opposite one another and the platforms 932 can be at least generally horizontally oriented.

Each of the rail structures is mounted to one of the shield 802, first collection tray 820, second collection tray 830 and third collection tray 840. To couple one of the rails structures 900, 910, 920, 930 to one of the shield 802, first collection tray 820, second collection tray 830 and the third collection tray 840, the circular outer rail part of the rail structure is received within the groove 810, 850, 860, 870 of the corresponding shield 802, first collection tray 820, second collection tray 830 and the third collection tray 840. Thus, one rail structure is mounted to one of the shied 802, first collection tray 820, second collection tray 830 and the third collection tray 840 and the radially inner portion of the rail structure, namely, the platform 902, 912, 922, 932 is coupled to the actuator such that motion of the actuator is translated into movement of the rail structure and thus, movement of the shield or collection tray itself. Since there are two actuators coupled to each of the shield and each of the collection trays for having balanced, controlled up and down movement, there are two actuator platforms. As shown in FIG. 7I, the four pairs of platforms can be arranged in two sets of four platforms.

In this embodiment, a groove or channel 850 is formed along an inner surface of the intermediate wall 828 and is configured to receive the outer rail of one of the rail structures, thereby coupling the first collection tray 820 to corresponding actuators. Similarly, a groove or channel 860 is formed along an inner surface of the intermediate wall 834 and is configured to receive the outer rail of another of the rails structures, thereby coupling the second collection tray 830 to corresponding actuators. Finally, a groove or channel 870 is formed along an inner surface of the inner wall 844 and is configured to receive the outer rail of another of the rail structures, thereby coupling the third collection tray 840 to corresponding actuators.

It will be appreciated that the basket construction is constructed and configured to accommodate the collection trays in that the radially inward extending legs of the basket are constructed to accommodate the other collection trays that lie between the actuator platforms and the outer rail structure. In other words, the connector leg structure that connects the actuator platform to the outer arcuate shaped rail portion is sized and shaped to accommodate the collection trays and drains, etc. The open nature of the basket permits these objectives to be achieved.

Figure 7E:
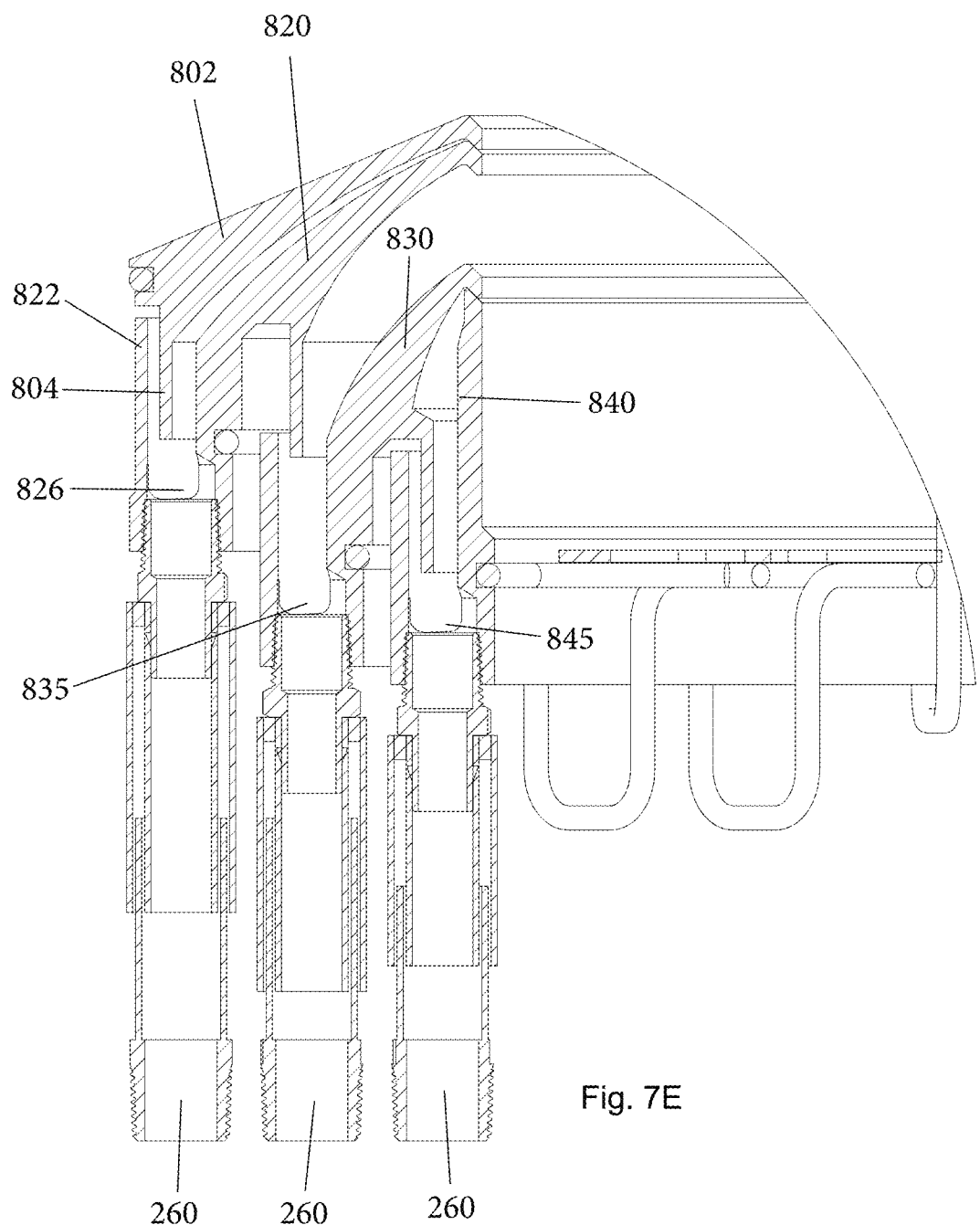
FIG. 7E is a partial cross-sectional view of the tray arrangement of FIG. 7B with the trays being shown in another operating position.
Figure 71:
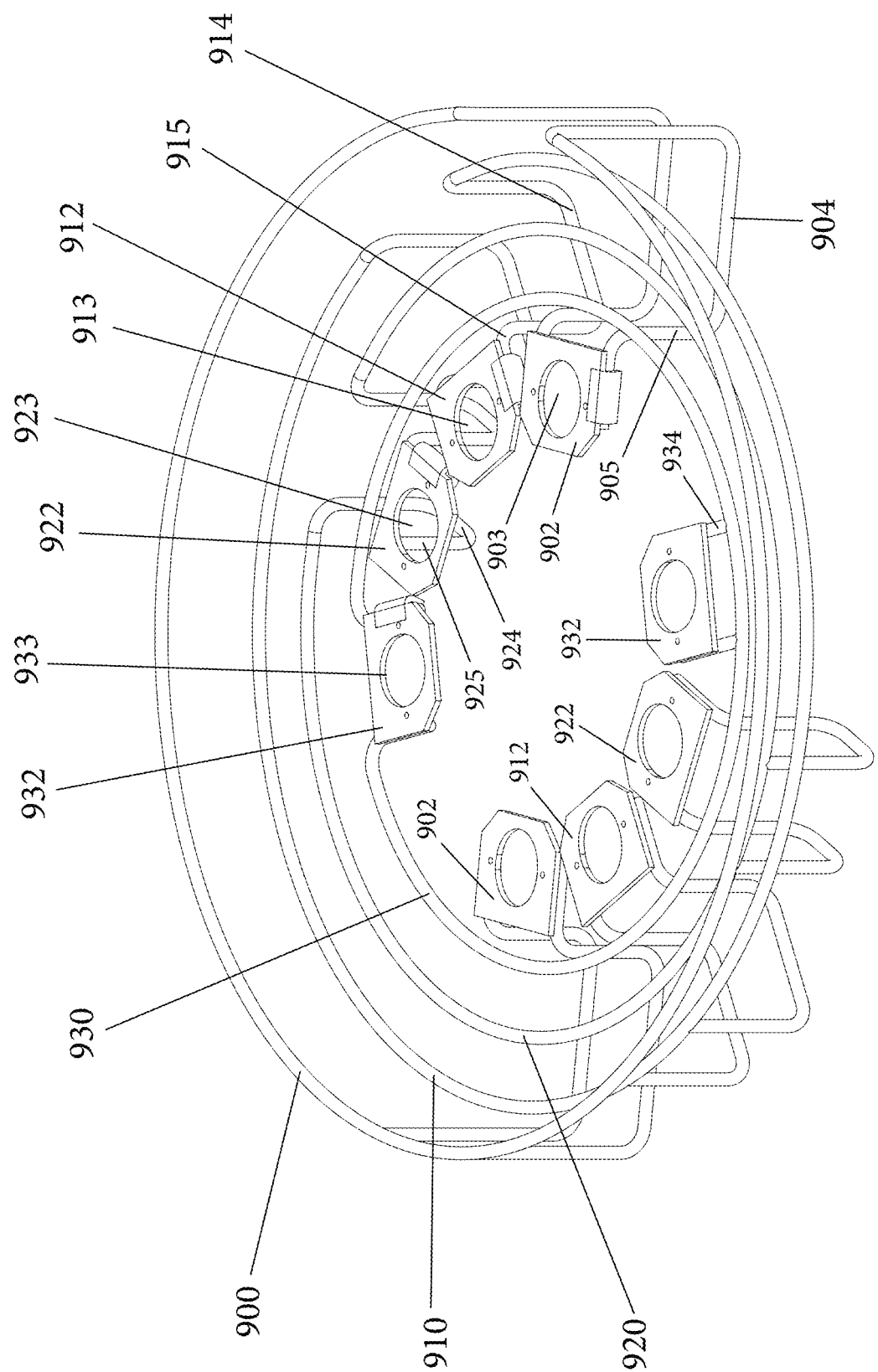
Figure 7J:
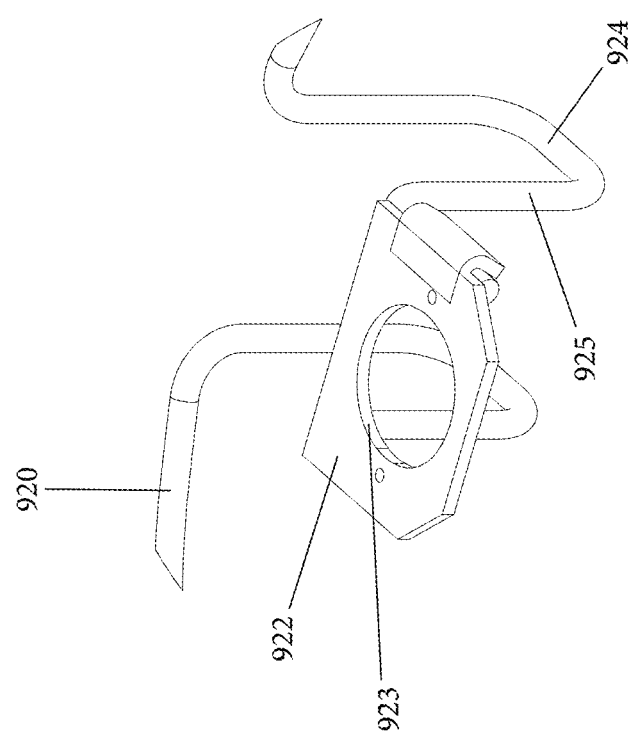
FIG. 7J is a close-up of one portion of the basket construction.

FIGS. 7C and 7D show the shield 802, first collection tray 820, second collection tray 830 and third collection 840 in the closed positions. FIG. 7E shows the shield 802 and first collection tray 820 in the up positions (due to operation of the actuators) and the second collection tray 830 and the third collection tray 840 in the down positions. This open up a collection chamber for collection of fluid as described herein within respect to other embodiments.

As with the previous embodiments, the arrangement 800 allows for generation of multiple independent fluid collection sites (chambers) to allow for collection and drainage of multiple liquids which can and typical do have different properties, such as different chemistries.

FIGS. 7F-7H illustrate a collection tray (cup) arrangement 1000 according to another alternative embodiment. The arrangement 1000 is similar to the arrangement 800. In particular, the collection tray arrangement 1000 includes a movable splash shield 1002 that can be moved between a fully raised position and a fully lowered position, as well as positions therebetween. As in the other embodiments, the splash shield 1002 has a vertical inner wall 1004 and an inwardly angled wall 1006. The splash shield 1002 as an outer edge 1008, along an outer surface, in which a groove 1010 is formed. As best shown in FIG. 7D, the outer edge 1008 and groove 1010 is located above and radially outward relative to the vertical inner wall 1004 so as to create a space between the outer edge portion 1008 and the inner wall 1004.

A movable first collection tray (cup) 1020 is also provided and includes an upwardly extending outer wall 1022, an intermediate wall 1024 with a first trough section 1026 defined between the walls 1022, 1024 and a downwardly depending inner wall 1028 that is spaced from the intermediate wall 1024 with an open space 1026 defined between the inner wall 1028 and the intermediate wall 1024. The first trough section 1026 defines in part the first collection chamber. The outer wall 1022 is located radially outside the inner wall 1004 and in particular is disposed within the space between the outer edge portion 1008 and the inner wall 1004. The inner wall 1004 is disposed above the first trough section 1026.

A movable second collection tray (cup) 1030 is located radially inward of the first collection tray 1020. The movable second collection tray 1030 includes an upwardly extending outer wall 1032, an intermediate wall 1034 with a second trough section 1035 defined between the walls 1032, 1034 and a downwardly depending inner wall 1036 that is spaced from the intermediate wall 1034 with an open space defined between the inner wall 1036 and the intermediate wall 1034. The second trough section 1035 defines in part the second collection chamber.

As shown, the inner wall 1028 of the first collection cup 1020 is disposed within the space of the second trough section 1035.

A movable third collection tray (cup) 1040 is provided and is located radially inward of the second collection tray 1030. The movable third collection tray 1040 includes an upwardly extending outer wall 1042 and an upwardly extending inner wall 1044 spaced from the outer wall 1042 so as to define a third trough section 1045. The third trough section 1045 defines in part the third collection chamber.

As shown, the inner wall 1036 of the second collection cup 1030 is disposed within the third trough section 1045.

As with the previous embodiments, each of the shield 1002, first collection tray 1020, the second collection tray 1030, and third collection tray 1040 is independently movable by being connected to an actuator as described herein and in Applicant's applications incorporated by reference. A mechanism is thus provided for coupling one collection tray to its corresponding actuator.

In this embodiment, a groove or channel 1050 is formed along an outer surface of the outer wall 1022 (below the groove 1010 formed in the shield 1002) and is configured to receive the outer rail of one of the rail structures, thereby coupling the first collection tray 1020 to corresponding actuators. Similarly, a groove or channel 1060 is formed along an outer surface of the outer wall 832 and is configured to receive the outer rail of another of the rails structures, thereby coupling the second collection tray 1030 to corresponding actuators. Finally, a groove or channel 1070 is formed along an inner surface of the inner wall 1044 and is configured to receive the outer rail of another of the rail structures, thereby coupling the third collection tray 1040 to corresponding actuators.

FIG. 7G shows the shield 1002 in the raised (up) position and the first collection tray 1020, second collection tray 1030 and third collection tray 1040 in the down positions to define a collection chamber. FIG. 7H shows the shield 1002 and the first collection tray 1020 in the raised (up) positions and the second collection tray 1030 and third collection tray 1040 in the down positions to define a collection chamber.

In addition, and similar to the previous embodiment, drainage conduit (e.g., a tube or hose) 260 is in fluid communication with an opening in each respective collection tray and fluid collected within the trough flows into the opening. The drainage conduit 260 can be vertically oriented that routes the collected fluid away from each respective trough and can be fluidly coupled to a manifold or the like to route the fluid to a desired location.

It will be understood that the trough can have two or more openings and two or more drainage conduits 260 for draining the collected fluid. For example, the openings and drainage conduits 260 can be located opposite one another (e.g., 180 degrees apart).

The basket construction described herein provides an effective means for not only attaching to the collection tray as by a rail in groove technique but also provides a portion (actuator platforms) that mates with the corresponding one or more actuators for allowing controlled up and down movement of the collections trays and splash shield.

Figure 7K:
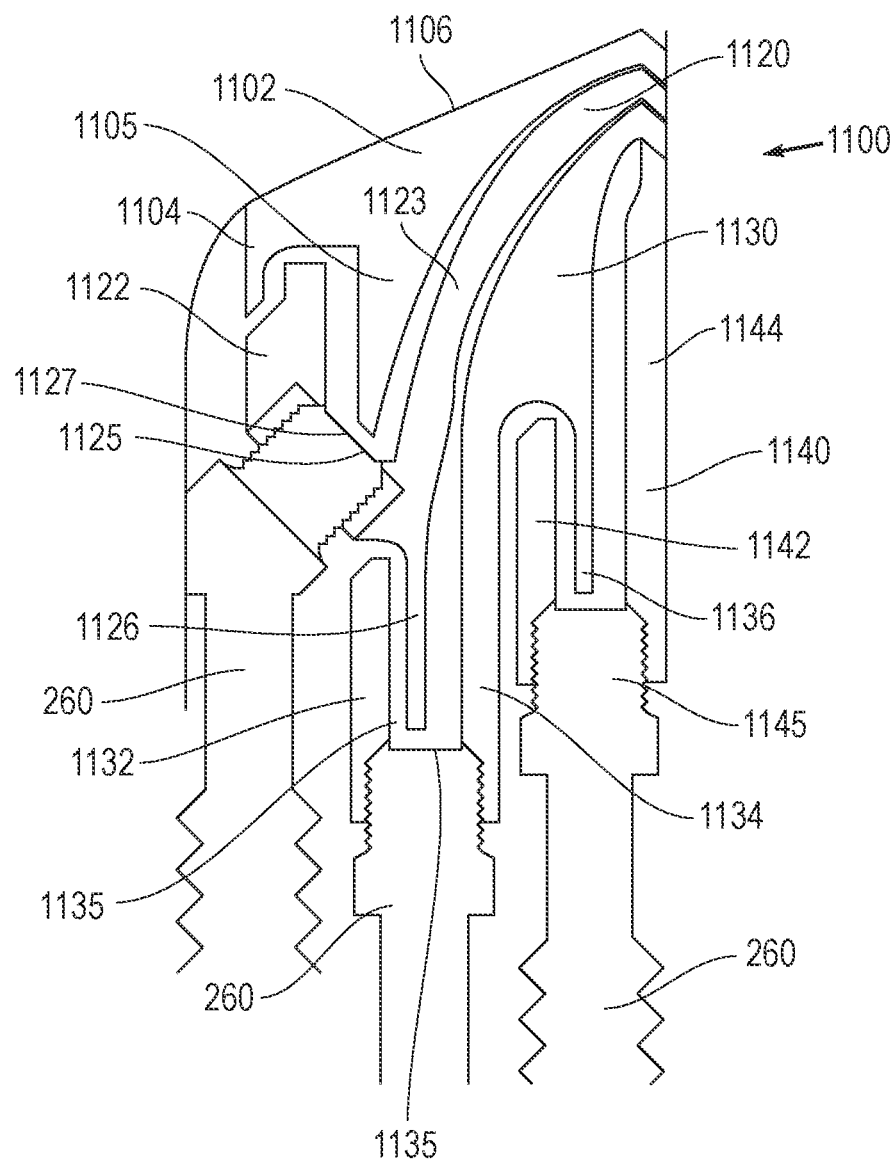
FIG. 7K is a partial cross-sectional view of yet another alternative tray arrangement.

FIG. 7K illustrates a collection tray (cup) arrangement 1100 according to another alternative embodiment and reflects a hybrid design in which at least two collection chambers (troughs) are stacked and at least one collection chamber is concentric to the others but not stacked as described below. The arrangement 1100 is similar to the other arrangements described herein. In particular, the collection tray arrangement 1100 includes a movable splash shield 1102 that can be moved between a fully raised position and a fully lowered position, as well as positions therebetween. As in the other embodiments, the splash shield 1102 has a vertical outer wall 1104 and an inwardly angled wall 1106. The splash shield 1102 also has a downwardly extending inner wall 1105 that is spaced from the outer wall 1104 so as to define a space therebetween.

A movable first collection tray (cup) 1120 is also provided and generally has a Y-shape. The tray 1120 includes an outer wall 1122 that is configured to be received within the space between the inner wall 1105 and outer wall 1104. The tray 1120 also has an inner wall 1123 that is spaced from the outer wall 1122. A first trough section 1125 is formed between the outer wall 1122 and the inner wall 1123. The inner wall 1123 has a bottom portion 1126 that extends below the first trough section 1125. Unlike some of the other embodiments, the first trough section 1125 does not have a rounded or substantially planar floor but instead is more V-shaped and includes an angled floor wall 1127. As shown, it is within this angled floor wall 1127 that an opening can be formed that leads to drain 260. This opening is thus set at an angle.

A movable second collection tray (cup) 1130 is located radially inward of the first collection tray 1120. The movable second collection tray 1130 includes a first upwardly extending outer wall 1132 and an intermediate wall 1134 with a second trough section 1135 defined between the walls 1132, 1134. The tray 1130 includes a downwardly depending inner wall 1136 that is spaced from the intermediate wall 1134 with an open space defined between the inner wall 1136 and the intermediate wall 1134. The second trough section 1135 defines in part the second collection chamber.

As shown, the bottom portion 1126 of the first collection cup 1120 is disposed within the space of the second trough section 1135.

A mobile third collection tray (cup) 1140 is provided and is located radially inward of the second collection tray 1130. The movable third collection tray 1140 includes an upwardly extending outer wall 1142 and an upwardly extending inner wall 1144 spaced from the outer wall 1142 so as to define a third trough section 1145. The third trough section 1145 defines in part the third collection chamber.

As shown, the inner wall 1136 of the second collection cup 1130 is disposed within the third trough section 1145. Unlike the angled trough section 1125 of the first collection tray 1120, the troughs 1135, 1145 are more similar to the troughs in previous embodiments in that they are not set at an angle. Drains 260 are in communication with troughs 1135, 1145.

As with previous embodiments, the surfaces of the respective cups and the collection cover are designed to prevent leakage when the respective cups are open and collecting fluid from the spinning wafer. In particular, inner wall 1105 and the outer wall 1122 are oriented such that when the cover 1102 is raised and fluid travels into first trough 1125, the downwardly sloped nature of the inner wall 1105 and its position relative to outer wall 1122 effectively prevents leakage from this collection trough (cup). Similarly, the same relationship exists between the inner wall 1126 and the outer wall 1132 and also between the inner wall 1136 and the outer wall 1142. As mentioned above, the arrangement 1100 is of a hybrid design in that the first collection tray 1120 and the second collection tray 1130 are stacked (nested with one another) as shown by the fact that the first collection tray 1120 is at a different height relative to the second collection tray 1130 and the first trough (first collection chamber) 1125 is located above the second trough (second collection chamber), thereby forming a stacked collection tray arrangement. In contrast, the third collection tray 1140 is disposed concentrically relative to the second collection tray 1130 and the first collection tray 1120 in a non-stacked manner such that the third trough (third collection chamber) 1145 is not stacked relative to the other two collection chambers as evidenced by it not being located below the second collection chamber 1135 but rather is concentric thereto and radially off-set therefrom as shown in the closed position of the collection chambers (see FIG. 7K).

Now referring to FIGS. 7L to 7O in which a collection tray (cup) arrangement 1200 according to another alternative embodiment and reflects a hybrid design in which at least two collection chambers (troughs) are stacked and at least one collection chamber is concentric to the others but not stacked as described below. As with previous embodiments, the surfaces of the respective cups and the collection cover are designed to prevent leakage when the respective cups are open and collecting fluid from the spinning wafer.

Figure 7L:
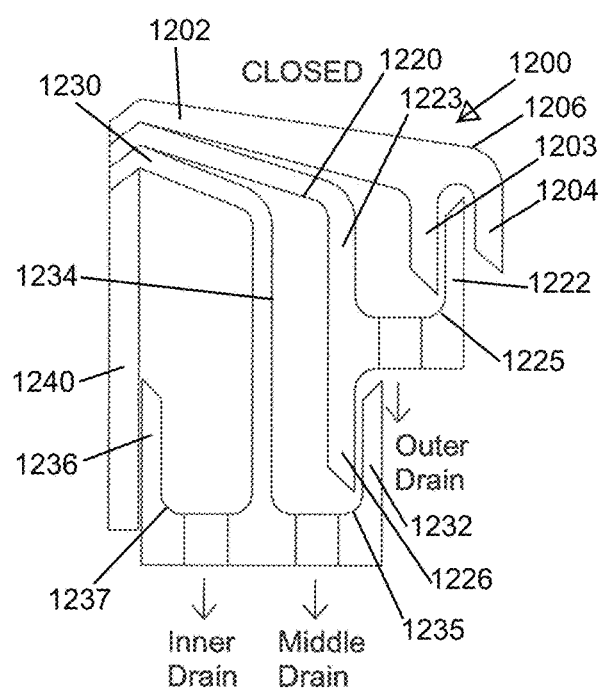
FIGS. 7L to 7O are partial cross-sectional views of another alternative tray arrangement being shown in different positions.
Figure 7M:
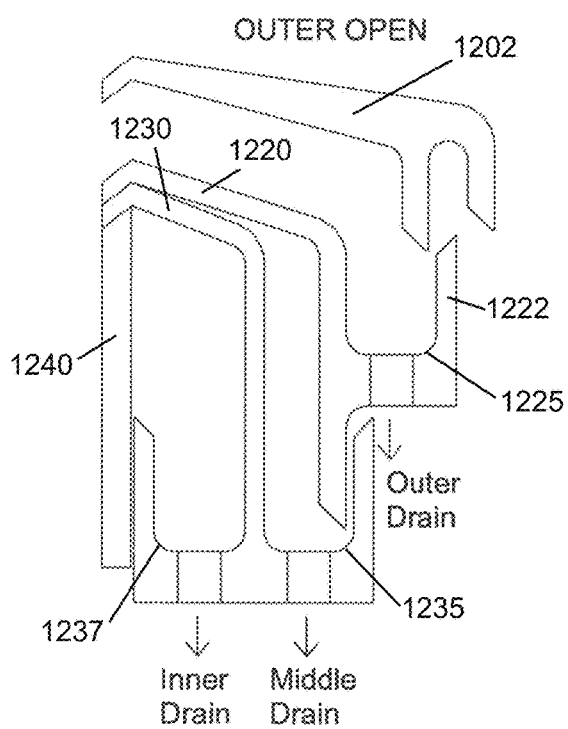
Figure 7N:
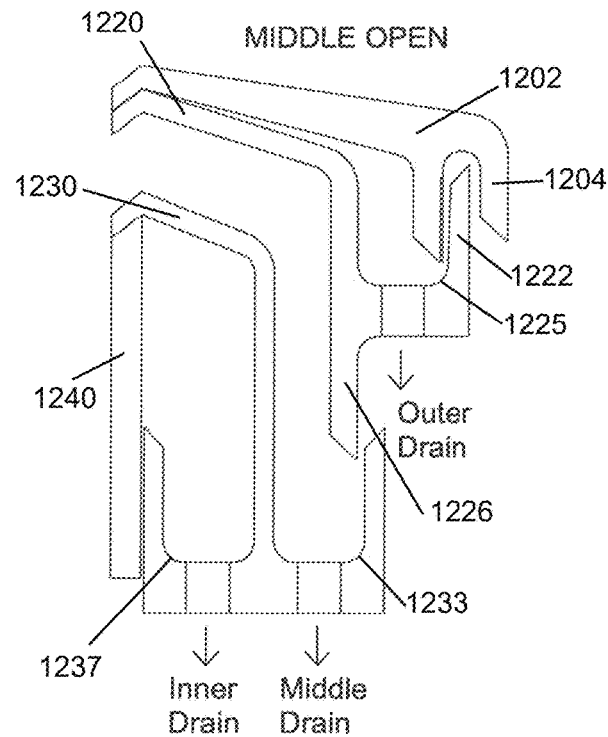
Figure 7O:
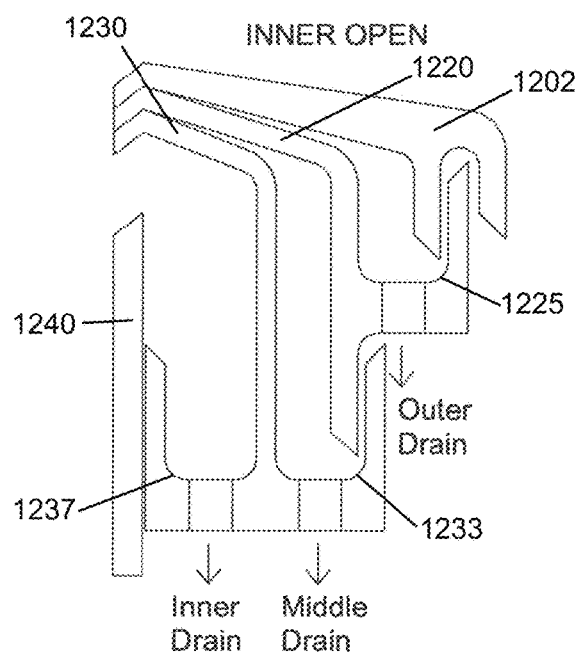

As described below, the collection tray arrangement 1200 has three distinct collection chambers (fluid collection troughs), FIG. 7L illustrating a closed position; FIG. 7M illustrating a first collection chamber open, while the second and third collection chambers are closed; FIG. 7N illustrates the second collection chamber open, while the first and third collection chambers are closed; and FIG. 7O illustrates the third collection chamber open, while the first and second collection chambers are closed.

The arrangement 1200 is similar to the arrangement 1100 described herein. In particular, the collection tray arrangement 1200 includes a movable collection cover 1202 that can be moved between a fully raised position and a fully lowered position, as well as positions therebetween. As in the other embodiments, the collection cover 1202 has a vertical outer wall 1204 and an inwardly angled wall 1206. The collection cover 1202 also has a downwardly extending inner wall 1205 that is spaced from the outer wall 1204 so as to define a space therebetween.

A movable first collection tray (cup) 1220 is also provided and generally has a Y-shape. The tray 1220 includes an outer wall 1222 that is configured to be received within the space between the inner wall 1205 and outer wall 1204. The tray 1220 also has an inner wall 1223 that is spaced from the outer wall 1222. A first trough section 1225 is formed between the outer wall 1222 and the inner wall 1223. The inner wall 1223 has a bottom portion 1226 that extends below the first trough section 1225. As with the other embodiments, the first trough section 1125 has at least one opening that leads to a drain.

A movable multi collection chamber tray (cup) 1230 is located radially inward of the first collection tray 1220. The tray 1230 has a first upwardly extending outer wall 1232 and an intermediate wall 1234 with a second trough section 1235 defined between the walls 1232, 1234. The tray 1230 includes an upwardly extending inner wall 1236 that is spaced from the intermediate wall 1234 and defines a third trough section 1237. The two-trough section (two collection chambers) are thus defined by the same tray 1230 unlike previous embodiments in which one collection tray included only one collection chamber (trough). The second and third trough sections 1235, 1237 are thus oriented in a side-by-side manner. As with the other embodiments, each collection chamber includes at least one drain opening that leads to a drain.

An inner ring 1240 is located radially inward of the tray 1230 and represents an annular shaped structure that is fixed and is configured to close off the third trough 1237 as described below.

Drains, such as drains 260, are in communication with troughs 1225, 1235, 1237.

As mentioned above, the arrangement 1200 is of a hybrid design in that the first collection tray 1220 and the tray 1230 are stacked (nested with one another) as shown by the fact that the first collection tray 1220 is at a different height relative to the collection tray 1230 and the first trough (first collection chamber) 1225 is located above the second trough (second collection chamber) 1235, thereby forming a stacked collection tray arrangement. At the same time, the third trough 1237 is concentrically oriented relative to the second through 1235 an in fact can be planar thereto. Troughs 1235, 1237 are thus not stacked relative to one another but rather are concentric and radially off relative to one another.

FIG. 7L depicts the collection cover 1202, first collection tray 1220 and multi chamber collection tray 1230 and ring 1240 in closed position, whereby none of the collection chambers (troughs 1225, 1235, 1237) are open. FIG. 7M depicts the collection cover 1202 raised relative to the first collection tray 1220, multi chamber collection tray 1230 and ring 1240, thereby opening up the first collection chamber (first trough 1225), with the other collection chambers being closed. Fluid is collected in the first trough 1225 and is drained therefrom. It will be seen that the outer wall 1232 does not interfere with the drain of the first trough 1225. FIG. 7N depicts the collection cover 1202 and first collection tray 1220 raised relative to the multi chamber collection tray 1230 and the ring 1240, thereby opening up the second collection chamber (second trough 1235), with the other collection chambers being closed. Fluid is collected in the second trough 1235 and is drained therefrom. FIG. 7O depicts the collection cover 1202, first collection tray 1220, and the multi chamber collection tray 1230 raised relative to the ring 1240, thereby opening up the third collection chamber (third trough 1237), with the other collection chambers being closed. Fluid is collected in the third trough 1237 and is drained therefrom.

Figure 8:
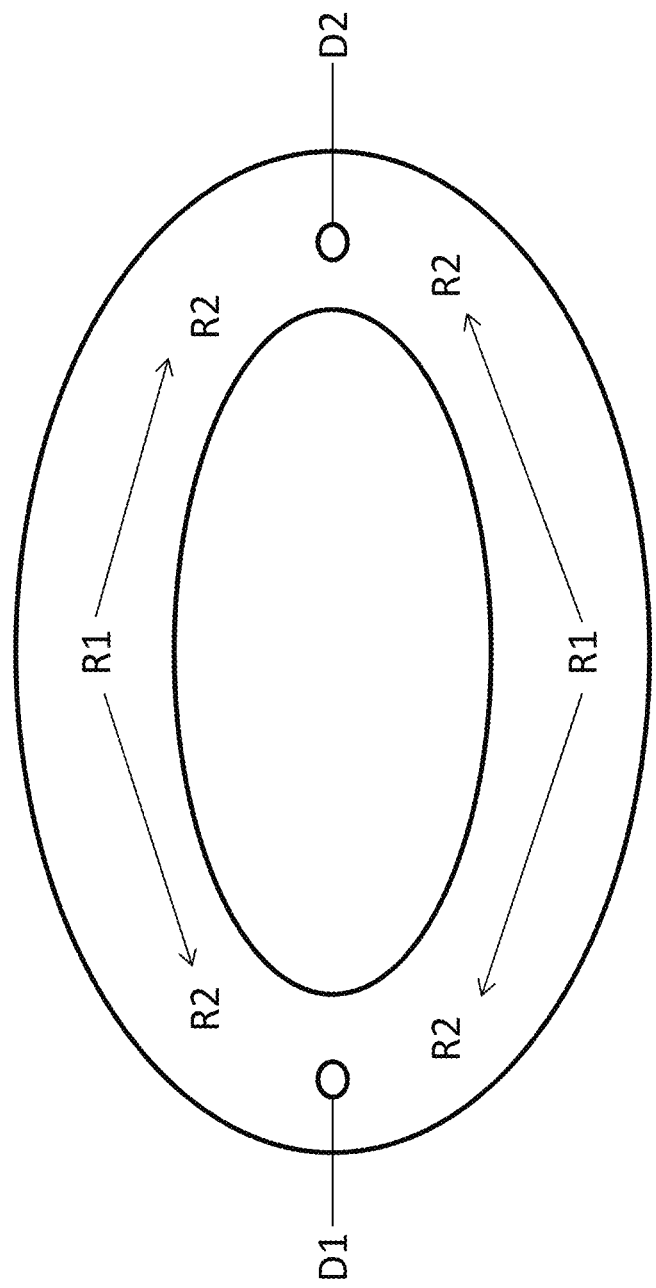
FIG. 8 is a top plan view of an exemplary collection tray showing a changing radius of curvature associated with a trough of a collection tray.

Now referring to FIGS. 4A, 4B and 8, in which another aspect of the present invention is illustrated. FIG. 8 shows a general schematic (top view) of the collection tray (e.g. tray 210). The collection tray includes first and second drains D1, D2 that are spaced apart from one another (e.g., D1, D2 being 180 degrees apart). As mentioned above, the drains D1, D2 are in fluid communication with the trough formed in the collection tray to allow drainage of the collected fluid. As mentioned, the collection tray has an annular shape and there is a first annular region between the two drains D1, D2 and there is an opposite second annular region between the two drains D1, D2. Each of the first and second annular regions is constructed such it has a variable radius of curvature and in particular, an angle between the inner wall portion (A) and the outer wall portion (B) varies along the annular region in a direction toward one of the drains D1, D2. For example, a maximum radius (R1) can be located between the drains D1, D2 (e.g., equidistant from the drains D1, D2) and a reduced radius (R2) is located between the area of maximum radius (R1) and one drain D1, D2. By providing areas of reduced radius (R2) adjacent each drain D1, D2, fluid will natural flow from the area of maximum radius (R1) to the drains D1, D2 (due to the change in the slope of the collection tray—which funnels the fluid to the drains D1, D2). This construction thus ensures fluid flow within the trough of the collection chamber to the drains D1, D2. However, one will appreciate that a changing radius is not required in that the cross section can remain the same and only a change in elevation to drive liquid to the drains is needed. Also, this can be accomplished with a single drain and a higher elevation of the opposing side of the cup trough to facilitate fluid driven by gravity to the drain. As an example, if the radius of the trough/base of the collection cup in FIG. 1C goes from large to small, then it will affect an elevation change. In contrast if the radius of the trough/base of the collection cup in FIG. 7L-M goes from large to small then it will not affect an elevation change because the floor elevation does not change in which case the floor would have to be machined from thicker to thinner at the drain so the liquid is directed from an opposing side of the cup to the drain.

It will be understood that only a single drain D1 can be used in which the area opposite the drain D1 are elevated relative to the areas close to the drain D1 to cause the collected fluid to naturally flow toward the drain. Other techniques, such as the incorporation of reduced radii sections as described above.

In the various constructions, an elevation change within the cup is what drives the fluid to flow toward and into the drain (e.g. gravitational flow downhill into the drain).

It will be understood, as mentioned herein, that the construction shown in FIG. 8 can be implemented with any of the collection tray arrangements disclosed herein.

Figure 9A:
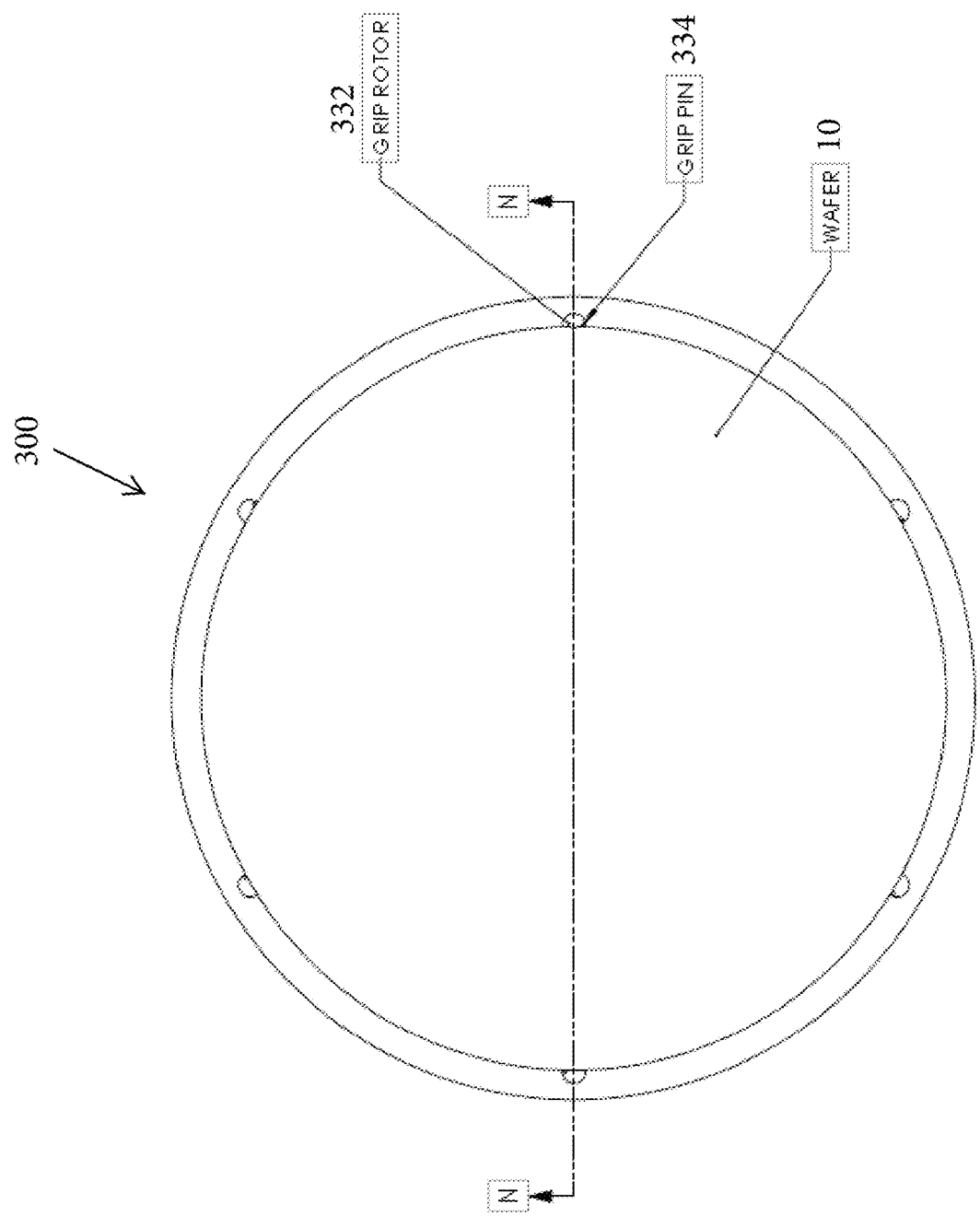
FIG. 9A is a top plan view of a configurable spin chuck in a first configuration.
Figure 9B:
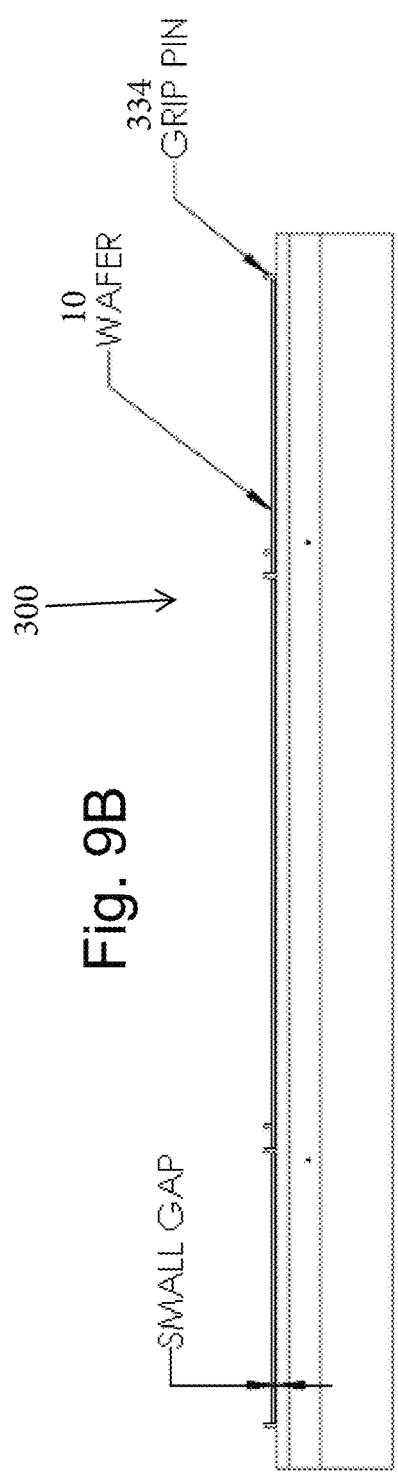
FIG. 9B is a side elevation view of the configurable spin chuck in the first configuration.
Figure 9C:
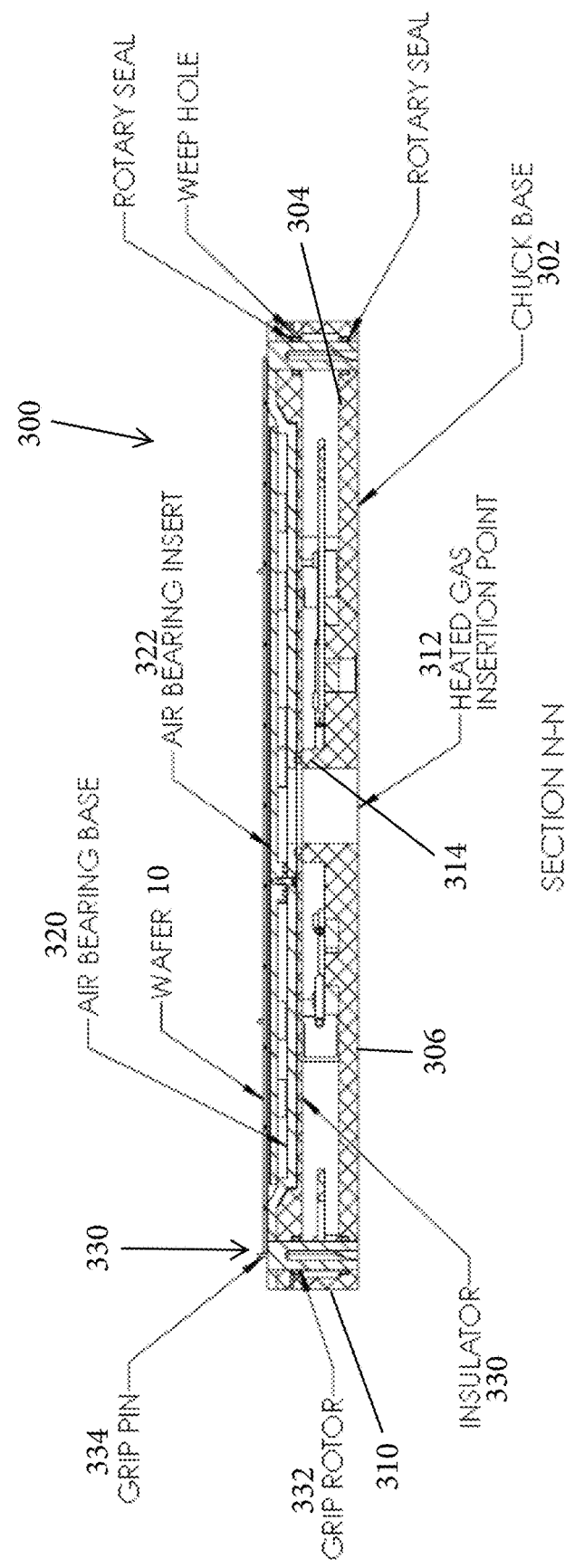
FIG. 9C is a cross-sectional view of the configurable spin chuck in a first configuration.

FIGS. 9A-9C illustrate a configurable spin chuck 300 that is shown in a first configuration which is a high temperature air bearing configuration (non-contact configuration). In this configuration, the spin chuck 300 is configured to hold a wafer 10 without contacting the backside of the wafer 10. Additionally, hot gas can be used for heating of the wafer 10 up to a predetermined temperature, such as about 200° C.

The spin chuck 300 includes a chuck base 302 that typically has a circular shape. The chuck base 302 has an upper surface 304 and an opposing rear surface 306. The chuck base 302 has a raised peripheral wall 310 that extends about a recessed center portion. The raised peripheral wall 310 can thus have an annular shape. The chuck base 302 also includes an opening 312 which can be located in the center of the chuck base 302. The opening 312 comprises a fluid insertion point that allows for one or more fluids to be injected into the chuck base 302 along the rear surface 306, whereby the fluid flows toward and to the upper surface 304. As described herein, in this first configuration, the fluid is in the form of a heated gas, such as heated nitrogen gas.

The recessed center portion of the chuck base 302 includes one or more upstanding supports 314 to support additional components contained within the chuck base 302. More specifically, due to the spin chuck 300 being reconfigurable, in this first configuration, an air bearing is inserted into the recessed center portion. The air bearing is formed of an air bearing base 320 and an air bearing insert 322. The air bearing base 320 can be in the form of a disk-shaped structure that includes channeling and opening(s) to permit the heated gas to flow upward from the opening 312. The air bearing base 320 is supported by the upstanding supports 314 and/or the raised peripheral wall 310. The air bearing insert 322 is disposed above the air bearing base 320 and is formed of a material (e.g., sintered material) that permits the blown gas (e.g., the nitrogen gas) to flow through the air bearing and then flow radially outward so as to cause the wafer 10 to float a small distance above the chuck 300 (i.e., above the air bearing insert 322).

The spin chuck 300 includes a wafer grip mechanism 330 that controllably grips the wafer 10. Any number of different grip mechanisms 330 can be used including the ones disclosed in detail below. The grip mechanism 330 is configured to grip and hold the wafer 10 about its outer peripheral edge. As described below, the grip mechanism 300 can include a movable grip rotor 332 that has an upstanding grip pin 334 protruding from a top surface thereof. The grip pins 334 are positioned adjacent and in contact with a peripheral edge of the wafer 10 to hold the wafer 10 in place.

As mentioned, by blowing hot gas through the air bearing, the wafer 10 is made to float a small distance above the top surface of the chuck (See, FIG. 9C). Then the wafer grip mechanism 300 is closed to hold the wafer 10 in place. By heating the gas before injection into the chuck 300, the air bearing base 320 and insert 322 are heated up, thereby transferring heat to the wafer 10 to achieve uniform heat distribution on the wafer 10. The use of an insulator 330 underneath the air bearing base 320 prevents heat from escaping into the rest of the chuck mechanism.

Figure 10A:
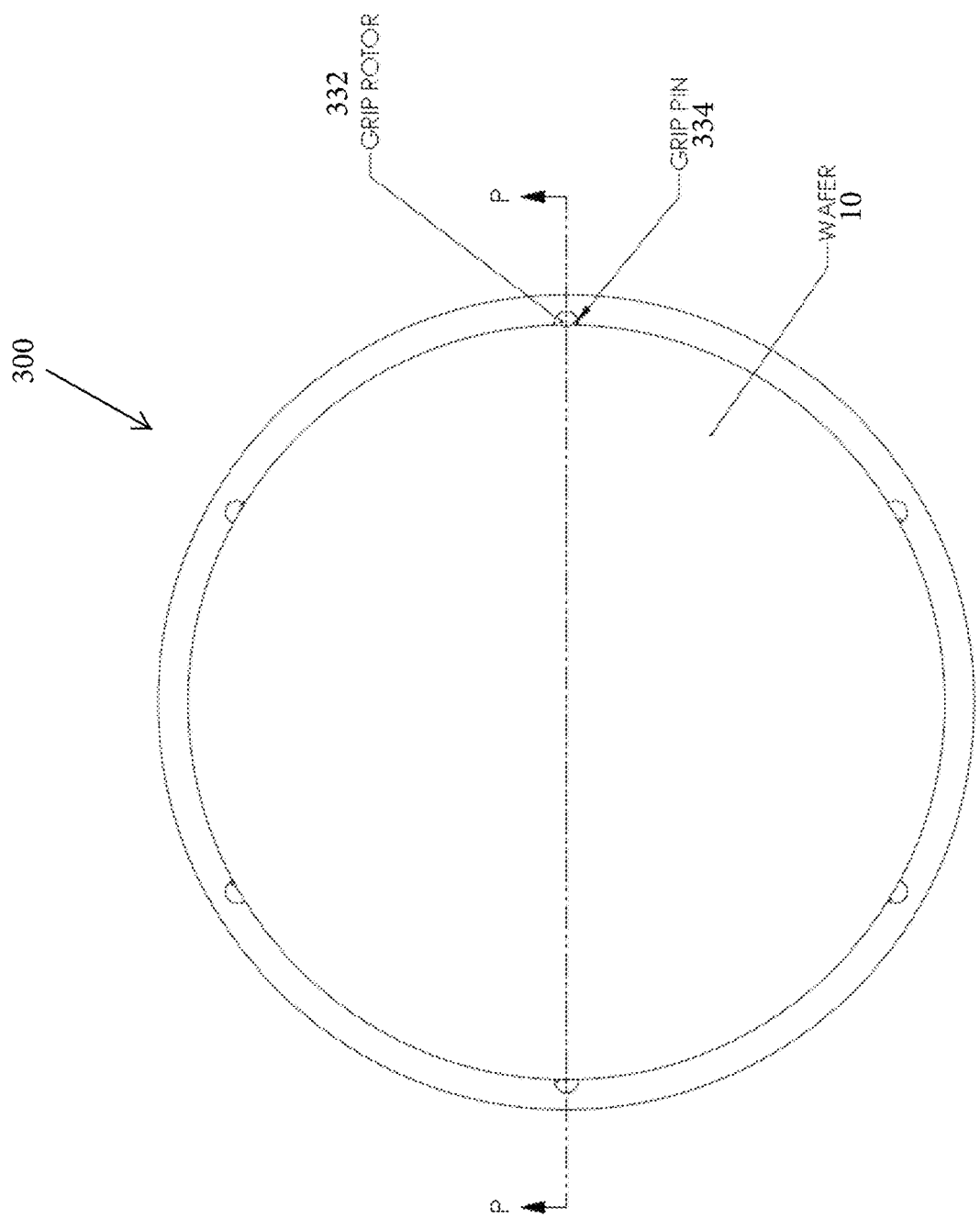
FIG. 10A is a top plan view of a configurable spin chuck in a second configuration.
Figure 10B:
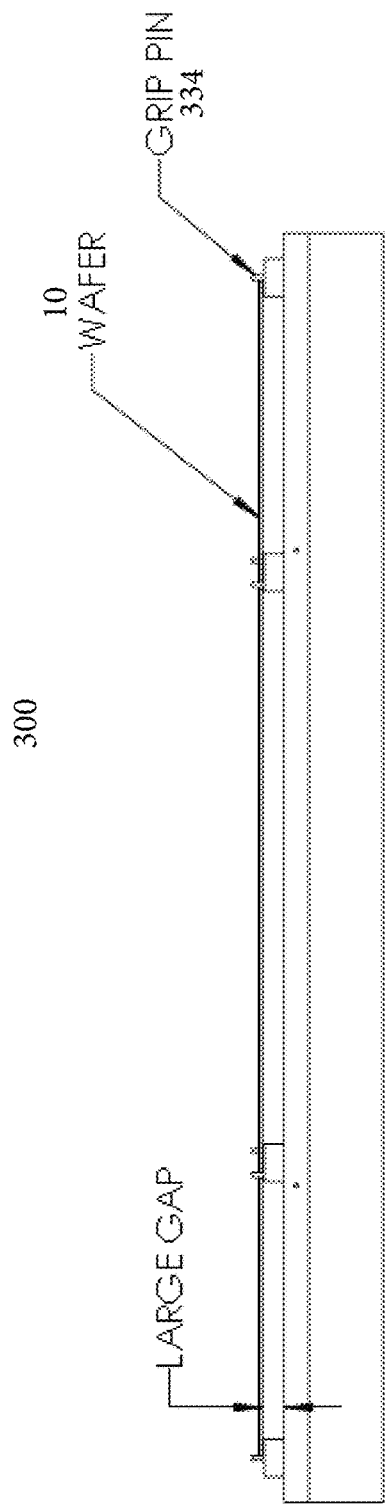
FIG. 10B is a side elevation view of the configurable spin chuck in the second configuration.
Figure 10C:
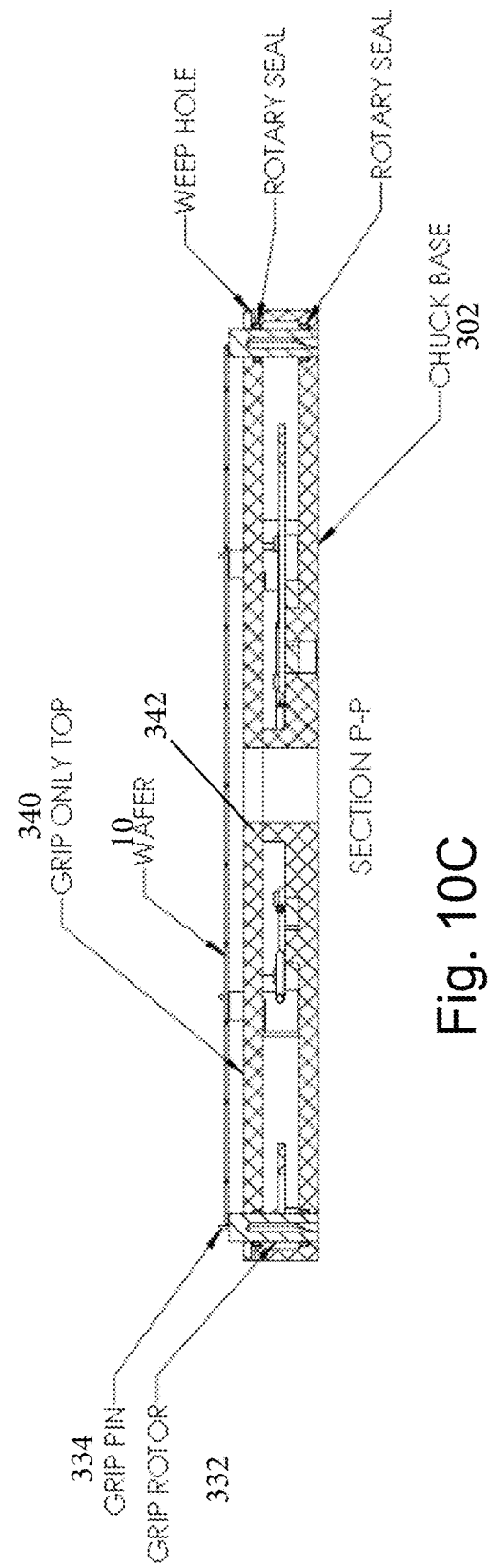
FIG. 10C is a cross-sectional view of the configurable spin chuck in the second configuration.

Since the chuck 300 is of a configurable nature, the air bearing is configured to be detachably coupled to the chuck 300 and more specifically, the air bearing can be easily removed from the chuck 300 for reconfiguring the chuck 300 from one mode of operation to another mode of operation (See, FIGS. 10A-C which depict another mode of wafer operation).

FIGS. 10A-10C illustrate the chuck 300 in a second configuration, namely, an open backside chuck. To convert the chuck from the high temperature air bearing configuration of FIGS. 9A-9C to the open backside chuck, the air bearing (base 320 and insert 322) is removed from the chuck 300 and a substrate 340 (grip only top) is inserted. In other words, by removing the top components (base 320 and insert 322) of the chuck 300 that comprise the high temperature air bearing, a simple flat plate (substrate 340) is placed on the same chuck base 302 to create a grip only chuck (i.e., a chuck in which only the chuck is gripped). As shown in FIG. 10B, a larger gap is formed between the wafer 10 and the chuck 300 (i.e., the substrate 340).

It will also be appreciated that in another embodiment, the air bearing can be constructed so as to permit the substrate 340 to be disposed therebelow and therefore, the substrate 340 does not have to be inserted but only requires removal of the air bearing to convert the chuck between the two operating modes.

The substrate 340 can be a disk-shaped structure and include one or more openings, such as a center opening 342 that is in fluid communication with opening 312 to allow fluid injected into opening 312 to flow to the backside of the wafer 10. For example, deionized water (DI) can be injected through the opening 312 and the center opening 342 so as to contact the backside of the wafer 10.

The above flexibility allows for easy change of the process being performed by the chuck 300 in a given machine.

Figure 11:
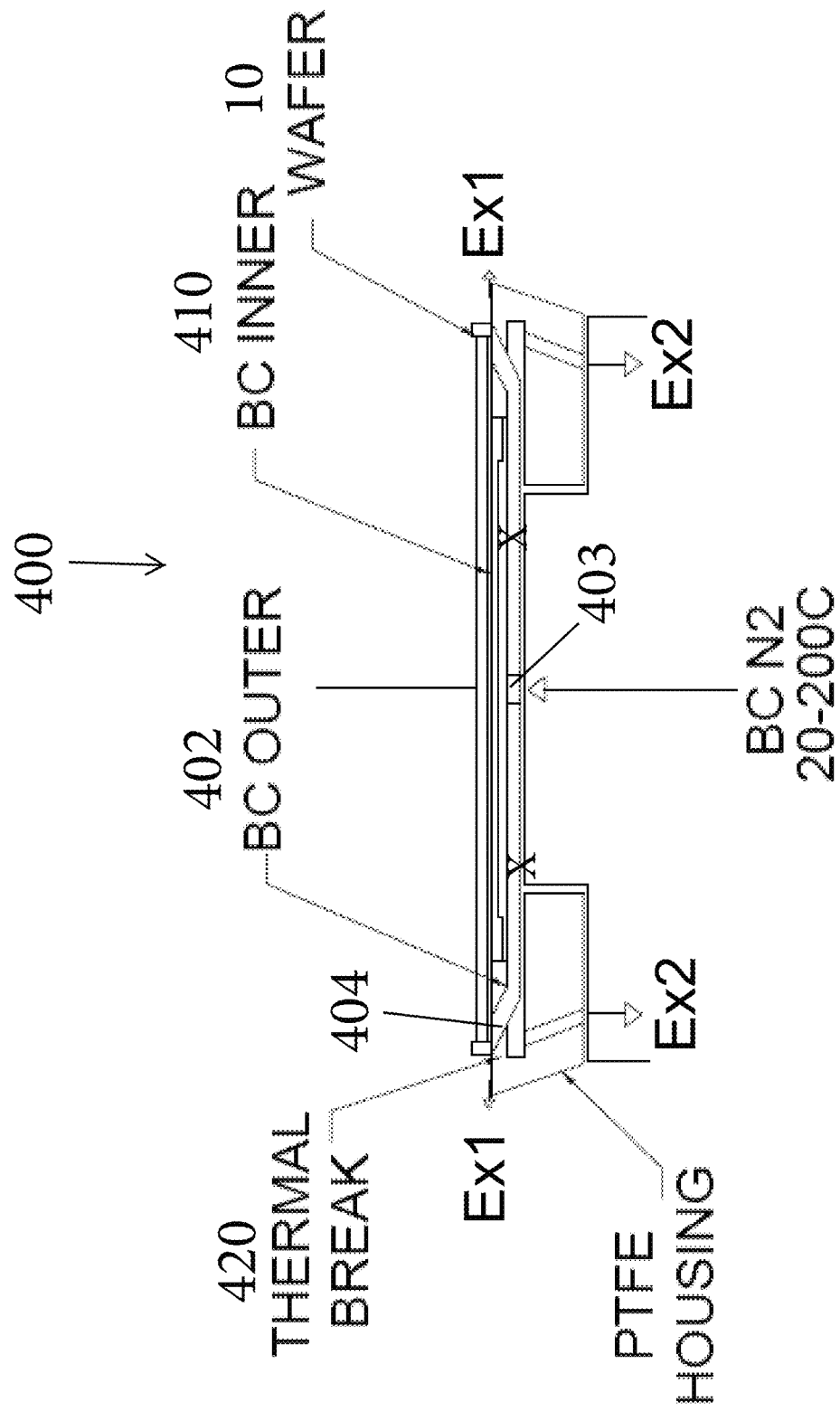
FIG. 11 is a cross-sectional view of Bernoulli type spin chuck.
Figure 12:
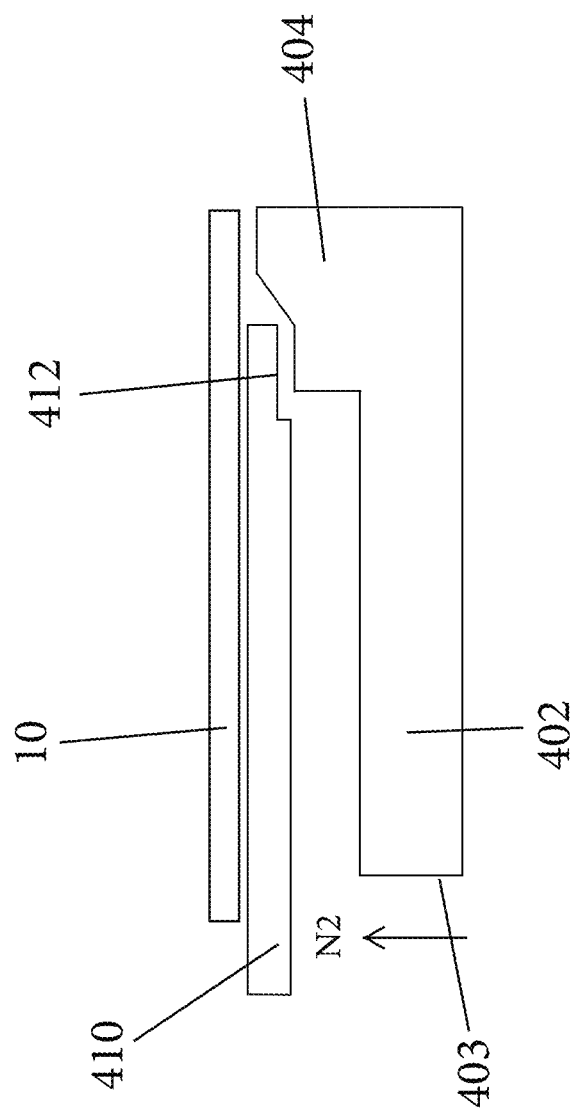
FIG. 12 is a close-up of an edge of the Bernoulli type spin chuck.
Figure 13:
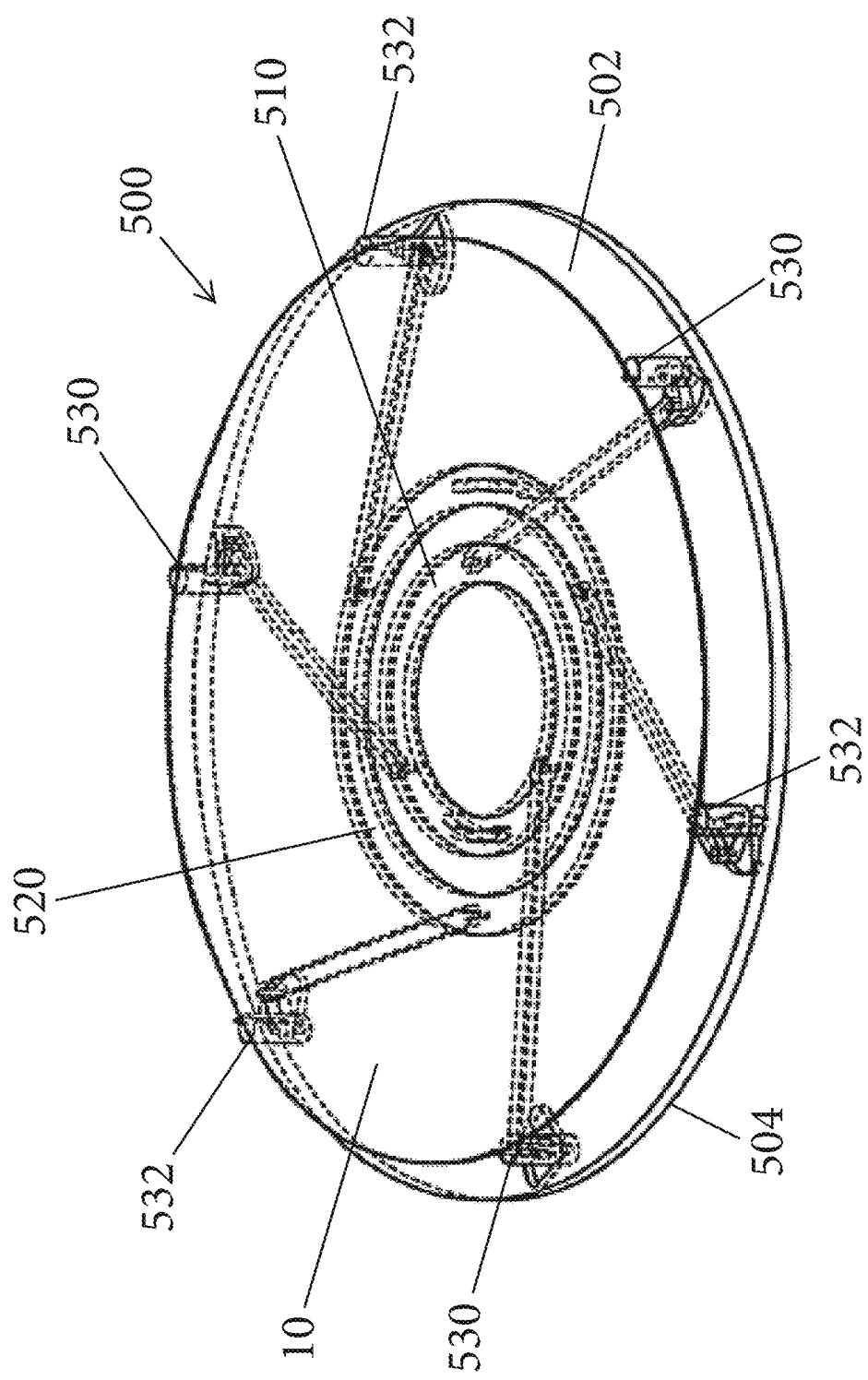
FIG. 13 is a top and side perspective view of a wafer grip mechanism according to a first embodiment.

FIGS. 11 and 12 depict another type of spin chuck that can be used with the wafer processing system 100 described herein. More specifically, FIGS. 11 and 12 depict a Bernoulli type spin chuck 400 which is another type of non-contact spin chuck. Similar to the air bearing type chuck, gas flows towards the face of the wafer, which is facing the spin chuck, wherein the gas supply means comprises a gas nozzle rotating with the spin chuck, for providing a gas cushion between the wafer and the spin chuck. FIG. 11 shows the basic components of a Bernoulli type chuck 400. The chuck 400 includes an outer base part 402 which as shown best in FIG. 12 has a raised outer peripheral edge 404 and can have a stepped construction as shown. The outer base part 402 includes a center opening 403 through which the gas (e.g., nitrogen) can be delivered to the top surface of the outer base part 402. The chuck 400 also includes an inner base part 410 that can have a plurality of slots 412 formed therein (e.g., formed circumferentially about a peripheral edge thereof).

As best shown in FIG. 12, the inner base part 410 is located above the outer base part 402 and is contained within the raised outer peripheral edge 404 of the outer base part 402. A gap is formed between the inner base part 410 and outer base part 402 at the locations of the slots 412 and therefore, these slots 412 provide and define flow paths by which the gas (nitrogen) flowing along an open space (channeling) between the inner base part 410 and the outer base part 402 flows through the slots 412 and is evacuated (vented) in a radially outward manner. This gas flow causes the wafer 10 to float above the inner base part 410 and the outer base part 402.

As indicated at locations "X" in FIG. 11, the chuck 400 can optionally include one or more seals which serve to define the internal gas flow within the chuck 400. When seals are provided, the injected hot gas (nitrogen) can only flow through the chuck (e.g., by flowing through the slots 412) and exits along the peripheral edge of the wafer as indicated by a first exhaust path EX1. When the seals are not provided at locations X, the hot gas flows not only through the chuck and is exhausted at EX1 but the hot gas also flows along a second exhaust path EX2 whereby the hot gas flows along internal channels formed with the chuck before exiting at EX2.

An insulator 420 underneath the outer base part 402 prevents heat from escaping into the rest of the chuck mechanism.

As with the air bearing type chuck, a stationary post (not shown) can be provided and serves as a means by which the gas (nitrogen gas) can be delivered to the chuck base.

Now turning to FIGS. 13-20B in which a grip mechanism 500 is provided and is configured to selectively grip the wafer 10 about its outer peripheral edge to ensure that the wafer 10 is held in place on the chuck. For purpose of illustration, the illustrated chuck includes a chuck base 502. As shown, the chuck base 502 can be disc shaped and has an outer peripheral edge 504.

Within the chuck base 502 are a pair of independently concentric rotatable grip actuator rings, namely, a first grip actuator ring 510 and a second grip actuator ring 520 that surrounds the first grip actuator ring 510. The first grip actuator ring 510 is thus the innermost actuator ring. It will therefore be appreciated that each of the first grip actuator ring 510 and the second grip actuator ring 520 can rotate relative to the surrounding portions of the chuck base 502.

Spaced circumferentially about the outer peripheral edge 504 of the chuck base 502 are a plurality of grip cylinders or grip rotors and in particular, the grip rotors can be grouped as a first set 530 and a second set 532. As described herein, each of the grip rotors 530, 532 includes an upstanding pin 531 that represents the structure that physically contacts the outer peripheral edge of the wafer 10.

In the illustrated embodiment, the first set 530 includes three grip rotors 530 and the second set 532 includes three grip rotors 532. The grip rotors 530, 532 are arranged in alternating manner about the circumference of the chuck base 502 in that each grip 530 is located between two grips 530 and vice versa.

Figure 16C:
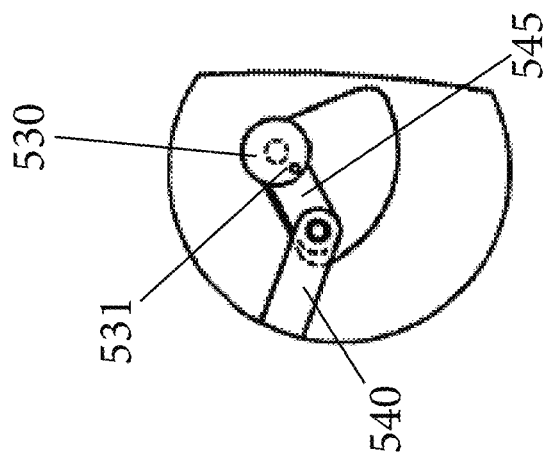
FIG. 16C is a close-up of a grip cylinder and grip pin in the open position.
Figure 16A:
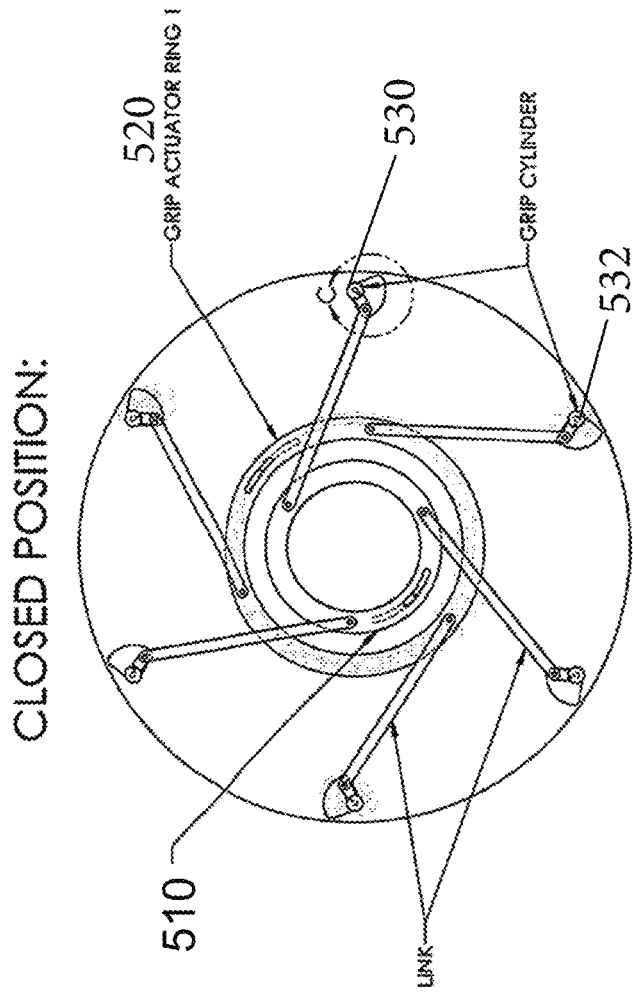
FIG. 16A is a top plan view of the grip mechanism in a closed position.
Figure 16B:
FIG. 16B is a side elevation view of the grip mechanism.

The first set of grip rotors 530 are associated with and coupled to the first grip actuator ring 510 and the second set of grip rotors 532 are associated with and coupled to the second grip actuator ring 520. More specifically, the first set of grip rotors 530 are coupled to the first grip actuator ring 510 by a plurality of pivotable first linkages 540 and the second set of grip rotors 532 are coupled to the second grip actuator ring 520 by a plurality of pivotable second linkages 550. One dedicated first linkage 540 couples the grip rotor 530 to the first grip actuator ring 510 and similarly, one dedicated second linkage 550 couples the grip rotor 532 to the second grip actuator ring 520. In particular, a first end on the first linkage 540 is pivotally coupled to the first grip actuator ring 510 and the opposite second end is pivotally connected to one grip rotor 530 and similarly a first end on the second linkage 550 is pivotally coupled to the second grip actuator ring 520 and the opposite second end is pivotally connected to one grip rotor 532. As shown in FIGS. 14C, 15C, and 16C, the connection between the first linkage 540 to the grip rotor 530 can include a short connector link 545 and similarly, the connection between the second linkage 550 to the grip rotor 532 can include a short connector link. The permits the movement of the linkage to be transferred into rotation of the grip rotor.

The provision of two independent grip actuator rings 510, 520 along with associated hardware (linkages and grip rotors) provides redundancy in that if one grip actuator ring fails, the operation of the other grip actuator ring causes controlled gripping of the wafer 10 and controlled release of the wafer 10. Thus, the independent grip arrangement allows for one gripper to fail without losing the wafer 10.

The grip actuator rings 510, 520 are moved to a gripped position (FIGS. 15A-C) or a closed position (FIGS. 16A-C) by a spring. The gripped position is one in which the grip pins 531 contact the outer peripheral edge of the wafer 10 to maintain the wafer 10 in a held position (FIG. 15C), while the closed position is one in which the wafer 10 is absent and the wafer pins 531 are moved to an innermost position (FIG. 16C) due to the biasing force of the spring on the respective actuator ring 510, 520. The open position is one in which the grip pin 531 is moved away from the peripheral edge of the wafer to allow for insertion and/or removal of the wafer 10.

The first actuator ring 510 includes a first arcuate slot 515 that is formed therein and the second actuator ring 520 includes a second arcuate slot 525 that is formed therein. Movable release pins 570 are provided for causing rotation of the first and second actuator rings 510, 520. FIGS. 17A-19B show the steps of how the grip mechanism 500 can be moved to the open position. FIGS. 17A and 17B show the release pins 570 in a lowered (down) position. As shown, the release pins 570 are in registration with the slots 515, 525. FIGS. 17A and 17B show the wafer 10 in the gripped position with the pins 531 in contact with the peripheral edge of the wafer 10, thereby holding the wafer 10 in place.

FIGS. 18A and 18B show a second step in which the release pins 570 are inserted into the slots 515, 525 when the chuck is stationary. In this position, the pins 531 are still in contact with the peripheral edge of the wafer 10 (which is still held in place).

FIGS. 19A and 19B show a third step in which the chuck 502 is rotated by the spin motor while the pin is stationary. As shown, the release pins 570 are moved to one end of the respective slots 515, 525, which causes relative rotation of the actuator rings 510, 520 (i.e., the rings 510, 520 are opened), which causes movement of the linkages 540, 550 connected to the rings 510, 520. Since the linkages 540, 550 are connected to the grip rotors (grip cylinders), movement of the linkages 540, 550 is translated into rotation of the grip rotors 530, 532. Since the grip pins 531 are integral to the grip rotors 530, 532, rotation of the grip rotors 530, 532 is translated into movement of the grip pins 531 in a direction away from the peripheral edge of the wafer 10. Such movement releases the wafer 10.

An independent lifter arrangement is then used to lift the wafer 10 above the surface of the chuck such that it can be picked up by the handler.

Figure 20A:
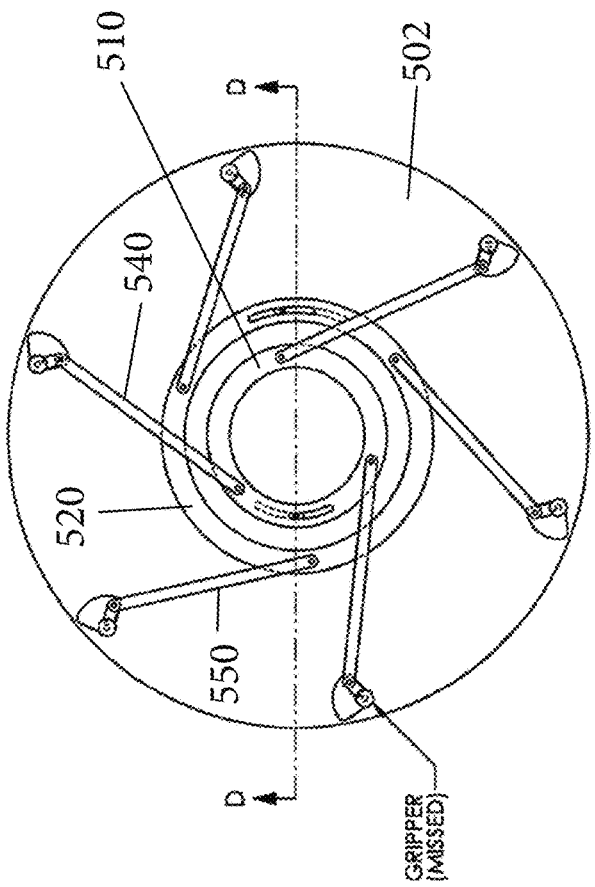
FIG. 20A is a top plan view of the grip mechanism showing a missed configuration.
Figure 20B:
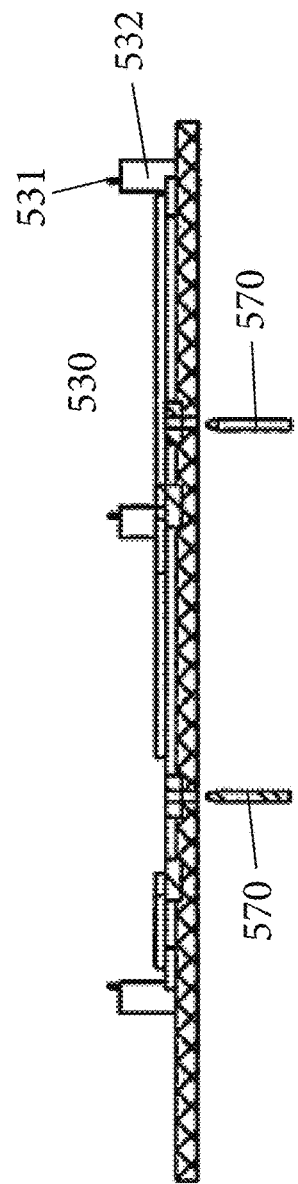
FIG. 20B is a cross-sectional view taken along the line D-D of FIG. 20A.
Figure 21A:
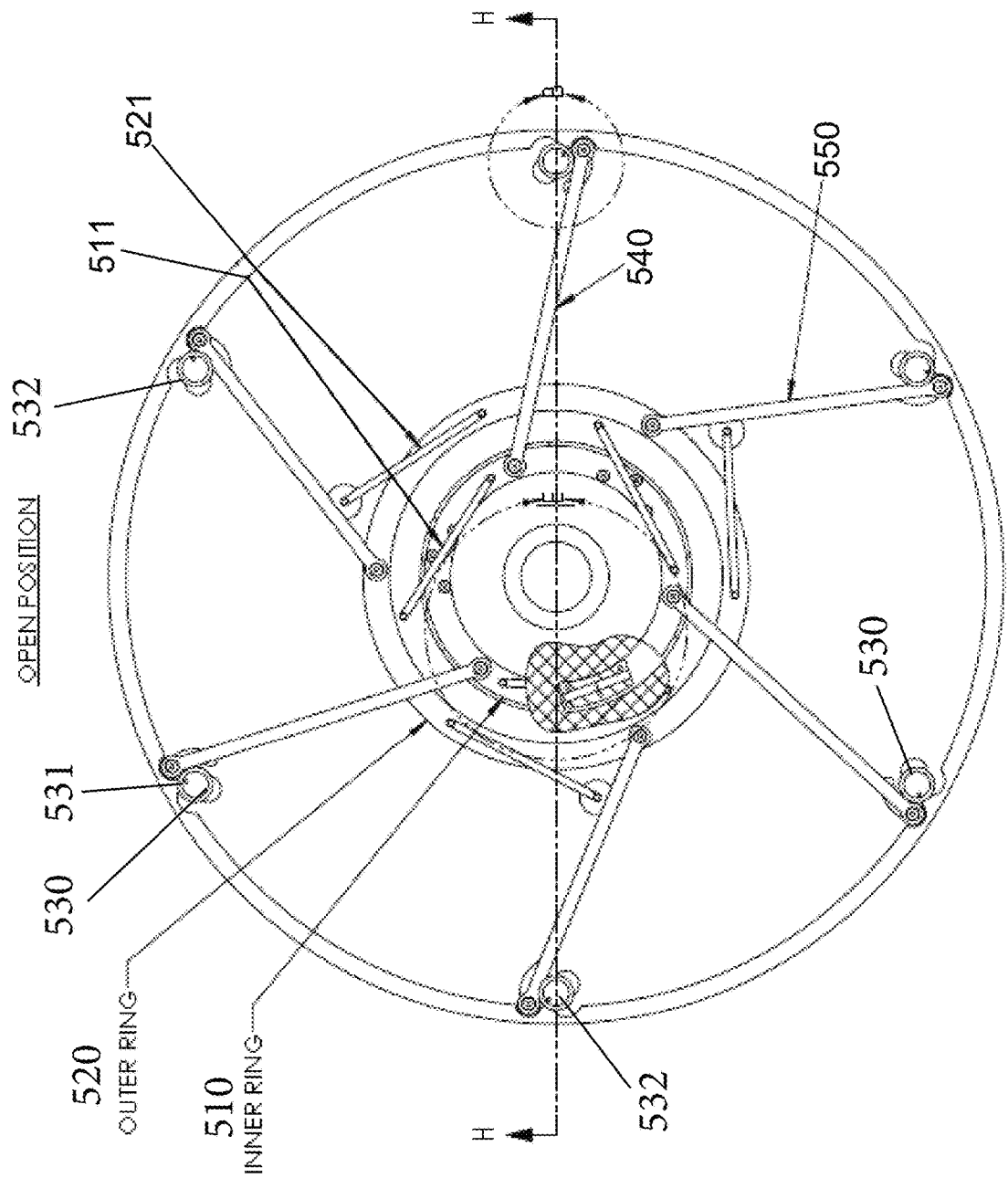
FIG. 21A is a top plan view of the grip mechanism according to a second embodiment and showing the grip mechanism in the open position.

FIGS. 20A and 20B show a missed configuration which is a situation in which the grip pins 531 fail to grip the wafer 10. As shown in this position, the pins 531 move to an innermost position (similar to the closed position).

FIGS. 21A to 34 show a grip mechanism 600 according to another embodiment. The grip mechanism 600 is similar to the grip mechanism 500 and therefore, like elements are numbered alike.

The figures show the biasing members that apply a biasing force to the respective grip actuator rings 510, 520. In particular, the first grip actuator 510 is coupled to one or more first biasing members (extension springs) 511 that connect between the first grip actuator 510 and the annular shaped spin chuck portion between the first and second grip actuator rings 510, 520. The second grip actuator 520 is coupled to one or more first biasing members (extension springs) 521 that connect between the second grip actuator 520 and the spin chuck at locations that are radially outside of the second grip actuator 520.

The main different between the grip mechanism 500 and the grip mechanism 600 is the manner in which the respective mechanism is actuated. In particular, the grip mechanism 600 does not include slots 515, 525 and release pins 570. Instead, the grip rotors 530, 532 have a different construction as described below and a different mechanism is used to controllably rotate the grip rotors 530, 532.

FIGS. 21A-21D show the grip mechanism 600 in an open position which again is a position in which the wafer 10 can be either inserted or removed from the chuck. As will be discussed below and similar to the previous embodiment relating to the grip mechanism 500, rotation of the grip rotors results in movement of the grip pin 531, thereby allowing the grip pin 531 to be either moved in a direction toward or away from the wafer's peripheral outer edge. In the gripped position, the pins 531 press against the outer peripheral edge of the wafer 10.

The grip mechanism 600 allows for a spring actuated grip on the outer circumference of the wafer 10. A system of linkages 540, 550 transmits force generated by extension springs 511, 521 from the two independent actuator rings 510, 520 to the individual grip rotors 530, 532.

As shown in FIG. 21C, in order to get feedback about the position of the grip mechanism 600, magnets 535 are placed on the actuator rings 510, 520. These magnets 535 are placed below the actuator rings 510, 520 directly above a thin section 509 (FIG. 21B) of the chuck base 502. Non-contact sensors, such as Hall effect sensors, are then used to read the position of the magnets 535 indicating whether the check is open and ready to receive wafer 10, properly gripped, or closed.

Figure 22A:
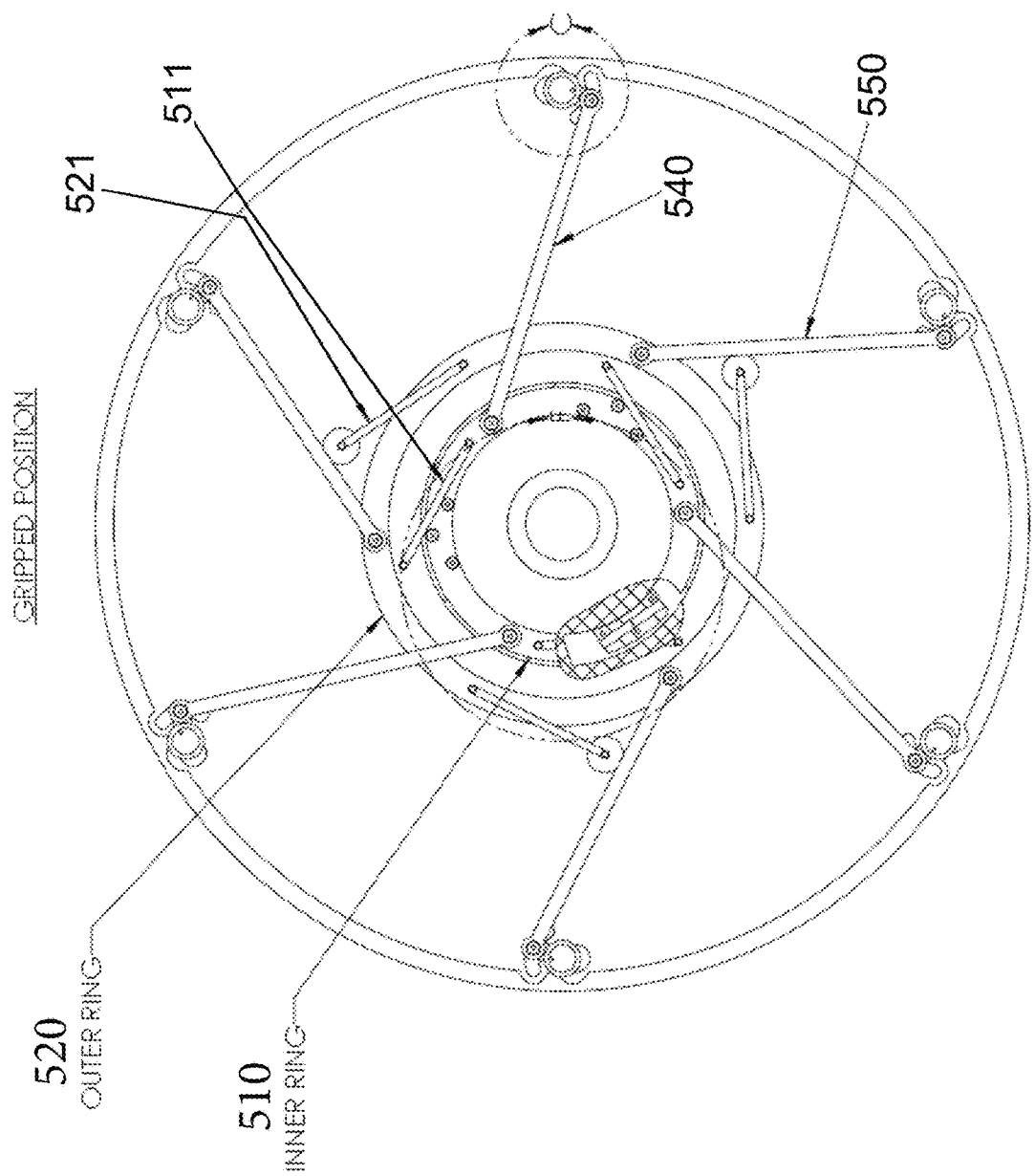
FIG. 22A is a top plan view of the grip mechanism according to a second embodiment and showing the grip mechanism in the gripped position.
Figure 22C:
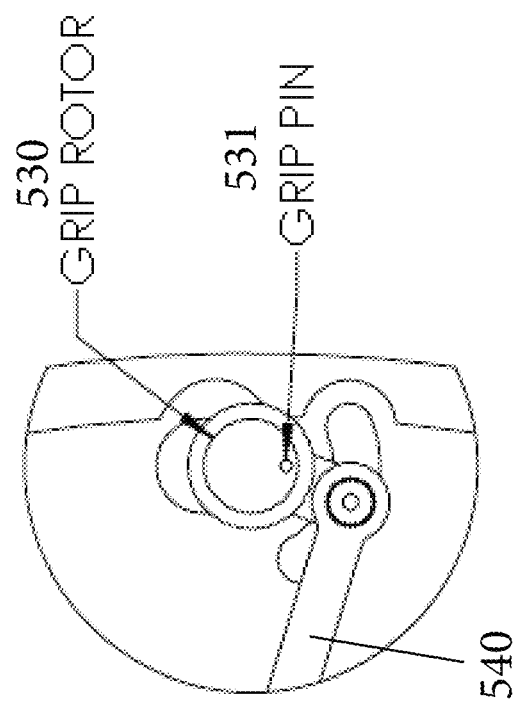
FIG. 22C is a close-up of the grip rotor and grip pin of FIG. 22A.
Figure 22B:
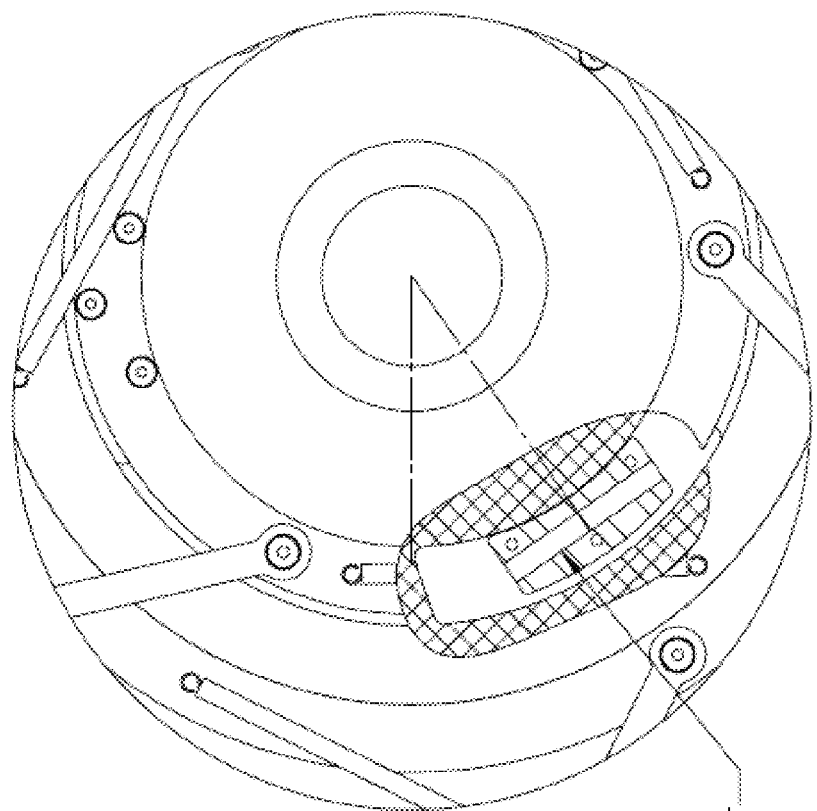
FIG. 22B is a close-up of a portion of the grip mechanism of FIG. 22A.

FIGS. 22A-22C show the grip mechanism 600 in the gripped position (one in which the grip pins 531 press against the outer peripheral edge of the wafer 10).

Figure 23C:
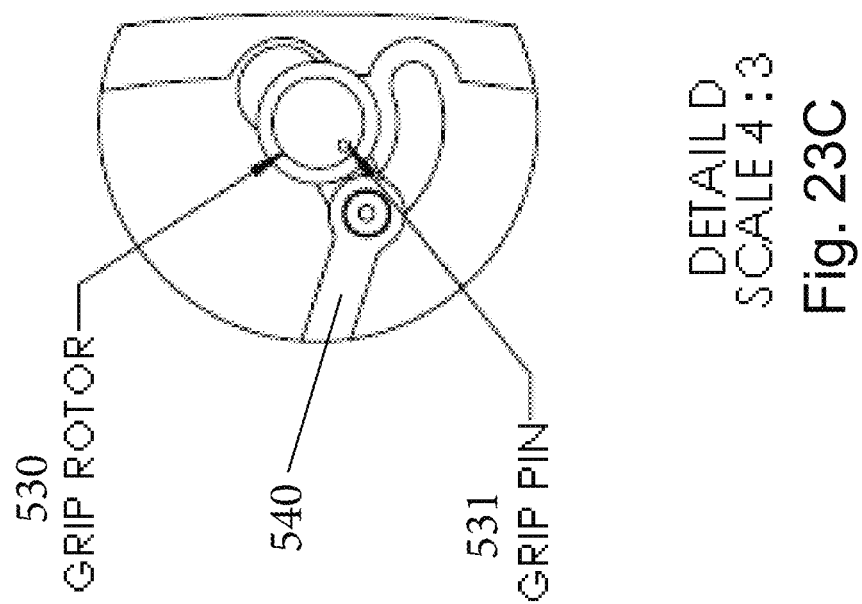
FIG. 23C is a close-up of the grip rotor and grip pin of FIG. 23A.
Figure 23B:
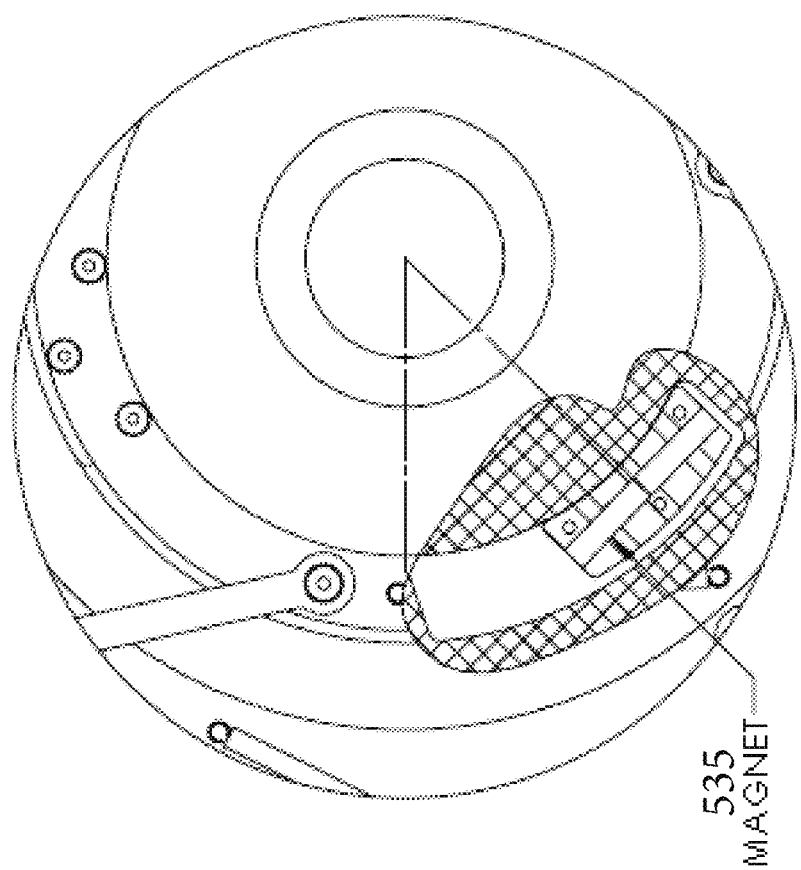
FIG. 23B is a close-up of a portion of the grip mechanism of FIG. 23A.

FIGS. 23A-23C show the grip mechanism 600 in the closed position (one in which the wafer 10 is absent and the grip pins 531 are in innermost positions).

Figures 24A, 24B, 25, 26:
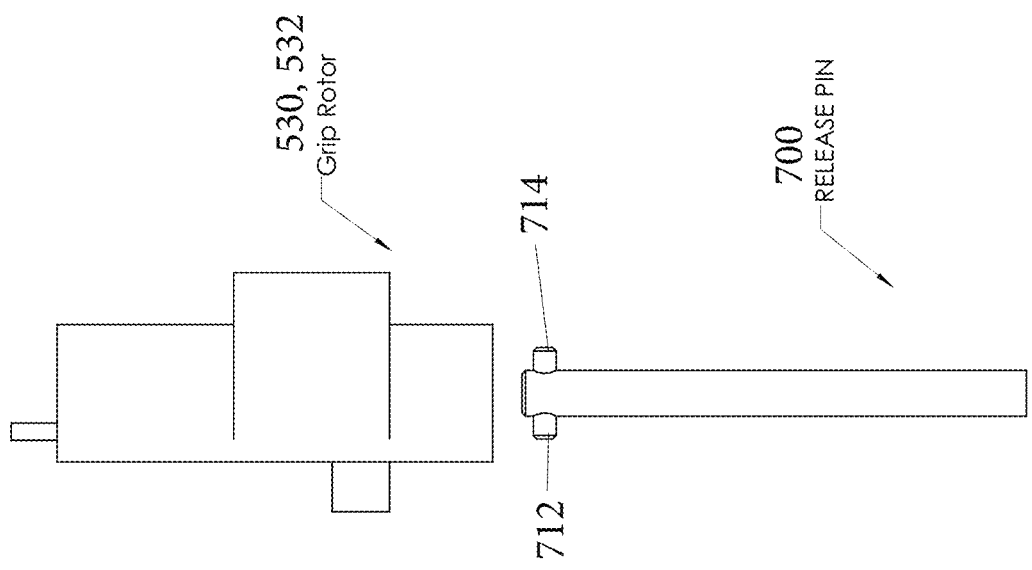
FIG. 24A is a side elevation view of a grip rotor and grip pin according to one embodiment.
FIG. 24B is a cross-sectional view taken along the line J-J of FIG. 24A.
FIG. 25 is a bottom plan view of the grip rotor and grip pin of FIG. 24A.
FIG. 26 is a side elevation view of a grip rotor and grip pin according to another embodiment.

FIGS. 24A, 24B and 25 show the construction of grip rotor 530, 532 that is used with grip mechanism 600. As shown in FIG. 24B, the grip rotor 530, 532 has a bore 534 that includes a cam surface 536. The grip pin 531 protrudes outwardly from the top surface of the grip rotor. As described below, the cam surface 536 is designed to impart rotation to the grip rotor 530, 532.

Figure 28:
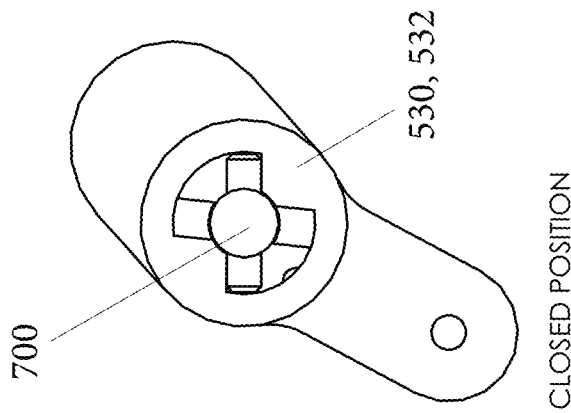
FIG. 28 is a bottom plan view of the grip rotor and grip pin of FIG. 26.
Figure 27B:
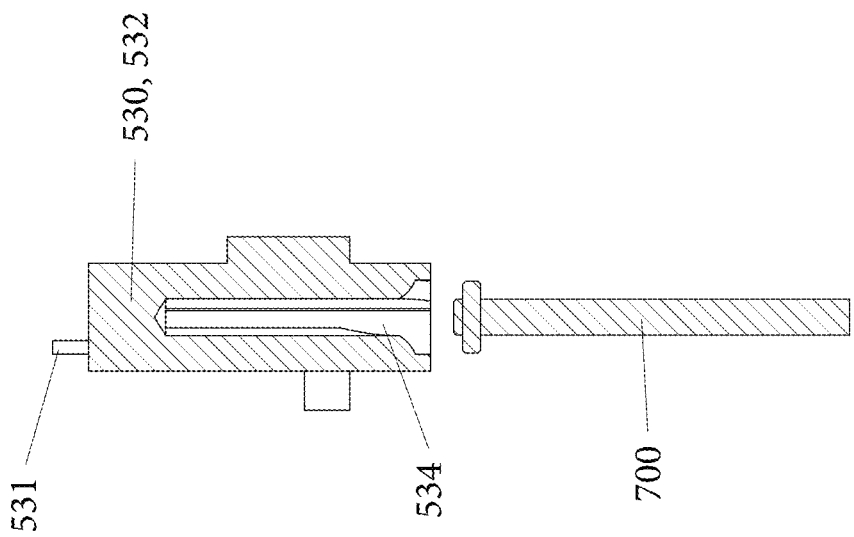
FIG. 27B is a cross-sectional view taken along the line K-K of FIG. 27A.
Figure 27A:
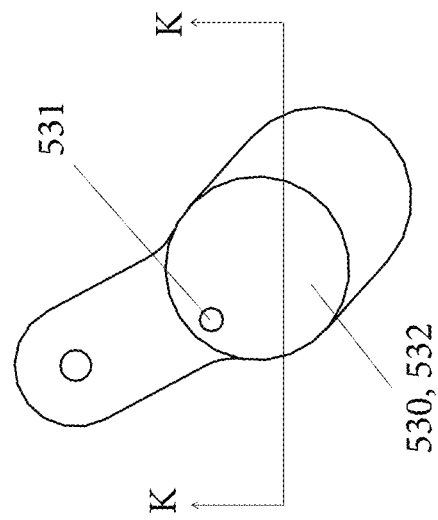
FIG. 27A is a top plan view of the grip rotor and grip pin of FIG. 26.

FIGS. 26-28 show operation of the grip rotor 530, 532 in that a release pin 700 is used to impart rotation of the grip rotor 530, 532. The release pin 700 includes an elongated shaft 710 which has at one end thereof, a pair of outwardly extending tabs 712, 714. The tabs 712, 714 are formed directly opposite one another. The release pin 700 is configured for insertion into the bore 534 FIGS. 26-28 depict the grip rotor 530, 532 in the closed position with FIG. 28 being a bottom view of the grip rotor 530, 532 in the closed position prior to insertion of the release pin 532 into the grip rotor 530, 532.

Figure 31:
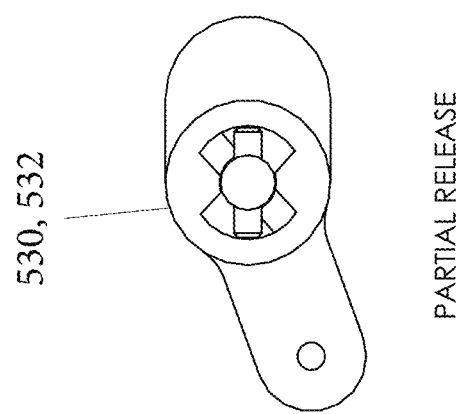
FIG. 31 is a bottom plan view of the grip rotor and grip pin of FIG. 29.

FIGS. 29-31 depict the grip rotor 530, 532 in a partially released state. The release pin 700 is partially inserted into the bore 534 and is shown prior to contact with the cam surface 536.

Figure 33A:
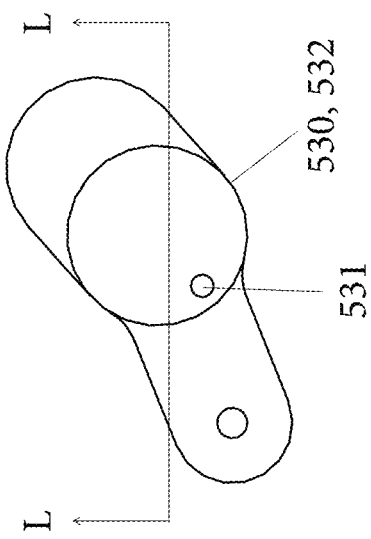
FIG. 33A is a top plan view of the grip rotor and grip pin of FIG. 32.
Figure 32:
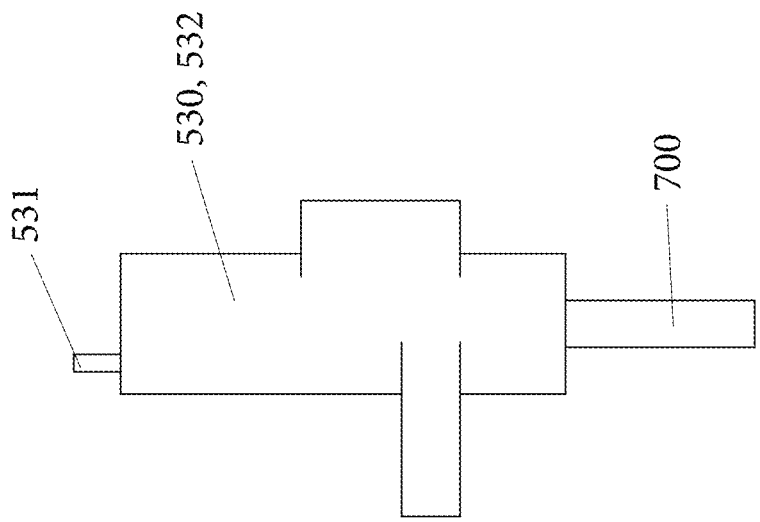
FIG. 32 is a side elevation view of a grip rotor and grip pin according to another embodiment.
Figure 34:
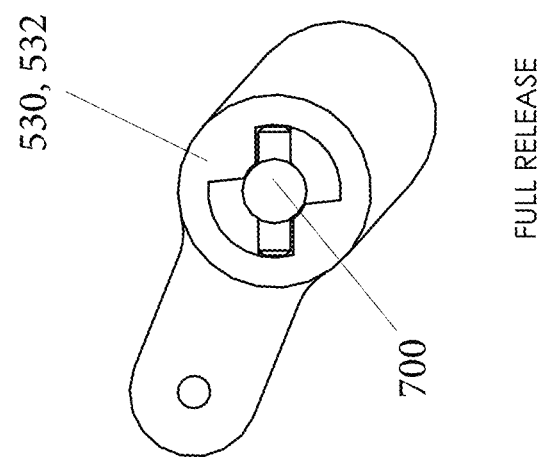
FIG. 34 is a bottom plan view of the grip rotor and grip pin of FIG. 32.
Figure 33B:
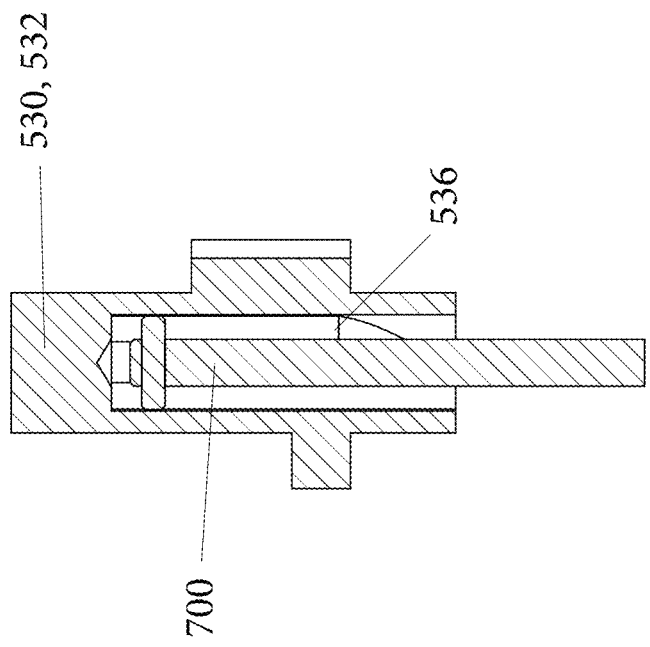
FIG. 33B is a cross-sectional view taken along the line M-M of FIG. 33A.
Figure 35:
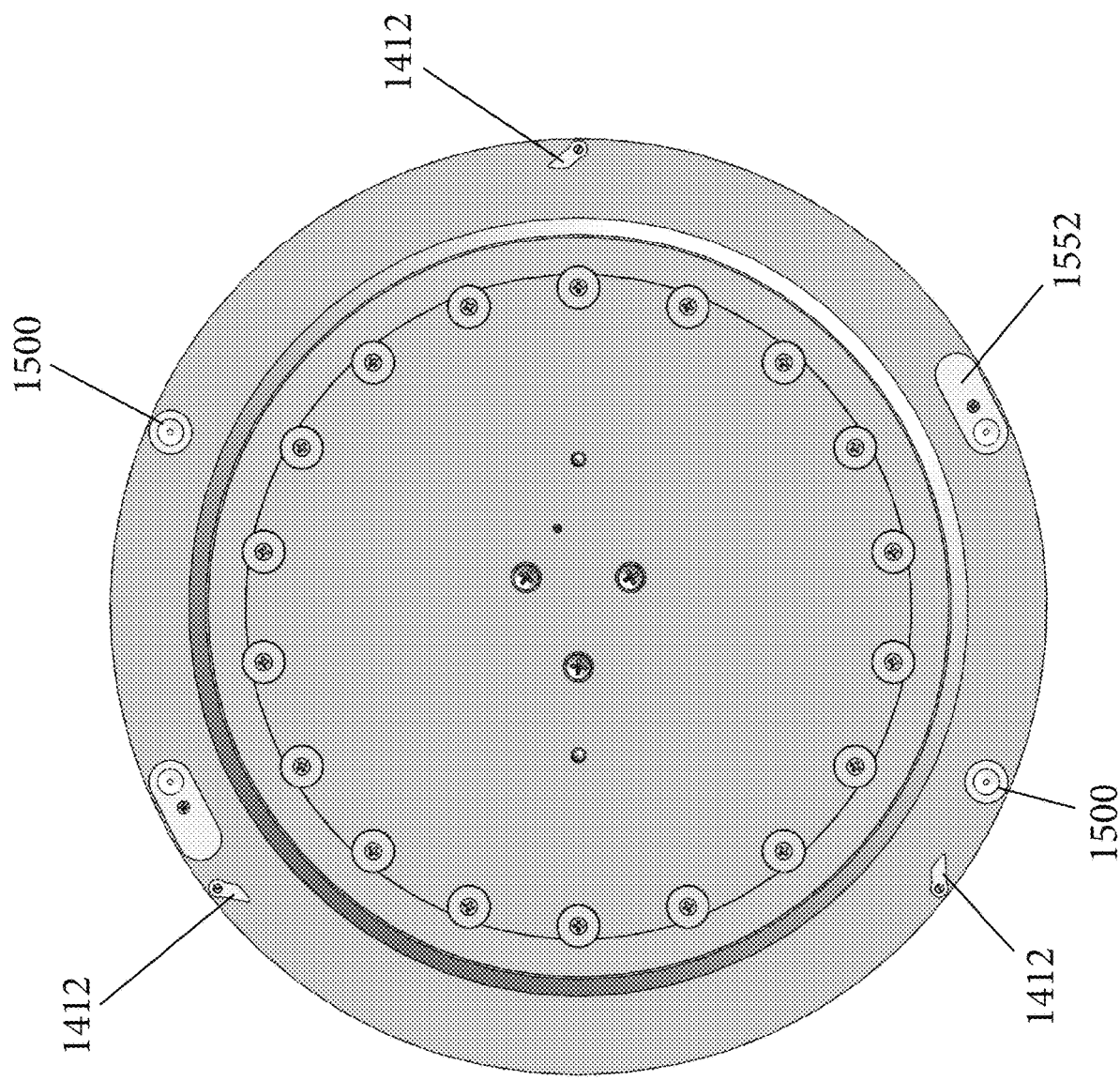
FIG. 35 is a top plan view of a spin chuck according to another embodiment with the chuck body being shown in transparency to allow viewing of the internal parts.

FIGS. 32-34 depict the grip rotor 530, 532 in a fully released state. In this state, the insertion pin 700 is fully inserted into the bore 534. As the release pin 700 continues to travel upward within the bore 534 after insertion, the tabs 712, 714 contact the cam surface 536 and the continued movement of the release pin 700 upward within the bore 534 imparts rotation to the grip rotor 530, 532 since the release pin 700 is fixed in place and configured to move vertically (the release pin 700 does not rotate).

When the release pins 700 are removed from the grip rotors 530, 532, the biasing force applied by the springs 511, 521 to the actuator rings 510, 520 causes the grip rotors 530, 532 to return to the closed position (when no wafer 10 is present).

The grip mechanism 500 is thus configured such that a number of linkages 540, 550 connect the grip rotors (grip cylinders) 530, 532 to a respective grip cylinders 530, 532. Furthermore, there are two independent grip actuator rings 510, 520, each connected to three grip rotors 530, 532, respectively. Sensing is accomplished by means of a magnet and a Hall effect sensor (not shown) for each grip actuator ring 510, 520. The magnets are attached to the grip actuator ring 510, 520 and fully encapsulated within the chuck to avoid chemical contamination. The Hall effect sensor is fully encapsulated within the stationary portion of the process chamber to avoid chemical contamination. The Hall effect sensor is able to detect the relative position of the magnet, thereby providing feedback to software or whether the chuck is open, gripped, or closed.

FIGS. 35-42C depict a spin chuck 1300 in accordance with another embodiment. It will be understood and appreciated that the spin chuck 1300 is of a Bernoulli type similar to the chucks 140 and 300 described herein and therefore, shares many features therewith. Therefore, the features described with respect to the chuck 140 and/or chuck 300 can be implemented in the spin chuck 1300.

Figure 38:
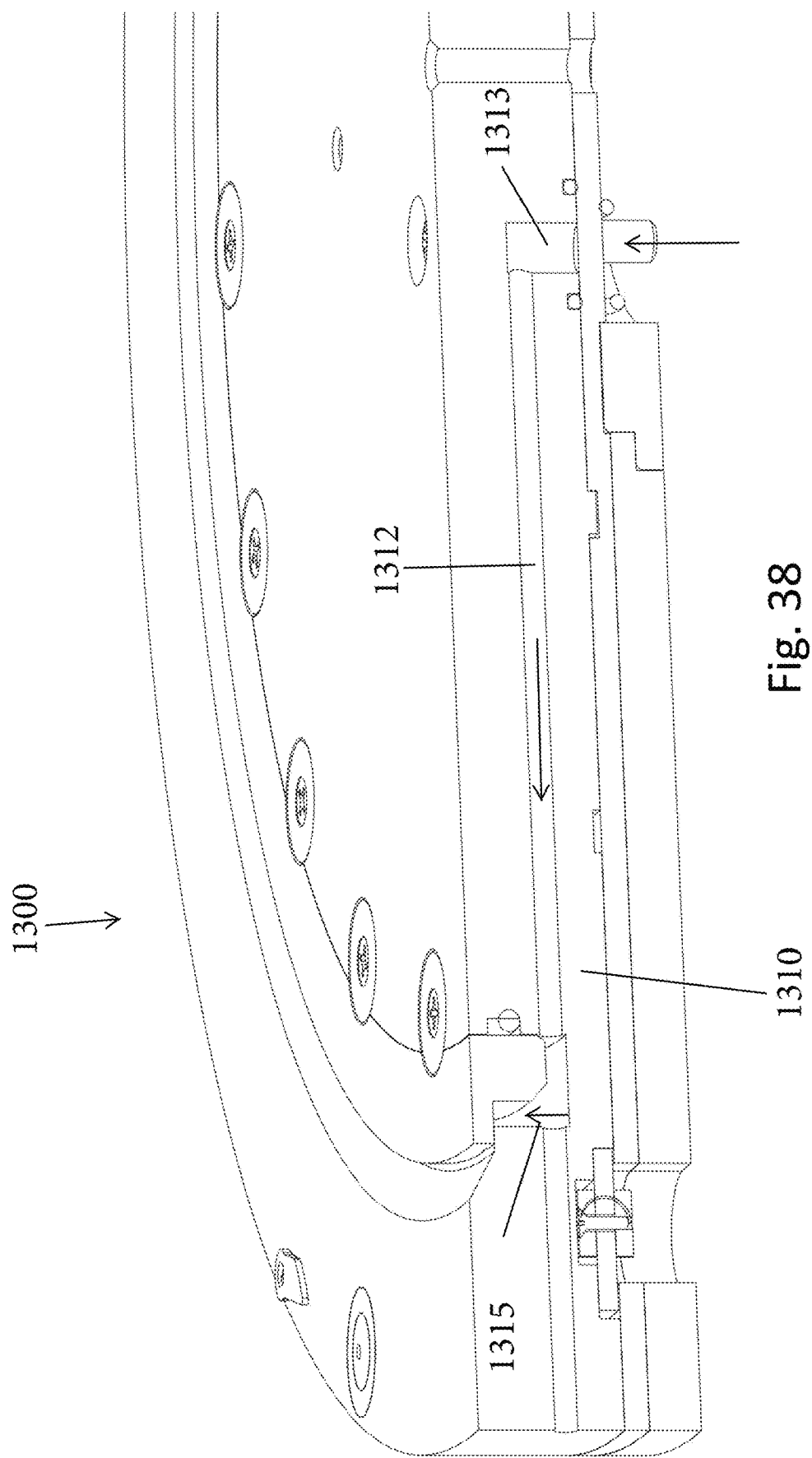
FIG. 38 is a partial cross-sectional view of the spin chuck.
Figure 39:
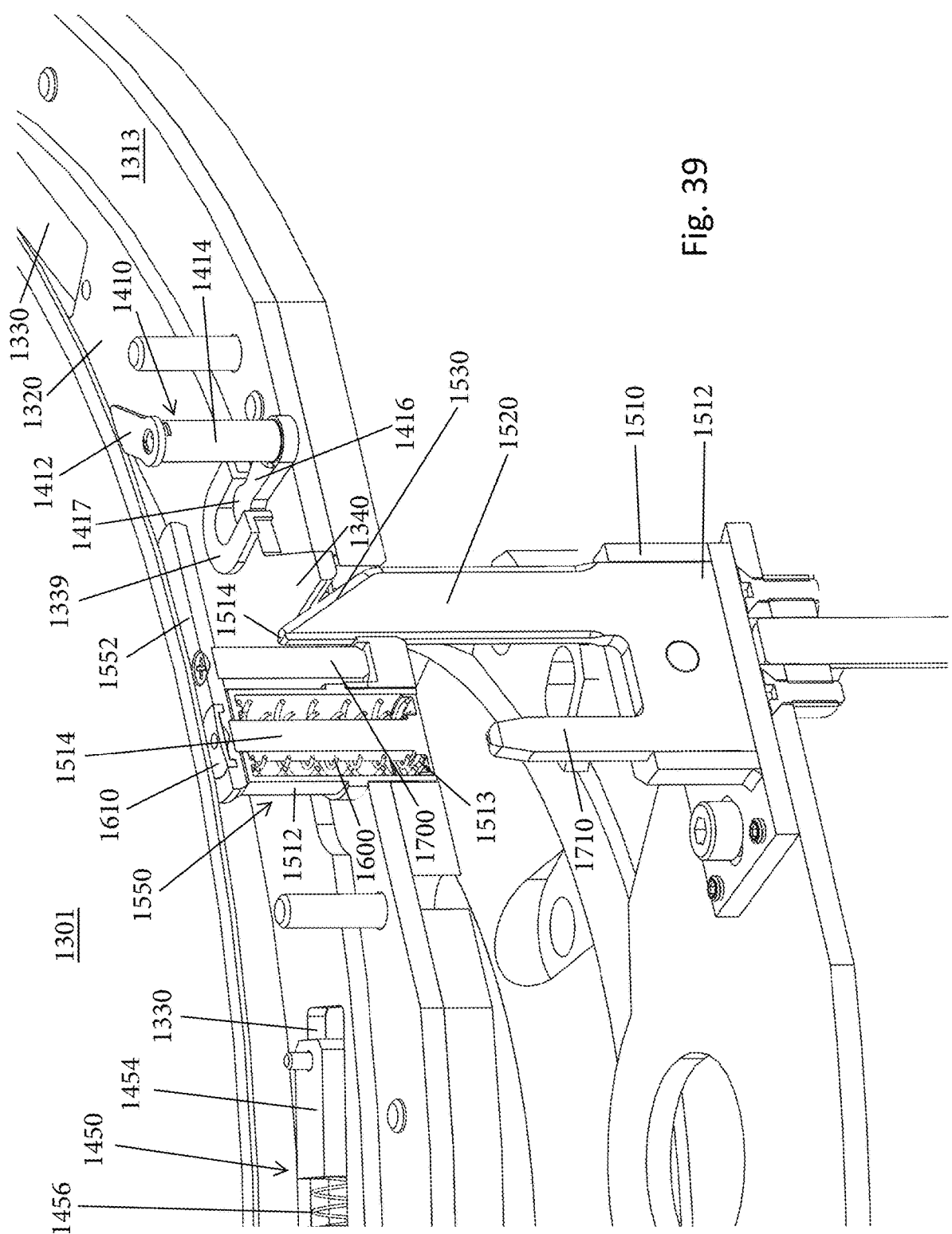
FIG. 39 is a close-up of a portion of the spin chuck showing a pivotable jaw, cam member for controlling movement of the jaw and a lifter for controllably raising and lowering of the wafer.
Figure 40:
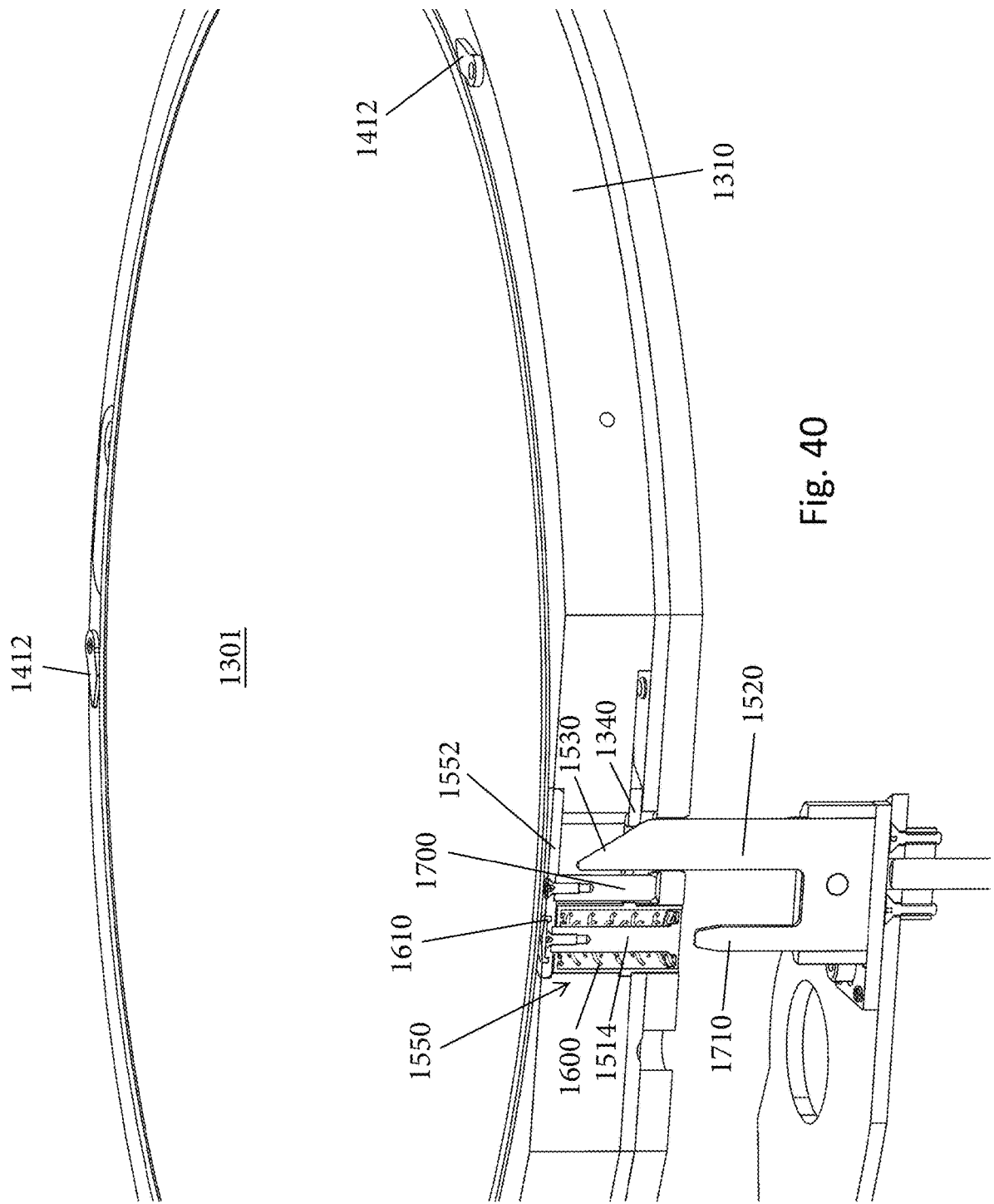
FIG. 40 is partial side perspective view showing the cam member and lifter in a retracted position.

The Bernoulli aspect of the spin chuck 1300 can be seen with respect to FIG. 38 in which the flow path of the gas (e.g., nitrogen) is shown in arrows. FIG. 39 generally shows a chuck body 1310 in which a plurality of distribution channels 1312 are formed. At inlet 1313, the gas flows into the channel 1312 and then flows in a radially outward direction to location 1315 at which spot it flows upward into additional distribution channels that lead to radial flow emitters (gas diffusers) that discharge the gas along the top of the chuck creating a Bernoulli type chuck.

Figure 36:
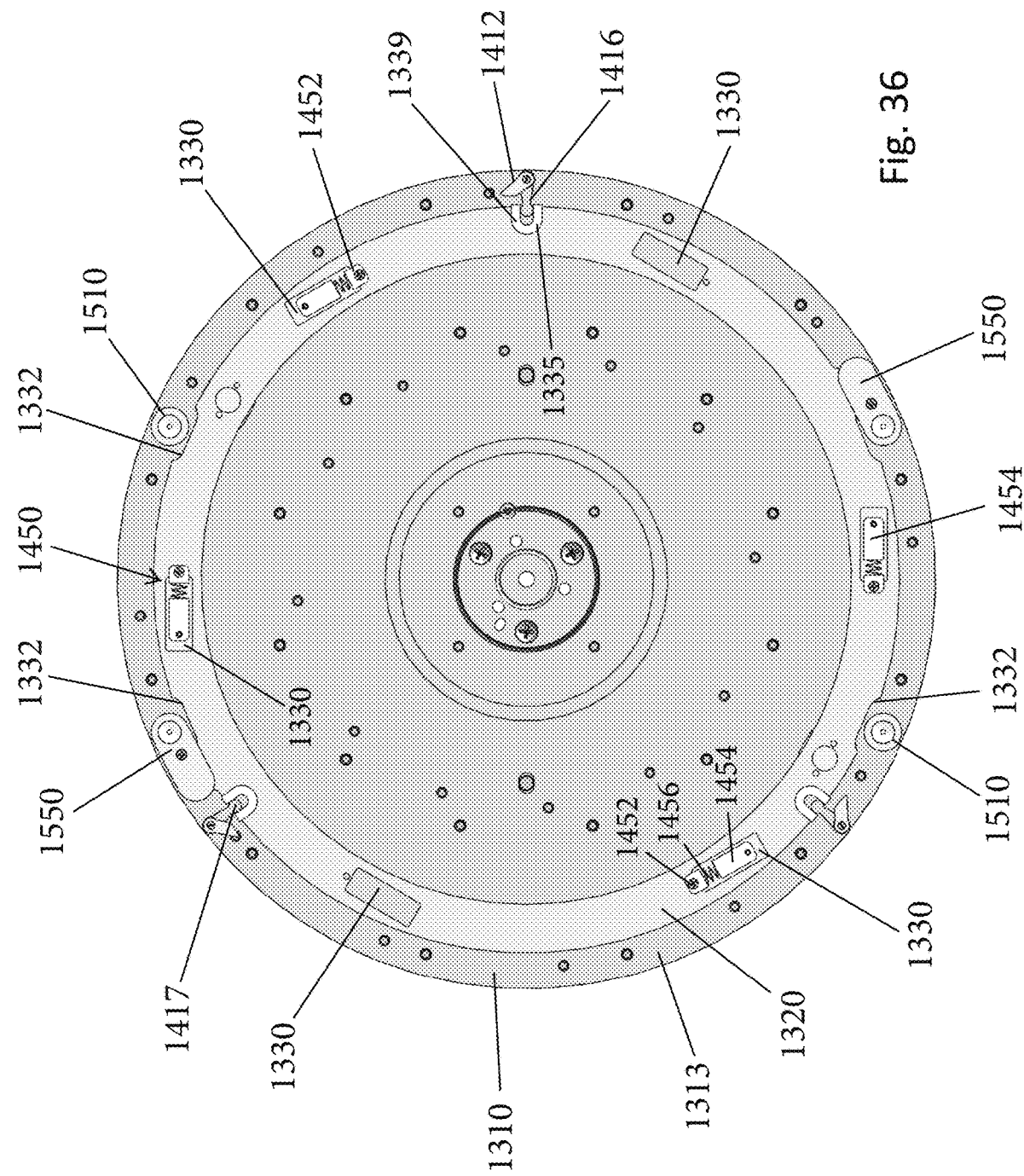
FIG. 36 is a top plan view of the spin chuck with a top surface substrate removed to show additional features.
Figure 37:
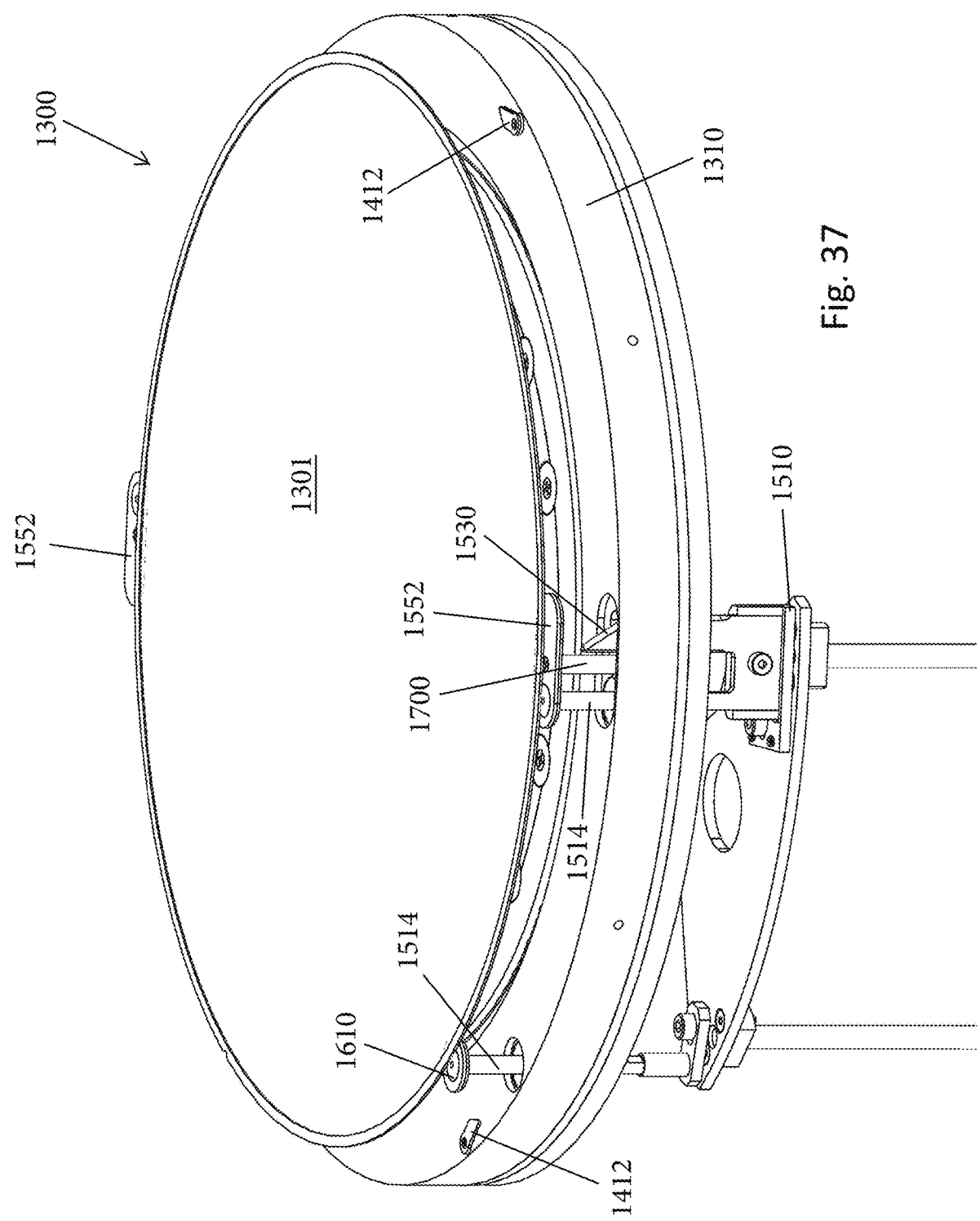
FIG. 37 is a top and side perspective view of the spin chuck.

In accordance with the present invention, the spin chuck 1300 has a lifter mechanism for controllably lifting the wafer 1301. As shown in FIG. 39 (in which the chuck body is shown in transparency), the spin chuck 1300 includes a ring member 1320 that is located internally within the chuck body 1310. As described herein the ring member 1320 has a limited degree of rotation and serves as part of an actuator for causing controlled movement of a jaw mechanism 1400 that controllably contacts and grips the peripheral edge of the wafer 1301. The jaw mechanism consists of a plurality of pivotable jaws 1410 (grippers) that controllably pivot into contact with the peripheral edge of the wafer 1301 simultaneously to ensure grasping and centering of the wafer 1301 on the chuck top surface. As shown in FIG. 36, a portion 1313 of the chuck body 1310 is located radially outward from the ring member 1320. The ring member 1320 includes a plurality of first openings or slots 1330 formed therein and has a plurality of notches 1332 formed along the peripheral outer edge of the ring member 1320. The ring member 1320 also includes a plurality of second openings or slots 1335. Within the second opening 1335 is a U-shaped shoe 1339 with the opening of the U-shaped shoe 1339 facing radially outward. The U-shaped shoe 1339 can be fitted within the second opening 1335.

As shown in FIG. 39, along a peripheral outer edge of the ring member 1320 is at least one and preferably a plurality of ring tabs 1340 that extend radially outward from the peripheral outer edge of the ring member 1320. The ring tab 1340 can be located at one end of the notch 1332.

The pivotable jaw 1410 includes a gripper portion 1412 that is intended to contact the peripheral edge of the wafer 1301. The pivotable jaw 1410 includes a rotatable post 1414 which rotates about a first axis. The gripper portion 1412 is attached to the top end of the post 1414 and is fixedly attached thereto so that rotation of the post 1414 results in rotation of the gripper portion 1412. At the opposite bottom end of the post 1414, a leg 1416 is fixedly attached thereto and extends radially inward toward the center of the chuck body. A distal end of the leg 1416 includes a rounded, enlarged distal end 1417. This distal end 1417 is received within the open space of the U-shaped shoe 1339. As described herein, when the ring member 1320 rotates, the U-shaped shoe 1339 contacts the rounded, enlarged distal end 1417 and continued rotation of the ring member 1320 results in pivoting of the leg 1416 and thus post 1414 and gripper portion 1412 rotate (pivot) as well. The gripper portion 1412 can be pivoted in a radially inward direction toward the wafer 1301 or when the jaw 1410 is pivoted in the opposite direction, the gripper portion 1412 pivots in a direction away from the wafer 1301.

As described herein, when the ring member 1320 rotates in a counter clockwise direction, the jaw 1410 rotates (pivots) to the open position in which the gripper portion 1412 is spaced from the peripheral edge of the wafer 1301, thereby allowing the wafer 1301 to be easily removed. Conversely, when the ring member 1320 rotates in a clockwise direction, the jaw 1410 rotates to the closed position.

The jaw mechanism has a spring return mechanism 1450 to return the jaw 1410 to the closed position. The spring return mechanism 1450 includes a return spring device that is located in one of the first openings 1330 formed in the ring member 1320. The return spring device includes a first block 1452 that is fixed to the ring member 1320 and a second block 1454 that is fixed to the body of the spring chuck with a spring 1456 extending therebetween. In particular, one end of the spring 1456 is attached to the first block 1452 and the other end of the spring 1456 is attached to the second block 1454. It will also be appreciated that first opening 1330 defines the degree of travel of the ring member 1320 in that when the second block 1454 contacts one end of the first opening 1330, an end of travel is reached.

The jaw mechanism and ring member 1320 thus provide a means for controllably gripping and releasing the wafer while it is position on the top surface of the spin chuck. In one embodiment, there are three jaws 1410 that are symmetrically and circumferentially spaced about the portion 1313 of the spin chuck body 1310.

Rotation of the ring member 1320 is effectuated by a cam device 1500. The cam device 1500 includes a cam blade structure that is mounted to a support 1510. A first end 1512 of the cam blade structure is mounted to the support 1510. The cam blade structure includes an elongated blade 1520 that extends upwardly and outwardly from the support 1510 and defines a second end 1514 of the cam blade structure. The cam blade 1520 has a cam surface 1530 near the second end 1514 and more particularly, the cam surface 1530 comprises an angled surface that extends between two parallel side edges of the cam blade 1520. The cam surface 1530 tapers inward toward the second end 1514 such that the cam blade has a minimum width at the second end 1514.

The portion 1313 of the spin chuck body 1310 includes a through hole to permit passage of the cam blade 1520 when the cam device 1500 is raised by an actuator, such as a pneumatic device, a motor drive shaft, or any other suitable drive mechanism. The cam blade 1520 is position such that the cam surface 1530 faces the ring tab 1340 and it is the contact between the cam surface 1530 and ring tab 1340 that causes the controlled rotation of the ring member 1320. More particularly, as the cam blade 1520 is raised, the cam surface 1530 contacts an edge of the ring tab 1340 as the cam blade 1520 is continuously raised, the cam surface 1530 rides up along the surface of the ring tab 1340 and this causes the counter clockwise rotation of the ring member 1320 resulting in pivoting of the jaw 1410 as described herein.

The lifter mechanism can be in the form of a lifter mechanism for controllably lifting and lowering the wafer 1301. In the illustrated embodiment, there are four lifter devices 1500, 1550 that are spaced circumferentially about the portion 1313 of the chuck body 1310. The plural lifter devices can be of the same type or, as shown, the lifter devices can of two different types, namely, lifters of a first type and lifters of a second type. As shown in FIG. 36, the lifter devices 1500, 1550 are located within the portion 1313 of the chuck body and in particular, the lifter devices 1500, 1550 are spaced circumferentially about the portion 1313. In the illustrated embodiment, there are two lifter devices 1500 and there are two lifter devices 1550. As described herein, the two lifter devices 1500, 1550 have a number of similarities.

Figure 41:
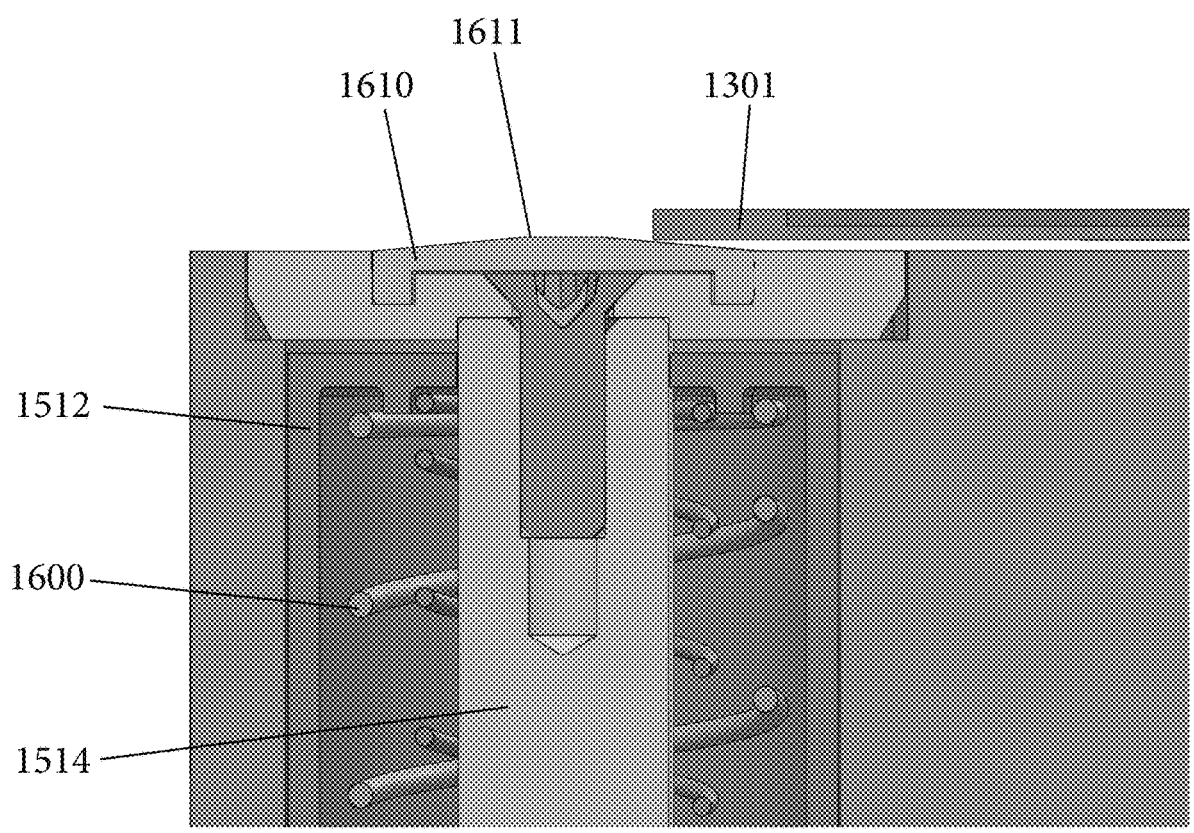
FIG. 41 is a close-up of a portion of the lifter mechanism showing a cap on which the edge of the wafer rests.

Each lifter device 1500 has a cylindrical shape, while each lifter device 1550 has an oblong shape. The lifter device 1500, 1550 has a cylindrical outer housing 1512 that is open at each end. An elongated piston 1514 is disposed within the housing 1512 and includes an enlarged flange 1513 at a bottom end thereof that closes off the bottom of the outer housing 1512. The flange 1513 includes an annular shaped groove or track that receives a spring 1600. A bottom end of the spring 1600 seats within the groove and a top end of the spring 1600 seats against a top wall of the housing 1512. The top wall of the housing 1512 has a central opening that is configured to receive and allow passage of the piston 1514. The piston 1514 extends through center of the spring 1600. A cap 1610 is secured to the distal end of the piston 1514 as by use of a fastener and as shown in FIG. 41, the cap 1610 has a circular shape with a tapered construction in that the center of the cap 1610 has a maximum thickness and from a center planar top surface 1611, the cap 1610 tapers downwardly toward the peripheral edge such that the cap 1610 has a minimum thickness at its edge. As shown in FIG. 41, the peripheral edge of the wafer 1301 seats along the tapered portion of the cap 1610.

When the piston 1514 is pushed upward within the housing 1512 by means of a lifter actuator 1710, the spring 1600 compresses and stores energy which is a return force to ensure that the piston returns to its retracted, lowered position. As described herein, the lifter actuator 1710 can include an elongated drive rod or shaft that is driven into contact with the bottom (flange 1513) of the piston to cause lifting of the piston. As the piston 1514 raises, the wafer 1301 supported thereon is likewise raised.

As shown in the figures, the piston 1514 can be raised by a lifter 1620 which is operated by an actuator, such as a pneumatic drive cylinder or motor drive shaft or any other suitable mechanism.

The lifter 1550 is similar to the lifter 1500 and therefore, like parts, like the housing 1512, piston 1514 and spring 1600 are numbered alike. In contrast to the circular shaped top of the lifter 1500, the top of the lifter 1550 has an oblong shape. The lifter 1550 includes a top oblong shaped cover 1552 with the cap 1610 being received in a recess formed along the top surface of the cover 1552. The lifter 1550 also has an anti-rotation mechanism in the form of a guide 1700 that is attached to an underside of the oblong shaped cover 1552 to prevent rotation of the substrate during operation of the device. The guide 1700 is an elongated rod or rail like structure that is received within a vertical guide passage formed in the chuck body 1310 in portion 1313 thereof.

In one embodiment, the lifter actuator 1710 for causing movement of the piston and the jaw mechanism can be integrated into a common part as shown in FIG. 39. As shown, the cam blade 1520 and the lifter actuator 1710 are connected by a common base portion and thus, when an actuator raises or lowers this common part, both the lifter actuator 1710 and the cam blade 1520 move in unison. The cam blade 1520 has a greater height as shown, while the distal end of the lifter actuator 1710 is configured to contact and engage the bottom end (flange) of the piston 1514 to lift or lower the piston 1514 within the housing. However, it will be appreciated that the lifters and cam blades can be maintained as separate parts and can be actuated by separate actuators.

It will be understood that the lift actuator includes additional components beyond the elongated shaft 1710 and in particular, can include pneumatic components or the like that controllably raise and lower the shaft 1710. In the case of the combined shaft 1710 and cam blade 1520, the actuator raises and lowers both in unison.

FIGS. 42A-42C show the steps of raising the wafer 1301. In a first position of FIG. 42A, the cam blade 1520 and lifter actuator (not shown) are in the retracted position. As shown, the distal end of the cam blade 1520 is spaced and removed from the receiving notch or slot 1315 formed in the chuck body 1310. In this position, the wafer 1301 is both lowered and gripped by the grippers 1412. In FIG. 42B, a second step is shown in which the distal end of the cam blade 1520 has entered the slot 1315 and is in contact with the edge of the ring tab 1340 resulting in counter clockwise driving of the ring member (not shown) and operation (pivoting) of the jaw mechanism as described herein. In FIG. 42B position, the lifter actuator 1710 is not in contact with the piston 1514. This rotation of the ring member results in opening of the jaw to allow raising of the wafer 1301. FIG. 42C shows the continued raising of the cam blade 1520 and the driving and raising of the piston 1514 due to contact between the piston 1514 and the lifter actuator 1710 and compression of spring 1600. This action results in the piston 1514 being raised and thus, the wafer 1301 is raised since it is supported by the piston cap 1610 at the end of the piston and also by the cover 1552 for the lifters 1550. In FIG. 42C, the ring tab 1340 engages a side edge of the cam blade 1520.

FIGS. 43A and 43B show an alternative exhaust system 1900 which includes only a single exhaust as opposed to at least some of the earlier embodiments in which two exhaust systems are shown. In particular, the single exhaust is akin to the chemical exhaust discussed hereinbefore with respect to other embodiments. It will be appreciated that the collection cup arrangement illustrated is merely exemplary in nature and the single exhaust system 1900 can be used with any of the other collection cup arrangements disclosed herein.

The single exhaust conduit is shown at 1910 and once again is akin to the chemical exhaust arrangement disclosed herein. The exhaust conduit 1910 can comprise any number of different structures including a passageway or conduit as shown in the figures. As described below, the exhaust conduit 1910 receives exhaust and routes it from the wafer processing equipment.

A splash shield 1920 is shown and is similar to the ones described herein. The splash shield 1920 has a top angled wall 1922 and a vertical outer wall 1924. The splash shield 1920 moves vertically between an open position shown in FIG. 43A and a closed (lowered) position shown in FIG. 43B.

As described above, the splash shield 1920 surround a collection cup arrangement which can any number of different forms including those disclosed herein. For purpose of illustration only, a collection cup arrangement is shown that comprises a collection cover 1930, a first collection cup 1940, a second collection cup 1950 and a third collection cup 1960. These elements can have features disclosed herewith with respect to other collection cup arrangements.

In accordance with the present invention, in the open position of the splash shield 1920, an exhaust passage 1970 is open through which the exhaust can flow to the exhaust conduit 1910. The exhaust passage 1970 is in fluid communication with the interior of the exhaust conduit 1910 and therefore, when the splash shield 1920 is in the open position, the exhaust can travel over the splash shield along the outer wall 1924 and then into the passageway 1970 and then ultimately into the exhaust conduit 1910. The exhaust also can travel through open collection chambers created in the collection cup arrangement and then flow into the passageway 1970. In other words when the splash shield 1920 is in the open position, air (exhaust) can flow around the splash shield and flow into the exhaust conduit 1910 by way of passageway 1970. Conversely, when the splash shield 1920 is in the closed position as shown in FIG. 43B, the lowered splash shield 1920 closes off the exhaust passageway 1970 and therefore, exhaust is restricted in terms of its flow into the exhaust conduit 1910.

It will therefore be appreciated by one of skill in the art that the degree to which the splash shield 1920 is raised defines the amount of exhaust that can flow into the exhaust conduit 1910 and be evacuated therefrom. Thus, the user can effectively "throttle" the amount of exhaust being evacuated by positioning the splash shield 1920 in a desired position between a fully open position (FIG. 43A) and a fully closed position (FIG. 43B). This allows control over the exhaust system of the present system.

Notably, the figures and examples above are not meant to limit the scope of the present invention to a single embodiment, as other embodiments are possible by way of interchange of some or all of the described or illustrated elements. Moreover, where certain elements of the present invention can be partially or fully implemented using known components, only those portions of such known components that are necessary for an understanding of the present invention are described, and detailed descriptions of other portions of such known components are omitted so as not to obscure the invention. In the present specification, an embodiment showing a singular component should not necessarily be limited to other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The foregoing description of the specific embodiments will so fully reveal the general nature of the invention that others can, by applying knowledge within the skill of the relevant art(s) (including the contents of the documents cited and incorporated by reference herein), readily modify and/or adapt for various applications such specific embodiments, without undue experimentation, without departing from the general concept of the present invention. Such adaptations and modifications are therefore intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one skilled in the relevant art(s).

While various embodiments of the present invention have been described above, it should be understood that they have been presented by way of example, and not limitation. It would be apparent to one skilled in the relevant art(s) that various changes in form and detail could be made therein without departing from the spirit and scope of the invention. Thus, the present invention should not be limited by any of the above-described exemplary embodiments but should be defined only in accordance with the following claims and their equivalents.

What is claimed is:

1. A wafer processing system comprising:
   a housing;
   a rotatable wafer support member for supporting a wafer;
   a splash shield disposed about a peripheral edge of the wafer support member and being movable between a raised position and a lowered position;
   a plurality of collection trays disposed about the peripheral edge of the wafer support member and within a central opening of the splash shield, the collection trays being arranged in a stacked or nested configuration, each collection tray having a single bottom trough section for collecting fluid, wherein at least one of the collection trays has a drain outlet;
   a drive mechanism for selectively moving one or more of the collection trays to a raised position above the wafer support member so as to define a collection chamber formed between at least one raised collection tray and a lowered collection tray, the collection chamber being configured to collect fluid that is discharged from the wafer during the processing thereof and routes the collected fluid through the drain outlet of the lowered collection tray;
   a chamber exhaust outlet that is formed in the housing for venting gas from the interior of the housing; and
   a chemical exhaust outlet that is formed in the housing for venting gas that flows along at least one of: (a) a first flow path defined between the splash shield in a raised position and the collection trays in the lowered position; and (b) a second flow path in which the gas flows through the collection chamber to the chemical exhaust outlet;
   wherein the plurality of collection trays comprises a first collection tray having a single first trough formed in the bottom trough section of the first collection tray, a second collection tray having a single second trough formed in the bottom trough section of the second collection tray and a third collection tray having a single third trough formed in the bottom trough section of the third collection tray, the second collection tray having an outer wall, an inner wall and an outer finger spaced radially outward from the outer wall, wherein the second trough is defined by and located between the inner wall and the outer wall, the outer finger being disposed above and being axially aligned with the first trough, wherein the outer finger depends downwardly and is spaced from the outer wall of the second collection tray, wherein a first space is formed between the outer finger and the outer wall, the first space being closed at a top end;
   wherein the first collection tray has an outer wall and an inner wall spaced from the outer wall with the single first trough formed therebetween, the bottom trough section of the first collection tray being disposed entirely radially outward from the outer wall of the second collection tray.

2. The wafer processing system of claim 1, wherein the drive mechanism comprises at least a first pair of vertical actuators each vertical actuator being movable between a retracted position in which the first, second and third collection trays are in contact with one another and an extended position in which at least one collection tray of the first collection tray, the second collection tray and the third collection tray is moved to the elevated position and the collection chamber is formed therebetween.

3. The wafer processing system of claim 2, wherein the collection chamber is defined between an underside of the raised collection tray and an upper surface of the lowered collection tray that is disposed immediately below the raised collection tray.

4. The wafer processing system of claim 1, further including a collection cover that nests with the third collection tray in a lowered position and as an inner finger that is located radially inward of each of the first collection tray, the second collection tray, and the third collection tray.

5. The wafer processing system of claim 1, wherein the chamber exhaust outlet is located radially outward from the splash shield.

6. The wafer processing system of claim 1 wherein the source of gas comprises a filter fan unit disposed along a top of the housing.

7. The wafer processing system of claim 1, wherein the second flow path comprises a serpentine shaped flow path defined by and located between one of: (1) the first collection tray and the second collection tray and (2) the second collection tray and the third collection tray.

8. The wafer processing system of claim 1, wherein each of the first collection tray, the second collection tray and the third collection tray is annular shaped and includes a first outlet (D1) and a second outlet (D2) spaced from the first outlet (D1) and is configured with sloped surfaces such that fluid flows by gravity to either the first outlet (D1) or the second outlet (D2).

9. The wafer processing system of claim 1, wherein each of the first collection tray, the second collection tray and the third collection tray is independently movable relative to the other collection trays.

10. The wafer processing system of claim 1, wherein the drive mechanism comprises one of: (a) a plurality of stepper motors and (b) a plurality of pneumatic pistons.

11. The wafer processing system of claim 1, wherein a top portion of the first collection tray angles inward toward the rotatable wafer support member; and wherein a top portion of the second collection tray angles inward toward the rotatable wafer support member.

12. The wafer processing system of claim 11, wherein the collection chamber comprises a first collection chamber that is defined between the first collection tray in the raised position and the second collection tray in the lowered position, the second flow path flowing through the first collection chamber.

13. The wafer processing system of claim 12, wherein the second flow path comprises a serpentine flow path defined within the first collection chamber, the serpentine flow path flowing within the first trough and the first space between the outer finger and the outer wall of the second collection tray.

14. The wafer processing system of claim 12, wherein the second flow path comprises a serpentine flow path defined within the second collection chamber, the serpentine flow path flowing within the second trough and a second space formed between an outer finger and an outer wall of the third collection tray, the second space being closed at a top end thereof.

15. The wafer processing system of claim 11, wherein the third collection tray has an outer wall and an inner wall spaced from the outer wall with the third trough formed therebetween, wherein a top portion of the outer wall of the third collection tray angles inward toward the rotatable wafer support member, the third collection tray having an outer finger depending downwardly and spaced from the outer wall of the third collection tray, the outer finger of the third collection tray being positioned above and being axially aligned with the second trough, the bottom trough section of the second collection tray being entirely radially outward from the outer wall of the third collection tray.

16. The wafer processing system of claim 15, further including a second collection chamber that is defined between the second collection tray in the raised position and the third collection tray in the lowered position, the second flow path flowing through the second collection chamber.

17. The wafer processing system of claim 1, wherein a top portion of the outer wall of the first collection tray angles inward toward the rotatable wafer support member, wherein when the first and second collection trays are both in a lowered position, the outer finger of the second collection tray being spaced a first distance from the first trough and wherein when the first collection tray is in the raised position and the second collection tray is in the lowered position, the outer finger of the second collection tray is spaced a second distance from the first trough, the second distance being less than the first distance.

18. The wafer processing system of claim 17, wherein gas flowing along the second flow path flows between the outer wall of the first collection tray and the outer finger of the second collection tray, along the first trough, between the outer finger of the second collection tray and the first inner wall of the first collection tray and between the inner wall of the first collection tray and the outer wall of the second collection tray before flowing to the chemical exhaust outlet.

19. The wafer processing system of claim 17, wherein when both the first collection tray and the second collection tray are in both a raised position and a lowered position, respectively, a top end of the inner wall of the first collection tray and a bottom end of the outer finger of the second collection tray are adjacent one another such that a horizontal plane that is parallel to a ground surface passes through both the top end of the inner wall of the first collection tray and the bottom end of the outer finger of the second collection tray.

20. The wafer processing system of claim 19, wherein when the first collection tray is raised and the second collection tray is lowered, a degree of overlapping in a lateral direction between the outer finger of the second collection tray and the inner wall of the first collection tray is greater than when either: (1) the first collection tray and the second collection tray are both in the raised positions or (2) the first collection tray and the second collection tray are both in the lowered positions.

21. The wafer processing system of claim 1, wherein the housing includes a floor, the chamber exhaust outlet being located above the floor, while the chemical exhaust outlet being located below the floor so as to be fluidly separated from the chamber exhaust outlet by the floor.

22. The wafer processing system of claim 1, wherein the chamber exhaust outlet includes a first controllable valve for controlling a flow rate of the gas therethrough and the chemical exhaust outlet includes a second controllable valve for controlling a flow rate of the gas therethrough.

23. The wafer processing system of claim 22, wherein the first controllable valve comprises at least one of a first butterfly valve and a first throttle valve and the second controllable valve comprises at least one of a second butterfly valve and a second throttle valve.

24. The wafer processing system of claim 1, wherein the chamber exhaust outlet is in fluid communication with an external chamber exhaust conduit and the chemical exhaust outlet is in fluid communication an external chemical exhaust conduit.

25. The wafer processing system of claim 1, wherein the first space and the second trough have semi-circular shapes.

26. A wafer processing system comprising:
a housing;
a rotatable wafer support member for supporting a wafer;
a splash shield disposed about a peripheral edge of the wafer support member and being movable between a raised position and a lowered position;
a plurality of collection trays disposed about the peripheral edge of the wafer support member and within a central opening of the splash shield, the collection trays being arranged in a stacked or nested configuration, each collection tray having a bottom trough section for collecting fluid, wherein in a lowered position of the plurality of collection trays, bottom surfaces of the bottom trough sections of the plurality of collection trays line a common bottom plane, the bottom trough sections of the plurality of collections trays being arranged concentrically and arranged in a non-overlapping manner, wherein at least one of the collection trays has a drain outlet;
a drive mechanism for selectively moving one or more of the collection trays to a raised position above the wafer support member so as to define a collection chamber formed between at least one raised collection tray and a lowered collection tray, the collection chamber being configured to collect fluid that is discharged from the wafer during the processing thereof and routes the collected fluid through the drain outlet of the lowered collection tray;

wherein the plurality of collection trays comprises a first collection tray having a concave shaped first trough formed in a bottom trough section of the first collection tray, a second collection tray having a concave shaped second trough and a third collection tray having a concave shaped third trough;

the first collection tray having an outer wall and an inner wall spaced from the outer wall with the first trough formed therebetween, wherein a top edge of the inner wall comprises a first beveled edge;

the second collection tray having an outer wall, an inner wall and an outer finger spaced radially outward from the outer wall, wherein the second trough is defined by and located between the inner wall and the outer wall;

wherein a top edge of the outer finger comprising a second beveled edge that faces the first beveled edge and is parallel to the first beveled edge;

the outer finger being disposed above and being axially aligned with the first trough, wherein the outer finger depends downwardly and is spaced from the outer wall of the second collection tray, wherein a first space is formed between the outer finger and the outer wall, the first space being closed at a top end by a concave top surface.

* * * * *